(12) United States Patent
Muir

(10) Patent No.: US 12,075,656 B2
(45) Date of Patent: Aug. 27, 2024

(54) CIRCUITS INCLUDING NON-LINEAR COMPONENTS FOR ELECTRONIC DEVICES

(71) Applicant: Amorphyx, Incorporated, Corvallis, OR (US)

(72) Inventor: Sean William Muir, Corvallis, OR (US)

(73) Assignee: Amorphyx, Incorporated, Corvallis, OR (US)

(*) Notice: Subject to any disclaimer, the term of this patent is extended or adjusted under 35 U.S.C. 154(b) by 0 days.

(21) Appl. No.: 18/001,245

(22) PCT Filed: Jun. 11, 2021

(86) PCT No.: PCT/US2021/037065
§ 371 (c)(1),
(2) Date: Dec. 8, 2022

(87) PCT Pub. No.: WO2021/252934
PCT Pub. Date: Dec. 16, 2021

(65) Prior Publication Data
US 2023/0232663 A1     Jul. 20, 2023

Related U.S. Application Data

(60) Provisional application No. 63/038,634, filed on Jun. 12, 2020.

(51) Int. Cl.
*G09G 3/30*     (2006.01)
*G09G 3/3233*     (2016.01)
(Continued)

(52) U.S. Cl.
CPC ....... *H10K 59/1213* (2023.02); *G09G 3/3233* (2013.01); *G09G 3/035* (2020.08);
(Continued)

(58) Field of Classification Search
CPC ...... G09G 3/055; G09G 3/3233; G09G 3/367; G09G 2300/0426; G09G 2300/0814;
(Continued)

(56) References Cited

U.S. PATENT DOCUMENTS 3,654,606 A    4/1972   Marlowe et al.
4,204,275 A    5/1980   Taylor
(Continued)

FOREIGN PATENT DOCUMENTS

CN     1855489 A    11/2006
CN     1932628 A    3/2007
(Continued)

OTHER PUBLICATIONS

Chang et al., "LTPO TFT Technology for AMOLEDs," *SID Symposium Digest of Technical Papers* 50(1):545-548, Jun. 2019.
(Continued)

*Primary Examiner* — Joe H Cheng
(74) *Attorney, Agent, or Firm* — Seed IP Law Group LLP

(57) ABSTRACT

The present disclosure is directed to display circuitry that can be formed on a flexible substrate. The circuitry includes a voltage divider formed from a first and second non-linear resistor device or a first and second transistor coupled in a diode configuration. The circuitry includes a driving thin film transistor coupled to the voltage divider. The non-linear resistor devices may include a lower electrode that is amorphous metal or a crystalline metal. The first and second transistor coupled in a diode configuration may have a lower electrode that is amorphous metal. Upper electrodes may be crystalline metal. The driving thin film transistors may have the lower electrode as amorphous or crystalline metal.

20 Claims, 30 Drawing Sheets

(51) Int. Cl.
*H10K 59/121* (2023.01)
*G09G 3/00* (2006.01)

(52) U.S. Cl.
CPC .............. *G09G 2300/0426* (2013.01); *G09G 2300/0814* (2013.01); *G09G 2300/0852* (2013.01); *G09G 2300/088* (2013.01)

(58) Field of Classification Search
CPC ... G09G 2300/0828; G09G 2300/0852; G09G 2300/088; G09G 2360/14; G09G 2380/02; H01L 27/1255; H10K 29/1213
See application file for complete search history.

(56) References Cited

U.S. PATENT DOCUMENTS

| | | | |
|---|---|---|---|
| 5,151,691 A | 9/1992 | Kuijk | |
| 5,212,537 A | 5/1993 | Birang et al. | |
| 5,212,573 A | 5/1993 | Yamazaki | |
| 5,300,462 A | 4/1994 | Kakumu | |
| 5,744,817 A | 4/1998 | Shannon | |
| 5,893,621 A | 4/1999 | Sekiguchi | |
| 5,926,236 A | 7/1999 | den Boer et al. | |
| 6,225,968 B1 | 5/2001 | den Boer et al. | |
| 6,243,062 B1 | 6/2001 | den Boer et al. | |
| 6,512,556 B1 | 1/2003 | Sekiguchi | |
| 6,657,230 B1 | 12/2003 | Murade | |
| 6,980,468 B1 | 12/2005 | Ounadjela | |
| 7,176,869 B2 * | 2/2007 | Kumada | G09G 3/3696 345/94 |
| 7,796,105 B2 * | 9/2010 | Moon | G09G 3/3655 345/204 |
| 8,035,169 B2 | 10/2011 | Ishida et al. | |
| 8,378,937 B2 | 2/2013 | Iba et al. | |
| 8,436,337 B2 | 5/2013 | Cowell, III et al. | |
| 8,575,753 B2 | 11/2013 | Choi et al. | |
| 8,822,978 B2 | 9/2014 | Cowell, III et al. | |
| 8,896,512 B2 | 11/2014 | Zebedee | |
| 9,099,230 B2 | 8/2015 | Cowell, III | |
| 9,129,927 B2 | 9/2015 | Gupta et al. | |
| 9,599,848 B2 | 3/2017 | Shih et al. | |
| 9,818,605 B2 | 11/2017 | Yan et al. | |
| 9,818,765 B2 | 11/2017 | Osawa et al. | |
| 10,020,354 B2 | 7/2018 | Kim et al. | |
| 10,234,734 B2 | 3/2019 | Cowell, III et al. | |
| 10,438,841 B2 | 10/2019 | Muir | |
| 10,476,515 B2 * | 11/2019 | Englekirk | H03M 1/464 |
| 10,672,898 B2 | 6/2020 | Muir | |
| 10,777,448 B2 | 9/2020 | Muir | |
| 10,971,392 B2 | 4/2021 | Muir | |
| 11,069,799 B2 | 7/2021 | Muir | |
| 11,183,585 B2 | 11/2021 | Muir | |
| 11,610,809 B2 | 3/2023 | Muir | |
| 11,741,913 B2 * | 8/2023 | Muir | G09G 3/367 345/55 |
| 2003/0161181 A1 | 8/2003 | Saito et al. | |
| 2003/0223535 A1 | 12/2003 | Leedy | |
| 2005/0083321 A1 | 4/2005 | Boer | |
| 2005/0225543 A1 | 10/2005 | Boer | |
| 2005/0260803 A1 | 11/2005 | Halik et al. | |
| 2005/0275038 A1 | 12/2005 | Shih et al. | |
| 2006/0012000 A1 | 1/2006 | Estes et al. | |
| 2006/0028591 A1 | 2/2006 | Kim | |
| 2007/0108446 A1 | 5/2007 | Akimoto | |
| 2008/0138949 A1 | 6/2008 | Fumitake | |
| 2008/0239791 A1 | 10/2008 | Tran | |
| 2009/0015151 A1 | 1/2009 | Ishihara et al. | |
| 2009/0134467 A1 | 5/2009 | Ishida et al. | |
| 2010/0059742 A1 | 3/2010 | Shieh et al. | |
| 2010/0123744 A1 | 5/2010 | Iba et al. | |
| 2010/0289005 A1 | 11/2010 | Cowell, III et al. | |
| 2010/0298005 A1 | 11/2010 | Yavuz et al. | |
| 2010/0301480 A1 | 12/2010 | Choi et al. | |
| 2011/0063229 A1 | 3/2011 | Krah et al. | |
| 2011/0127525 A1 | 6/2011 | Yamazaki et al. | |
| 2012/0061663 A1 | 3/2012 | Yamazaki et al. | |
| 2012/0074399 A1 | 3/2012 | Den Boer | |
| 2013/0037798 A1 | 2/2013 | Wong et al. | |
| 2013/0175520 A1 | 7/2013 | Lan et al. | |
| 2013/0288426 A1 | 10/2013 | Akimoto | |
| 2014/0048797 A1 | 2/2014 | Yu et al. | |
| 2014/0191197 A1 | 7/2014 | Cowell, III et al. | |
| 2014/0264672 A1 | 9/2014 | Park et al. | |
| 2014/0293166 A1 | 10/2014 | Shih et al. | |
| 2014/0302310 A1 | 10/2014 | Cowell, III et al. | |
| 2014/0368310 A1 | 12/2014 | Cowell, III | |
| 2015/0054799 A1 | 2/2015 | Chang et al. | |
| 2015/0055047 A1 | 2/2015 | Chang et al. | |
| 2015/0115260 A1 | 4/2015 | Shieh et al. | |
| 2015/0340511 A1 | 11/2015 | Yan et al. | |
| 2015/0364563 A1 | 12/2015 | Mieno | |
| 2016/0043227 A1 | 2/2016 | Zhang et al. | |
| 2016/0268526 A1 | 9/2016 | Facchetti et al. | |
| 2017/0146873 A1 | 5/2017 | Onogi et al. | |
| 2017/0205656 A1 | 7/2017 | Lee et al. | |
| 2018/0061867 A1 | 3/2018 | Chang et al. | |
| 2018/0203309 A1 | 7/2018 | Cowell, III et al. | |
| 2018/0306744 A1 | 10/2018 | Malecha et al. | |
| 2018/0308744 A1 | 10/2018 | Muir | |
| 2019/0086280 A1 | 3/2019 | Jeon et al. | |
| 2019/0088167 A1 | 3/2019 | Jeon et al. | |
| 2019/0312063 A1 | 10/2019 | Yamazaki et al. | |
| 2019/0326422 A1 * | 10/2019 | Muir | H01L 29/78648 |
| 2019/0385895 A1 * | 12/2019 | Muir | H01L 29/4908 |
| 2021/0151346 A1 | 5/2021 | Muir | |
| 2022/0229194 A1 * | 7/2022 | Chen | H04N 5/32 |
| 2022/0262932 A1 | 8/2022 | Muir | |

FOREIGN PATENT DOCUMENTS

| | | |
|---|---|---|
| CN | 101015066 A | 8/2007 |
| CN | 105264618 A | 1/2016 |
| EP | 0434627 A2 | 6/1991 |
| JP | H02137828 A | 5/1990 |
| JP | H05102147 A | 4/1993 |
| JP | H06230746 A | 8/1994 |
| JP | H0750697 B2 | 5/1995 |
| JP | H1084146 A | 3/1998 |
| JP | H1174467 A | 3/1999 |
| JP | H11305267 A | 11/1999 |
| JP | 2001265255 A | 9/2001 |
| JP | 2003347308 A | 12/2003 |
| JP | 2008004588 A | 1/2008 |
| JP | 2009130167 A | 6/2009 |
| JP | 2010073877 A | 4/2010 |
| JP | 2010123338 A | 6/2010 |
| KR | 20080035360 A | 4/2008 |
| KR | 20180025988 A | 3/2018 |
| KR | 10-2018-0054924 A | 5/2018 |
| WO | WO 9602867 A1 | 2/1996 |
| WO | WO 2005106927 A2 | 11/2005 |
| WO | WO 2017066332 A1 | 4/2017 |
| WO | WO 2017194720 A1 | 11/2017 |
| WO | WO 2017205656 A1 | 11/2017 |
| WO | WO 2018009901 A1 | 1/2018 |
| WO | WO 2019191674 A2 | 10/2019 |
| WO | WO 2020118268 A1 | 6/2020 |

OTHER PUBLICATIONS

Den Boer, "6.2: A Select Line Driver for the Offset-Scan-and-Hold Dual Select Diode AMLCDs," *Society for Information Display Symposium Digest of Technical Papers* 32(1):44-47, 2001.

Den Boer, "Are There Alternatives to TFTs in AMLCDs?" *SID Information Display* 10:2-5, 2006.

Diode-connected transistor, URL=https://en.wikipedia.org/w/index.php?title=Diode-connected_transistor&oldid=828667878, download date Jun. 17, 2020.

Grubbs et al., "Development and characterization of high temperature stable Ta—W—Si—C amorphous metal gates," *Applied Physics Letters* 97(22):223505, 2010. (3 pages).

Heiblum et al., "Ballistic hot-electron transistors," *IBM Journal of Research and Development* 34(4):530-549, 1990.

(56) References Cited

OTHER PUBLICATIONS

Heiblum, "Tunneling Hot Electron Transfer Amplifiers (Theta): Amplifiers Operating up to the Infrared," *Solid-State Electronics* 24(4):343-366, 1981.

Jeong et al., "Low-Temperature Polysilicon Oxide Thin-Film Transistors with Coplanar Structure Using Six Photomask Steps Demonstrating High Inverter Gain of 264 V V/\-1," *Advanced Engineering Materials* 22(4):1901497, Apr. 2020.

Kim et al., "A Memory-in-Pixel Circuit for Low-Power Liquid Crystal Displays With Low Temperature Poly-Silicon and Oxide Thin Film Transistors," *IEEE Electron Device Letters* 40(12):1957-1960, Dec. 2019.

Matsukawa et al., "Suppressing Vt and Gm Variability of FinFETs Using Amorphous Metal Gates for 14 nm and Beyond," *International Electron Devices Meeting*, San Francisco, California, USA, Dec. 10-13, 2012, pp. 8.2.1-8.2.4.

Mead, "Operation of Tunnel-Emission Devices," *Journal of Applied Physics* 32(4):646-652, 1961.

Nelson et al., "Hot-Electron Transfer through Thin-Film Al—Al2O3 Triodes," *Journal of Applied Physics* 37(1):66-76, 1966.

Ohmori et al., "Impact of Additional Factors in Threshold Voltage Variability of Metal/High-k Gate Stacks and Its Reduction by Controlling Crystalline Structure and Grain Size in the Metal Gates," *International Electron Devices Meeting*, San Francisco, California, USA, Dec. 15-17, 2008, pp. 1-4.

Torres, Jr. et al., "High-Current Gain Two-Dimensional MoS2-Base Hot-Electron Transistors," *Nano Letters* 15(12):7905-7912, 2015.

Vaziri et al., "A Graphene-Based Hot Electron Transistor," *Nano Letters* 13(4):1435-1439, 2013.

Vaziri et al., "Going ballistic: Graphene hot electron transistors," *Solid State Communications* 224:64-75, 2015.

Watakabe et al., "Development of Advanced LTPS TFT Technology for Low Power Consumption and Narrow Border LCDs," *SID Symposium Digest of Technical Papers* 50(1):541-544, Jun. 2019.

Yang et al., "New Progress of Low-Temperature Metal-Induced Crystallized Polycrystalline Silicon Thin-Film," *Chinese Journal of Spectroscopy Laboratory* 30(5):2246-2250, Sep. 2013. (with English Abstract).

Zeng et al., "Vertical Graphene-Base Hot-Electron Transistor," *Nano Letters* 13(6):2370-2375, 2013.

"Electronic paper," Wikipedia, archive date Jan. 31, 2023, URL= https://en.wikipedia.org/w/index.php?title=Electronic_paper&oldid= 871367267, download date Aug. 11, 2022. (11 pages.).

Mizukami et al., "36.1: 6-Bit Digital VGA OLED," *SID Symposium Digest of Technical Papers*, 31(1):912-915, Jul. 5, 2012.

\* cited by examiner

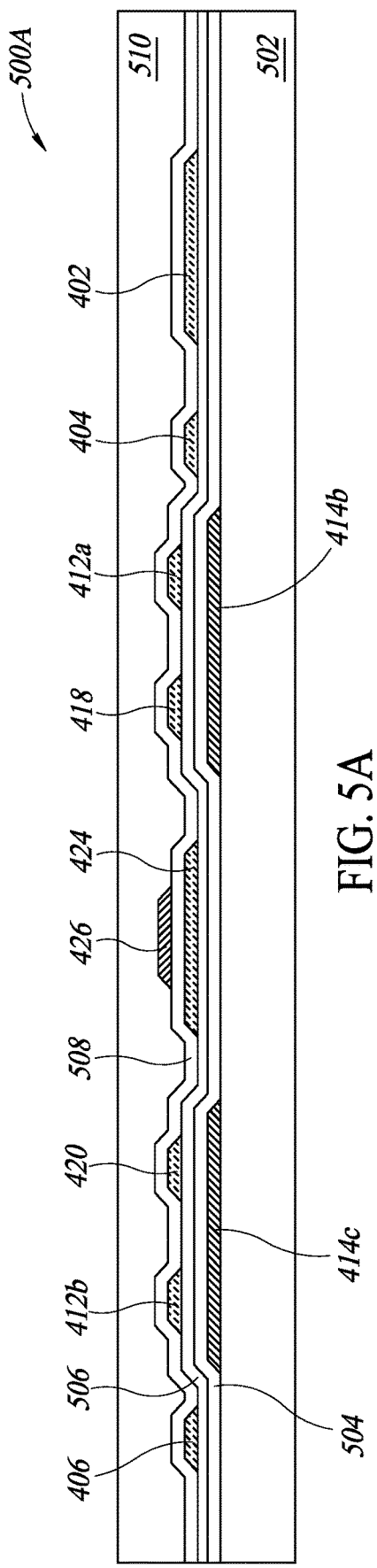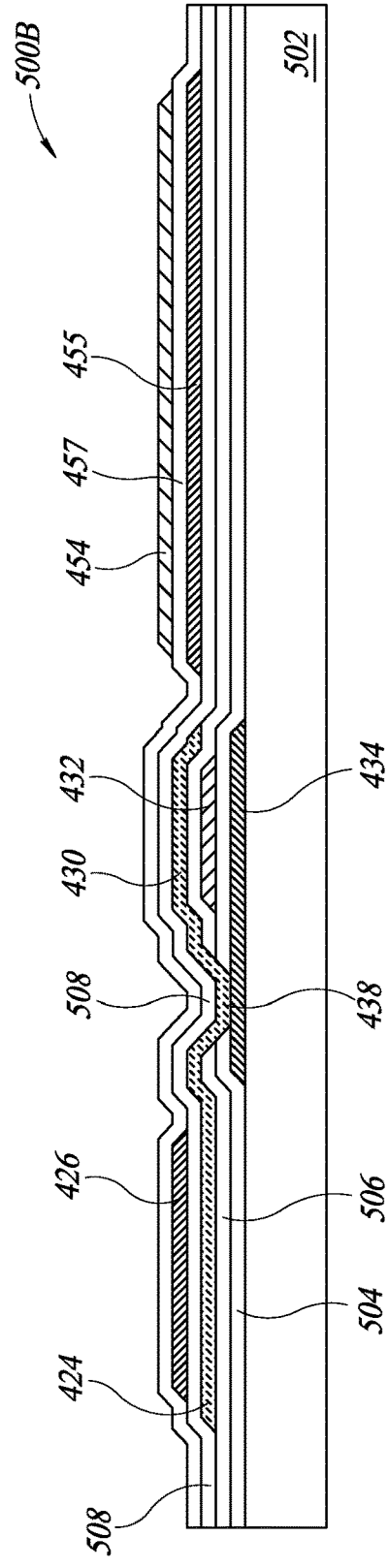
FIG. 5A
FIG. 5B

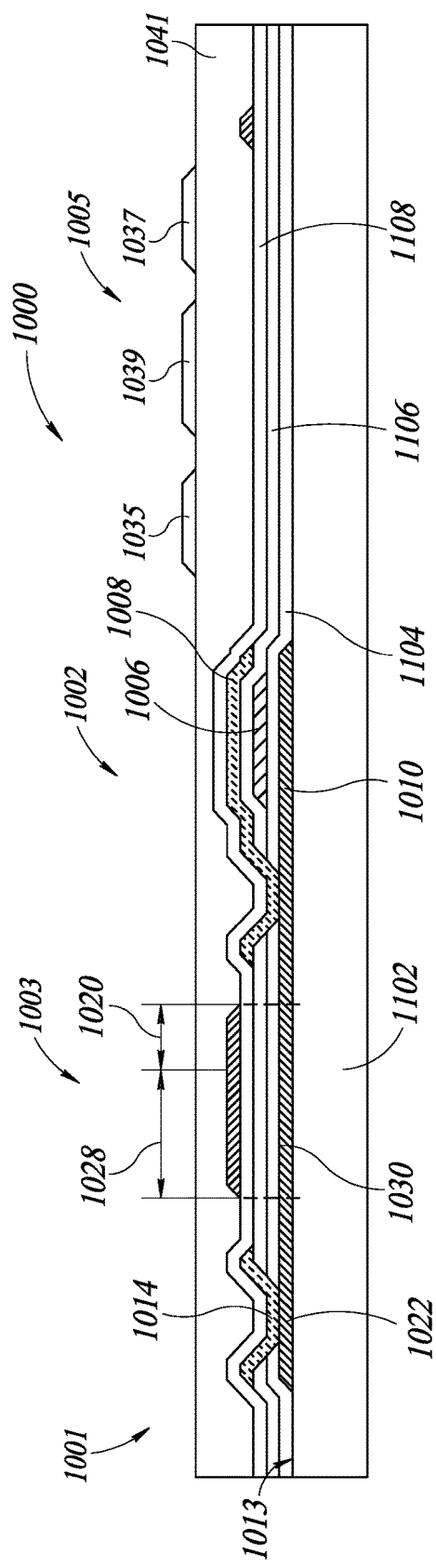
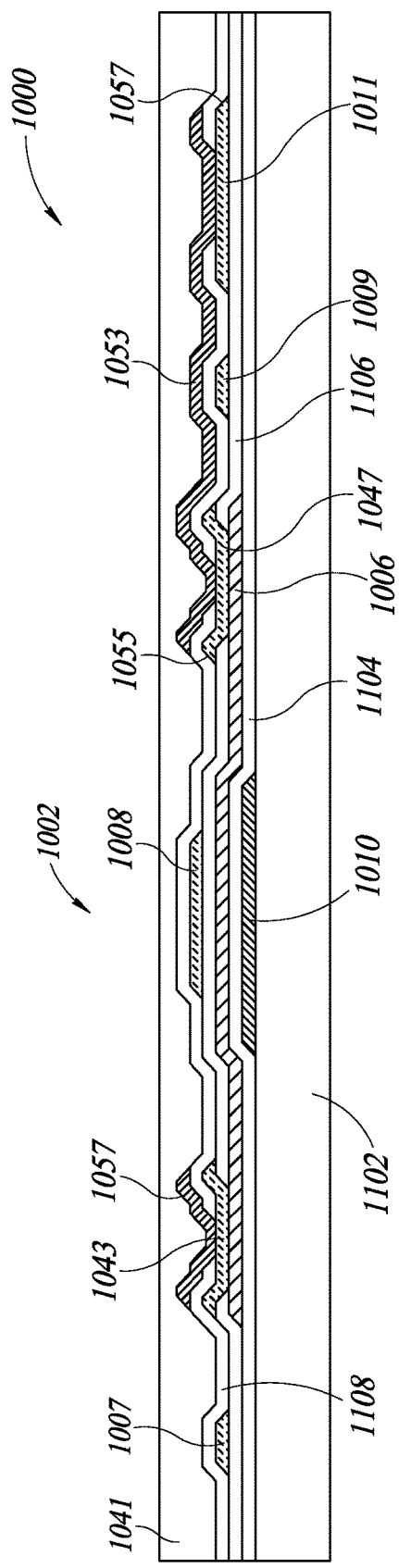
FIG. 11A
FIG. 11B

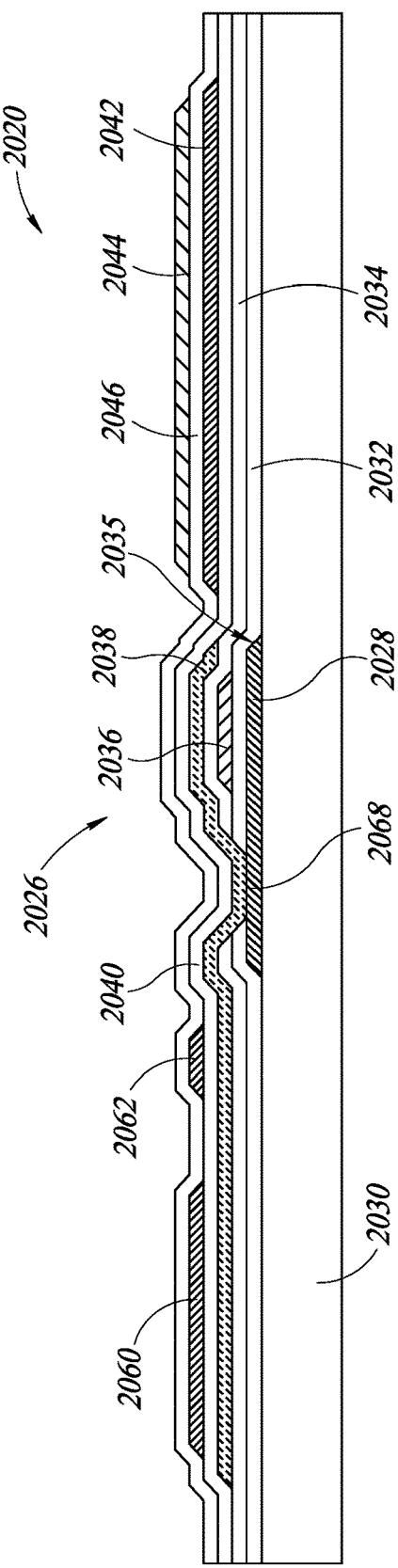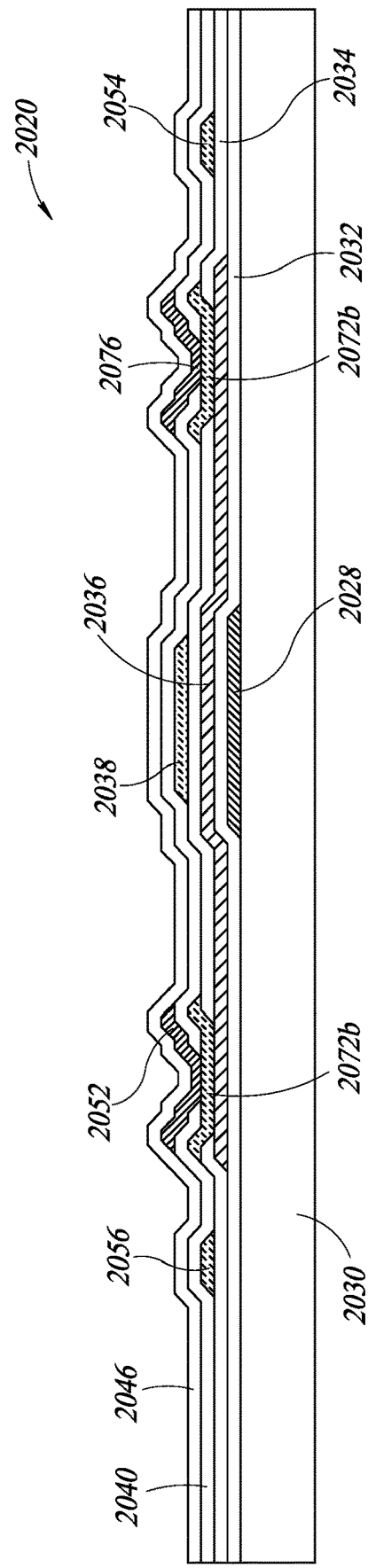
FIG. 20B
FIG. 20C

CIRCUITS INCLUDING NON-LINEAR COMPONENTS FOR ELECTRONIC DEVICES

CROSS-REFERENCE TO RELATED APPLICATION(S)

This application is the National Stage of PCT/US2021/037065 filed on Jun. 11, 2021, which claims priority of the U.S. Provisional Application No. 63/038,634 filed on Jun. 12, 2020, the disclosure of which is incorporated by reference.

BACKGROUND

Technical Field

The present disclosure relates to circuitry for controlling switching of a transistor and, more particularly, for controlling operation of display devices and other electronic devices that include transistors.

Description of the Related Art

Components provided in some electronic devices perform a variety of functions. For example, display devices include arrays of lighting elements (e.g., organic light emitting diodes (OLEDs), traditional light emitting diodes (LEDs), or micro light emitting diodes (MLEDs)) that are part of a pixel in the display. Control circuitry is coupled to the lighting elements to control the operational state of the lighting elements to emit light in response to a signal.

Demand has driven the design of circuitry to have increasingly smaller size while also maintaining or improving the level of performance. As a result, a density of components has also increased. In these electronic device designs, materials used as conductors and the substrates upon which the circuits are formed are typically brittle and rigid. The combination of increased density and rigidity has resulted in fixed shapes and forms. In current display devices, for instance, the density of pixels has increased dramatically in recent years, providing impressive resolution and contrast; however, the shape and form of such display devices is fixed.

Moreover, the layout design of the circuitry including the components (e.g., pixels) in electronic devices has been somewhat static in at least some respects. Control circuitry in a display device may include a pair of switching components that are both used to generate signals for operating an associated component to emit light or to control the characteristics of light emitted.

BRIEF DESCRIPTION OF THE SEVERAL VIEWS OF THE DRAWINGS

For a better understanding of the embodiments, reference is by way of example to the accompanying drawings. In the drawings, identical reference numbers identify similar elements or acts. The sizes and relative positions of elements in the drawings are not necessarily drawn to scale. For example, some of these elements ma/y be enlarged and positioned to improve drawing legibility.

FIGS. 4 and 5A-5C top and cross-sectional views of a first layout of the circuit of FIG. 2 according to an embodiment of the present disclosure;

FIGS. 10, 11A, and 11B are a top and cross-sectional views of a fourth layout of the circuit of FIG. 2 according to an embodiment of the present disclosure through the lines A-B and C-D;

FIGS. 20A-20C are a top and cross-sectional views of a second layout of the circuit of FIG. 2 according to an embodiment of the present disclosure;

DETAILED DESCRIPTION

Figure 1:
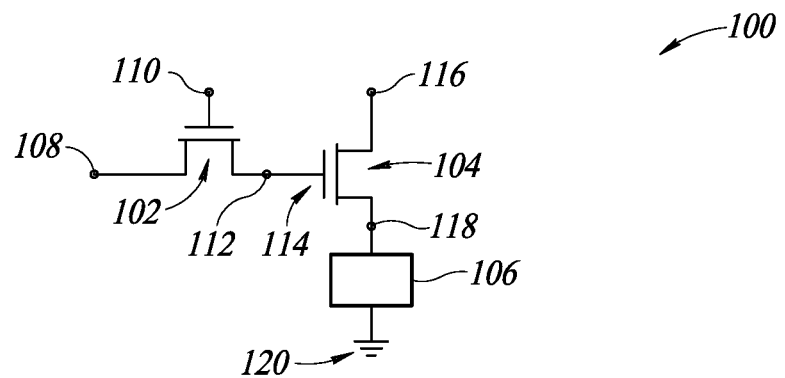
FIG. 1 is a schematic diagram of a circuit of an electronic device according to an embodiment of the present disclosure.

The present disclosure is directed to circuitry that incorporates amorphous metal in various implementations for effectuating operation of an electronic device. Non-restrictive examples of electronic devices include display devices, tablet computers, and smart phones. Layers of amorphous metal, such as amorphous metal thin films, used in conjunction with a dielectric insulator layer can be implemented for switching in thin-film based control circuitry without the complexity, density, or rigidity of some standard control circuitry. Non-limiting examples of devices formed with amorphous metal on a substrate include amorphous metal non-linear resistors (AMNRs), amorphous metal thin-film transistors (AMTFTs), amorphous metal capacitors (AMCs), and amorphous metal hot electron transistors (AMHETs).

It will be appreciated that, although specific embodiments of the present disclosure are described for purposes of illustration, various modifications may be made without departing from the spirit and scope of the present disclosure.

In this description, certain specific details are set forth in order to provide a thorough understanding of various aspects of the disclosed subject matter. However, the disclosed subject matter may be practiced without these specific details. In some instances, well-known structures and methods of semiconductor processing have not been described in detail to avoid obscuring the descriptions of other aspects of the present disclosure.

Reference throughout the specification to "one embodiment" or "an embodiment" means that a particular feature, structure, or characteristic described in connection with the embodiment is included in at least one embodiment. Thus, the appearance of the phrases "in one embodiment" or "in an embodiment" in various places throughout the specification are not necessarily all referring to the same aspect. Furthermore, the particular features, structures, or characteristics may be combined in any suitable manner in one or more aspects of the present disclosure to provide further embodiments.

The term "overlap," as used herein, refers to an arrangement of at least a first member and a second member in which one of the first member and the second member is positioned over the other of the first member and the second member. The first member and the second member may be spaced apart from each other—for example, the first member and the second member may not be in contact to be considered as being overlapping. Absent an indication to the contrary, the term "overlapping," "overlaps," or variations thereof do not necessarily mean that a particular one of the aforementioned first and second members are above the other one. For instance, "the first member overlapping the second member" could be understood as indicating that the first member is positioned above the second member or that the second member is positioned above the first member.

The term "region," as used herein, refers to a single continuous piece of material formed during a step or an operation of a fabrication process. In the context of the present disclosure, a first region and a second region of the same or similar materials (e.g., metal) may be formed in separate operations and separated by a region of different material. Although an intervening region of the same or similar material may connect the first and second regions, the first and second regions are not considered as being the same region.

The term "control terminal," as used herein, refers to a terminal to which a signal having certain electrical characteristics (e.g., voltage, current) is applied to control conduction by a transistor of the terminal. By way of non-limiting example, the term "control terminal" may be understood as referring to a base terminal of a hot electron transistor (HET) or a bipolar junction transistor (BJT), or may be understood as referring to a gate terminal of a metal oxide silicon field effect transistor (MOSFET) depending on the context.

The devices disclosed herein may be formed on a variety of substrates. As one example, a display device may include an array of pixels formed on a flexible substrate and that each include control circuitry having an amorphous metal transistor. The resulting display device has increased flexibility relative to traditional devices, which may be formed on a rigid substrate such as glass or which may include components formed using crystalline metal. Devices formed using amorphous metal, as described herein, may even bend along one or more dimensions and may change shapes without damage to the circuitry.

Furthermore, the circuitry of the present disclosure has a simplified design that implements non-linear devices. The term "non-linear," as used herein, refers to a property in which changes in output of an element is not directly proportional relative to a change in input, or in which a straight line in a two-dimensional space does not properly represent a response of the element. In the context of the present disclosure, for example, a device may be characterized as being "non-linear" due to exhibiting a non-linear change in an electrical output (e.g., current) in response to a change in an electrical input (e.g., voltage).

The circuit structures of the present disclosure are configured to be included in a variety of display devices, such as cell phones, televisions, and computer monitors. The display devices may have a rigid or flexible support. The different circuit structures are formed on the substrate or support may be covered by a liquid crystal layer, a patterned indium tin oxide layer, color filters, and polarizers. Some of the transistor structures of the present disclosure may be coupled as a two terminal device, to operate as a non-linear resistor diode, such as by connecting gate and drain electrodes. These transistors may operate as thin-film diodes.

FIG. 1 includes a circuit 100 that includes a switching transistor 102 and a drive transistor 104 coupled to operate a device 106, such as a lighting or pixel element (e.g., LED), or a sensor element. The switching transistor 102 has a first terminal 108 coupled to a first line for application of a first signal. A control terminal 110 of the switching transistor 102 is coupled to a second line for application of a second signal. The control terminal 110 is a gate terminal or a base terminal of the transistor 102.

A second terminal 112 of the switching transistor 102 is coupled to a control terminal 114 of the driving transistor 104. A first terminal 116 of the driving transistor 104 is coupled to a third line, which may supply power in some configurations. The device 106 is coupled between a second terminal 118 of the driving transistor 104 and a fourth line, which may be a ground or reference node. In operation, a first signal may be applied to the control terminal 110, causing a second signal at the first terminal 108 to transit through the switching transistor 102 and to the control terminal 114 of the driving transistor 104. In response, power supplied at the first terminal 116 is conducted through the driving transistor 104 and applied to the device 106, causing the device 106 to operate, such as emitting light.

Figure 2:
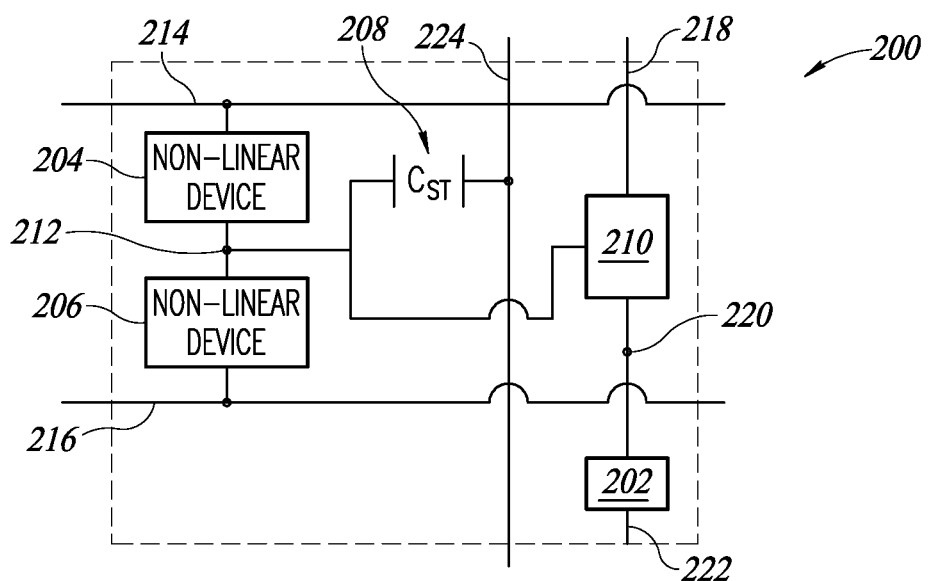
FIGS. 2 and 3 are schematic diagrams of a circuit including non-linear elements according to one or more embodiments.

FIG. 2 includes a circuit 200 having non-linear devices according to one or more embodiments. The circuit 200 is coupled to and controls operation of a component 202 based on signals received by the circuit 200. The circuit 200 includes a first non-linear device 204, a second non-linear device 206, a storage capacitor 208, and a driving device 210.

The first and second non-linear devices 204 and 206 each include one or more amorphous metal non-linear resistors (AMNRs). The term AMNR, as used herein, refers to a device that includes a first region of amorphous metal, a second region of tunneling insulator material directly overlapping and in contact with the first region of amorphous metal, a pair of conductive electrodes in contact with the second region.

Amorphous metal, as used herein, refers to a class of metal having an amorphous or disordered atomic structure. Amorphous metals are solid materials whose atomic structure lacks the long-range periodicity that characterizes crystalline materials. In an amorphous metal, formation of crystalline planes is suppressed, for example, by rapidly cooling a molten metal. Amorphous metal may include several different types of metals, non-restrictive examples of which includes aluminum (Al), titanium (Ti), zirconium (Zr), nickel (Ni), copper (Cu), Tantalum (Ta), Silicon (Si), and Tungsten (W). Non-limiting examples of such amorphous metals are titanium aluminide ($TiAl_3$), copper zirconium alloys (e.g., $Cu_xZr_y$), zirconium copper alloys, (e.g., $Zr_{55}Cu_{30}Al_{10}Ni_5$ described in U.S. Pat. No. 8,436,337), tungsten-tantalum-copper alloys (e.g., $W_xTa_yCu_z$), and tantalum-tungsten-silicon alloys (e.g., $Ta_xW_ySi_z$). Amorphous metals have electrical properties that are distinguishable from electrical properties of crystalline metals. For example, resistivity of amorphous metal materials, while still considered as being conductive, is greater than the resistivity of crystalline counterpart materials. Amorphous metals also have smoother surfaces than crystalline metals, as indicated by root mean square (RMS) surface roughness measurements.

By contrast, the term "crystalline metal" refers to conventional metals with an ordered atomic structure, such as a periodic arrangement of constituent atoms. The term "metal," in the absence of a modifier or unless otherwise indicated by context in the description, refers interchangeably to crystalline metal or amorphous metal. For example, reference to "a region of metal" may refer exclusively to a continuous region of amorphous metal or exclusively to a continuous region of crystalline metal, but not a region that includes a continuous region of amorphous metal in contact with a continuous region of crystalline metal. However, it is understood that crystalline metal may refer to metallic alloys having a crystalline atomic structure and that amorphous metals may refer to metallic alloys having a disordered atomic structure.

AMNRs have characteristics that are superior to conventional thin film resistors in several respects. As an example, the current response of AMNRs is independent of the polarity of the applied voltage, which is not true for other thin film resistors. This polarity independence is due to the presence of two dielectric barriers. The charge carriers at each barrier are forced to tunnel in substantially opposite directions. AMNRs exhibit two-way tunneling because, in response to an applied voltage, the charge carriers in the device tunnel in both directions across the barriers. That is, in an AMNR, tunneling occurs from an upper electrode to a lower electrode and from the lower electrode to the upper electrode, regardless of the polarity of the applied voltage. Such polarity-symmetric AMNRs may provide improved signal control in numerous applications, such as liquid crystal display (LCD) technologies, OLED display technologies, and electromagnetic sensor technologies. Further disclosure of AMNRs is provided in U.S. Pat. No. 10,438,841 issued Oct. 8, 2019, the entirety of which disclosure is incorporated herein by reference.

The first non-linear device 204 and the second non-linear device 206 are coupled to a node 212 in the circuit 200. The first non-linear device 204 is coupled (directly or indirectly) to a first line 214. The second non-linear device 206 is coupled to a second line 216. In some embodiments, the first and second non-linear devices 204, 206 each include a plurality of AMNRs coupled as an array between the node 212 and the first or second line 214, 216—for example, two or more AMNRs successively coupled in series between the node 212 and the second line 216. The first line 214 and the second line 216 respectively couple first and second electric signals to the first non-linear device 204 and the second non-linear device 206 from one or more external sources, such as a control system external to the circuit 200.

The driving device 210 has a first terminal coupled to a third line 218. A second terminal of the driving device 210 and a first terminal of the component 202 are coupled to a node 220, which may be a direct coupling between the terminals of the respective elements, or which may include one or more conductive connections between the terminals. A second line of the component 202 is coupled to a fourth line 222. One line of the third line 218 and the fourth line 222 may be coupled to a power supply and the other line may be coupled to a ground or reference node. The storage capacitor 208 includes a first plate electrode coupled to a fifth line 224 and a second plate electrode coupled to the node 212. The first plate electrode and the second plate electrode of the storage capacitor 208 are separated by one or more dielectric layers. The driving element 210 is electrically coupled to the node 212. Thus, the first and second non-linear devices 204 and 206, the storage capacitor 208, and the driving element 210 are each coupled to the node 212.

The driving element 210 includes a semiconductor region, and is configured to conduct or channel power between the third line 218 and the fourth line 222 based at least in part on an electric signal provided to the semiconductor region. The electric signal provided to the semiconductor region is generated based on signals provided to the first line 214, the second line 216, and the fifth line 224.

The driving element 210 is operationally similar to some transistor elements, such as metal-oxide semiconductor field effect transistors (MOSFETs) or bipolar junction transistors (BJTs). However, in at least some embodiments, the driving element 210 may have one or more structural features that are distinguishable from conventional transistor elements. For instance, the driving element 210 may be an Amorphous Metal Thin-Film Transistor (AMTFT) or an Amorphous Metal Hot Electrode Transistor (AMHET) that include an amorphous metal region.

The design and operation of the circuit 200 is distinguishable from the design and operation of the circuit 100 in various respects. The circuit 200 does not include a transistor coupled to the driving element 210 whereas the circuit 100 includes the switching transistor 102 coupled to the driving transistor 104. The circuit 200 includes the first and second non-linear devices 204 and 206, which are coupled in series between the first line 214 and the second line 216.

In operation, the first and second non-linear devices 204 and 206 provide an electrical signal at the node 212 based on signals applied to the first and second lines 214 and 216 for controlling the driving element 210. For instance, as a result of signals provided on the first and second lines 214 and 216, the first non-linear device 204 and the second non-linear device 206 may operate in a first mode in which the first and second lines 214 and 216 are coupled to the node 212. In the first mode, the first non-linear device 204 and the second non-linear device 206 may form a voltage divider such that the voltage at the node 212 is between voltages on the first and second lines 214, 216. The first and second non-linear device 204, 206 may be operated in a second mode in which at least one of the first and second lines 214 and 216 are electrically decoupled from the node 212 as a result of second signals being provided on the first and second lines 214, 216.

The first and second non-linear devices 204, 206 may be operated to cause the storage capacitor 208 to store and discharge electrical energy. The storage capacitor 208 may store electrical energy provided via the fifth line 224 during a first time period. Then, during a second time period, at least some electrical energy stored in the storage capacitor 208 may be discharged to the semiconductor region of the driving element 210, causing the driving element 210 to supply power to the component 202.

Figure 3:
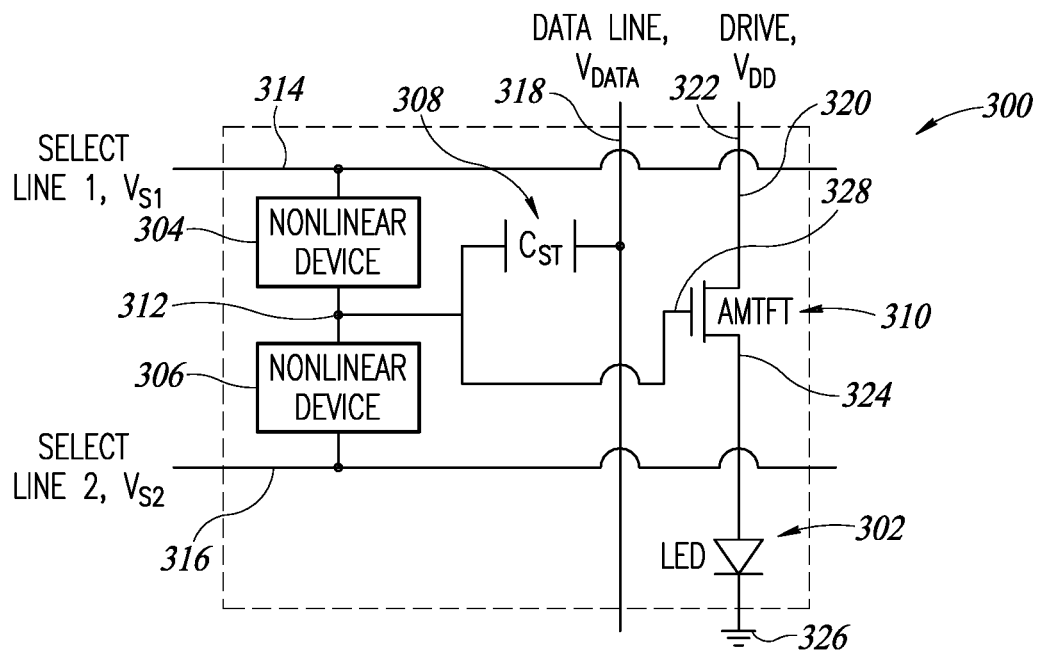

FIG. 3 shows a schematic diagram of a circuit 300 that includes non-linear devices and a more particular embodiment of the circuit 200. The circuit 300 includes an LED 302, a first non-linear device 304, a second non-linear device 306, a storage capacitor 308, and an AMTFT 310.

A non-linear device, as described herein, refers to a plurality of AMNRs formed by overlapping regions of metal or metal alloys. At least one region of metal forming an AMNR of a non-linear device is a region of amorphous metal.

The first non-linear device 304 is coupled to a node 312 and a first select line 314. The second non-linear device 306 is coupled to the node 314 and a second select line 316. The storage capacitor 308 is coupled between the node 312 and a data line 318 that provides a signal corresponding an operational state of the LED 302.

The AMTFT 310 has a first terminal 320 (e.g., drain terminal) coupled to a power supply line 322 that causes the LED 302 to emit light. The AMTFT has a second terminal 324 (e.g., source terminal) coupled to an anode of the LED 302. The cathode of the LED 302 is coupled to a ground 326. A gate 328 of the AMTFT 310 is coupled to the node 312.

It is understood that the circuit 300 may be operated differently based, e.g., on the AMTFT 310 configuration (P-type, N-type), characteristics of the LED 302, and characteristics of the first and second non-linear devices 304, 306. During a first time period, the first select line 314 and the second select line 316 receive a first and second signal with different values. As an example, the first signal may be a direct current (DC) voltage having a positive amplitude (e.g., +15 VDC) and the second signal may be a DC voltage having a negative amplitude (e.g., −15 VDC). The first and second non-linear devices 304, 306 conduct current between the first select line 314, the second select line 316, and the node 312 based on relative characteristics of the first signal and the second signal to control a voltage on the node 312. For example, where the first and second signals have opposing polarities and similar amplitudes, the voltage at the node 312 may be maintained at a midpoint voltage between the first and second signals.

Concurrently during the first time period, a data signal is applied to the data line 318. The storage capacitor 308 charges as a result of the difference between voltages on the data line 318 and the node 312. In the example provided above, if the node 312 is maintained at or around 0 VDC, a data signal having a voltage level of +5 VDC causes the storage capacitor 308 to charge during the first time period.

During a second time period, signals on the first select line 314, the second select line 306, and the data line 318 cause the AMTFT 310 to conduct power from the power supply line 322 and through the LED 302. In the example above, signals having a voltage level (e.g., 0 VDC) below a conductance threshold of the first and second non-linear devices 304, 306 may be applied to the first select line 314 and the second select line 316. The first and second non-linear devices 304, 306 will not conduct current between the node 312 and the first and second select lines 314 and 316, and the voltage of the node 312 will be floating relative to the first select line 314 and the second select line 316.

In connection with transitioning of the signals on the first select line 314 and the second select line 316 during the second time period, the data signal on the data line 318 is transitioned to a level lower than the data signal during the first time. The capacitor 308 is discharged as a current to the gate 328 that is sufficient to cause the AMTFT 310 to conduct to the LED 302. The impedance of the gate 328 is sufficiently high that light emission characteristics of the LED 302 may be maintained to be relatively constant during the second time period.

The first time period may be sufficiently short that light emission by the LED 302 may be controlled to appear constant to a human eye. The circuit 300 may be alternate between the first and second time periods described above to operate the LED 302. The circuit 300 may be a single pixel element of an array of pixel elements arranged in a matrix configuration having rows and columns.

In such configurations, the first and second select lines 314 may extend along a first dimension of the array (e.g., column dimension) and the data line 318, the power supply line 322, and a line providing the ground 326 may extend along a second dimension of the array (e.g., a row dimension) transverse to the first dimension. Additional select lines, power supply lines, ground lines, and data lines may be provided within the pixel array to selectively address and write data to circuits surrounding the circuit 300.

Figure 4:
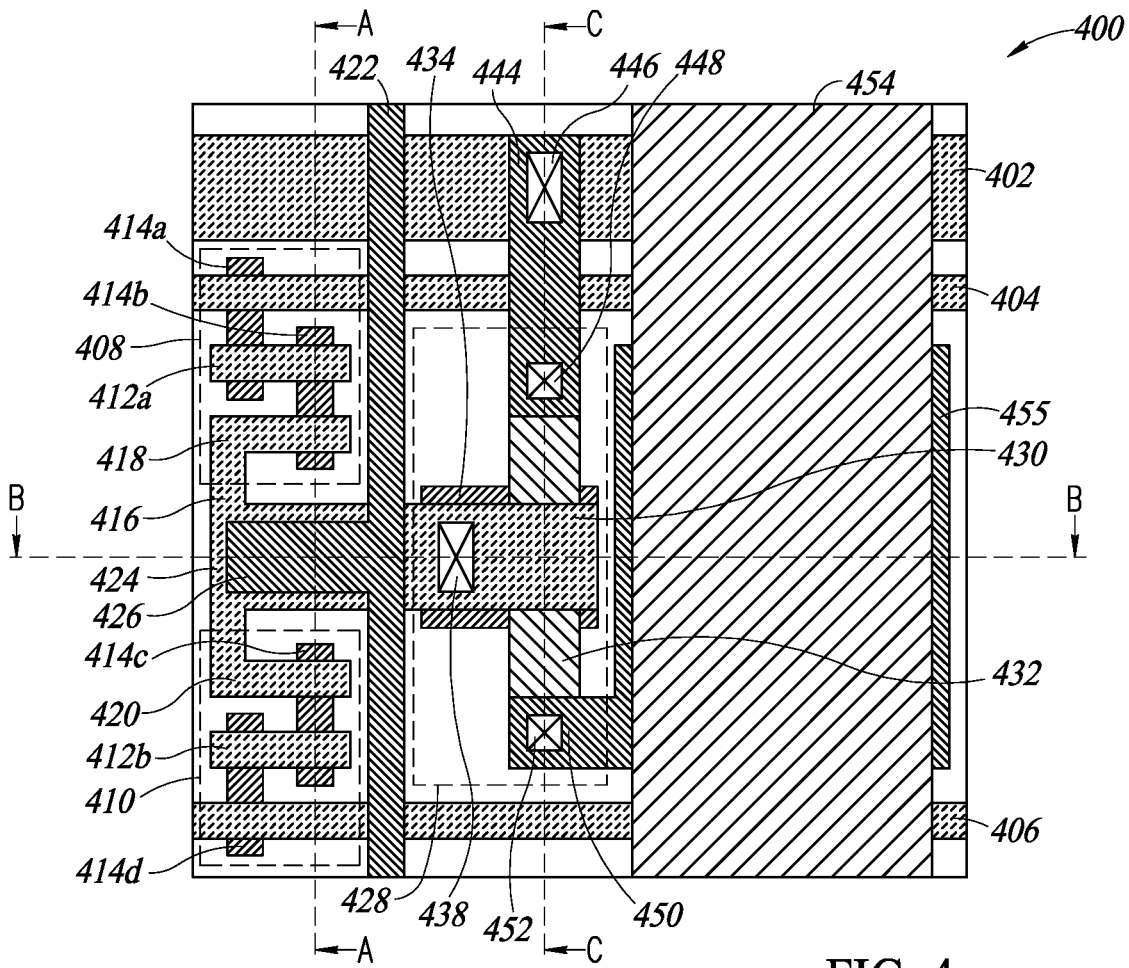

FIG. 4 shows a layout 400 for implementing at least a portion of the circuits 200 or 300 according to embodiments described. By way of non-limiting example, elements of components (e.g., anodes, cathodes) may be co-planar with one or more regions in the layout 400 or may be stacked on top of the layout 400. The layout 400 is formed on a non-conductive substrate (see FIGS. 5A-5C) and each of the regions shown in the layout 400 has cross-hatching patterns indicating a layer in which the region is located on the substrate.

The layout 400 includes a first power line 402, a first select line 404, and a second select line 406 extending along a first direction. The first direction referenced is a horizontal direction between side edges of the circuit shown as illustrated. Other orientations are envisioned. Although the term "line" is used, such lines are strips or regions of thin-film metal having a length and a width when viewed from the perspective shown in FIG. 4.

The first power line 402, the first select line 404, and the second select line 406 are conductive regions for conveying electrical signals and may be crystalline metal due to its lower resistivity relative to the resistivity of at least some amorphous metals. However, one or more lines of the first power line 402, the first select line 404, and the second select line 406 could be formed of an amorphous metal material or other flexible material if the resistivity of such materials could be lowered to a level comparable to crystalline metals.

The layout 400 includes a first non-linear device 408 coupled to the first select line 404 and a second non-linear device 410 coupled to the second select line 406. A plurality of first interconnects 412a, 412b overlap a plurality of second interconnects 414a-d. The first interconnects 412 are regions of crystalline metal and the second interconnects 414 are regions of amorphous metal. The regions of amorphous metal of the AMNRs are separated from overlapping regions of crystalline metal of the AMNRs by a tunneling insulator 504 to form the AMNR structures. A plurality of AMNRs may include a single AMNR formed by a pair of overlapping interconnects or a plurality of AMNRs formed by more than two overlapping interconnects.

A first electrode region 416 is coupled to the first select line 404 by the first non-linear device 408. The first electrode region 416 corresponds, at least in part, to the nodes 212 and 312. The first electrode region 416, in at least some embodiments, is a region of crystalline metal. The first select line 404 overlaps a first portion of a second interconnect 414a and a first portion of a first interconnect 412a overlaps a second portion of the second interconnect 414a to form a first AMNR of the first non-linear device 408. A second portion of the first interconnect 412a overlaps a first portion of a second interconnect 414b and a first interconnect 418 of the first electrode region 416 to form a second AMNR of the first non-linear device 410. The first AMNR and the second AMNR of the first non-linear device 408 are coupled in series between the first electrode region 416 and the first select line 404.

The first electrode region 416 is coupled to the second select line 406 by the second non-linear device 410. The second non-linear device also includes a third AMNR and a fourth AMNR coupled in series with the third AMNR. The third AMNR and the fourth AMNR are formed by overlapping portions of a second interconnect 420 of the first electrode region 416, a second interconnect 414c, a second interconnect 412b, and a first interconnect 414d in a manner similar to the first non-linear device 410.

In other embodiments, the first non-linear device 408 may have different electrical properties than the second non-linear device 410. The AMNRs may be coupled differently to achieve different electrical characteristics—for example, one or both of the non-linear devices may include AMNRs coupled in parallel, or may include additional or fewer AMNRs. A non-symmetrical midpoint voltage at the first electrode region 416 may be achieved, for example, by modifying interconnect sizes, interconnect shapes, the number of interconnects, or the topology of the non-linear devices.

The layout 400 includes a data line 422 extending along a second direction of the transverse to the first direction. The data line 422 is a conductive region for conveying a data signal corresponding to a selected operational state of a device to be controlled (e.g., light emitting element, sensor element). The data line 422 in at least some embodiments is formed of a crystalline metal material.

The first electrode region 416 is E-shaped in FIG. 4, however, this region could be S-shaped or other shapes as beneficial to the design. The first electrode region 416 includes a first plate electrode 424 located between the first and second non-linear devices 408, 410. The circuit 400 also includes a second plate electrode 426 projecting outward from the data line 422 in the first direction and overlapping the first plate electrode 424, which are a single, continuous region of metal. The second plate electrode 426 has a surface area that overlaps with a surface area of the first plate electrode 424. A dielectric layer 508 separates the first plate electrode 424 and the second plate electrode 426, forming a capacitor. The first plate electrode 424 and the second plate electrode 426 form the storage capacitors 208 and 308.

The circuit 400 also includes an AMTFT 428 that is coupled to the capacitor and the first and the second non-linear devices 408, 410. In particular, the first electrode region 416 includes a first gate electrode 430 that extends along the first direction from the first plate electrode 424 to form a first gate of the AMTFT 428. The AMTFT 428 includes a channel conductor region 432 that extends along the second direction and transversely to the first gate electrode 430. The channel conductor region 432 is a region of or including semiconductor material whose electrical properties vary depending on an electrical signal applied. Non-limiting examples of semiconductor materials include silicon (Si), germanium (Ge) and gallium arsenide (GaAs) that are doped with an impurity providing a selected response to a voltage or current. The first gate electrode 430 is positioned over a top side of the channel conductor region 432 and has a width overlapping a middle portion of the channel conductor region 432.

The AMTFT 428 also includes a second gate electrode 434 that is positioned under a bottom side of the channel conductor region 432 opposite to the first gate electrode 430. The second gate electrode 434 has a width along the second direction that overlaps with the middle portion of the channel conductor region 432. The second gate electrode 434 is a region of amorphous metal formed on the non-conductive substrate 502. The second gate electrode 434 is coupled to the first gate electrode 430 and forms a second gate of the AMTFT 428. The dual gate structure of the AMTFT 428 may provide some advantages over a single gate structure—for example, the increased overlapping surface area of the first and second gate electrodes 432 and 434 on the middle portion of the channel conductor region 432 may facilitate faster switching times of the AMTFT 428 relative to a TFT structure having a single gate.

The layout 400 includes an interconnect 444 that electrically couples the AMTFT 428 to the first power line 402. The interconnect 444 is a region of crystalline metal that extends along the second direction and has a first portion coupled to the first power line 402 and a second portion coupled to the channel conductor region 432. A via or coupling region 446 extends between and electrically connects the interconnect 444 on one layer of the layout 400 and the first power line 402 on another layer of the layout 400. A via 448 extends between and electrically connects the interconnect 444 and the channel conductor region 432. The electrical connection of the channel conductor region 432 to the first power line 402 corresponds to connection of the first terminal 320 of the AMTFT 310 to the power supply line 322 described with respect to the FIG. 3.

The layout 400 also includes a region 450 that is coupled to the channel conductor region 432. The region 450 is coupled the first power line 402 via the AMTFT 428 when the AMTFT 428 is conducting current. The region 450 is coupled to the channel conductor region 432 by a via 452 that extends between the region 450 on and the channel conductor region 432. The layout 400 includes a second power line 454 that provides a ground or reference point for one or more signals provided to the layout 400, such as the power supply signal, the first select signal, the second select signal, and the data signal. The interconnect 450 is coupled to a plate 455 of a capacitor associated with the component or capacitor 202.

Figure 5C:
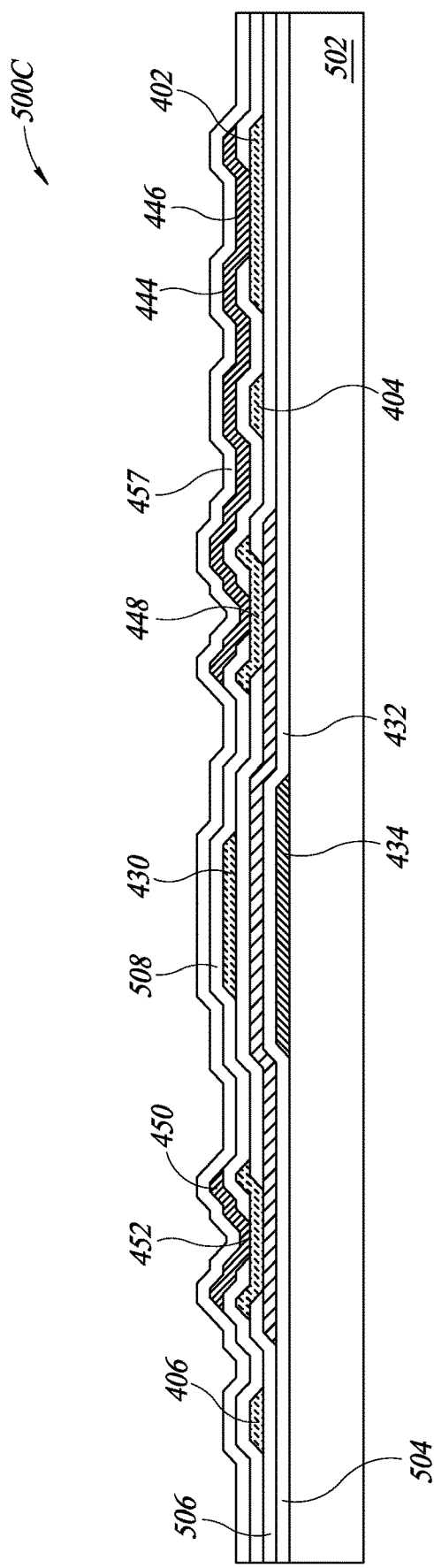

FIGS. 5A-5C show cross-sectional views of the layout 400 taken along lines shown in FIG. 4. The various layers in the cross-sectional are illustrative of the relative positions of the layers and do not necessarily represent dimensions (e.g., thickness, width, length). This includes vertically stacked electrodes for the pixel, visual element. This arrangement may be beneficial for displays where the visual element is an OLED.

FIG. 5A shows a cross-sectional view 500A of the layout 400 taken along the line A-B of FIG. 4. The layout 400 includes a substrate 502 that can be a variety of materials having different physical or electrical properties suitable to a particular application. In some embodiments, the substrate 502 may be formed of a material having non-conductive electrical properties, which may have a lower cost to produce relative to some other materials. Non-limiting examples of such nonconductive materials include glass (e.g., borosilicate glass, Alumina borosilicate glass), ceramics, and fused silica. In some embodiments, the substrate 502 may be a material having conductive electrical properties, such as crystalline metal or amorphous metal. In such embodiments, an insulator layer may be formed between the substrate 502 and the regions of the layout 400. Such an insulator layer may be formed of a material having a high energy gap that prevents the flow of current between circuit components and the substrate 502, such as silicon dioxide ($SiO_2$), organosilicate glass, organic low-k polymers, and air gaps, as several non-restrictive examples.

In some embodiments, the substrate 502 is a flexible material, such as rubber or flexible plastics (e.g., polyimide, polyamide, Polyether ether ketone, polyester). In such embodiments, the combination of a flexible substrate 502 and amorphous metals may provide flexible circuitry and devices that has increased flexibility or tensile strength relative to at least some conventionally formed circuitry and devices using crystalline metal. Circuit elements (e.g., pixels, sensor element) having the reduced circuit structure (e.g., circuit 200, circuit 300) described can also have improved physical properties, such as increased flexibility.

The view 500A includes the second interconnects 414b, 414c that are respectively part of the first non-linear device 408 and the second non-linear device 410. The second interconnects 414b, 414c are formed on the substrate 502 as thin-film regions of amorphous metal concurrently formed with a thickness of 10-100 nm. Thin-film regions of amorphous metal described may be formed using any film-forming technique such as sputtering, solution deposition, or electron-beamed deposition. By way of non-restrictive example, multi-source RF (or DC) magnetron sputtering using elemental or mixed composition metal targets of Zr, Cu, Ni, and Al may be employed. Sputter deposition provides a distinct manufacturing advantage over similarly smooth conductors and semiconductors deposited using advanced epitaxial formation technologies, such as plasma vapor deposition, atomic layer deposition, molecular beam epitaxy (MBE), or metal-organic chemical vapor deposition (MOCVD). Formation of amorphous metals may involve certain progressions of temperatures to limit or prevent formation of crystalline structures in the material.

A first insulator layer 504 is formed over the substrate 502 and covers the second interconnects 414a, 414b, 414c, and 414d. The first insulator layer 504, in some embodiments, is formed as a very thin conformal layer of material that forms at least part of a tunneling insulator. Non-limiting examples of such materials include oxides, a nitrides, silicon nitrides, metal oxides (e.g., aluminum oxide), or other such materials. More specific examples of such materials include metal oxide (e.g., $Al_2O_3$), metal nitrides hafnium oxide ($HfO_2$), silicon oxide ($SiO_2$), zirconium oxide ($ZrO_2$), and titanium oxide ($TiO_2$). The first insulator layer 504 may be between 2-100 nm in some embodiments depending, at least in part, on an electrical response of the non-linear devices 408 and 410.

A second insulator layer 506 is formed over the first insulator layer 504. The second insulator layer 506 also a thin conformal layer of material that forms at least part of a tunneling insulator for the non-linear devices 408 and 410. The second insulator layer 506 may be between 2-100 nm depending, at least in part, on the electrical responses of the AMTFT 428 and the non-linear devices 408 and 410. In some embodiments, a combined thickness of the first insulator layer 504 and the second insulator layer 506 may be 20 nm or less—for example, 15 nm.

The first plate electrode 424 is on the second insulator layer 506 and is part of the first electrode region 416, which is a region of metal, such as amorphous metal or crystalline metal. The first plate electrode 424 may have a thickness of between 25-500 nm, inclusive, and be substantially uniform in thickness. In some embodiments, the first plate electrode 424 may have a thickness between 50-200 nm.

The first power line 402, the first select line 404, the second select line 406, the first interconnects 412a and 412b, and the first interconnect 418, which are also thin-film regions of amorphous metal or crystalline metal. In at least some embodiments, the first power line 402, the first select line 404, the second select line 406, the first interconnects 412a and 412b, and the first interconnect 418 are formed concurrently with formation of the first electrode region 416. For example, the during a deposition operation (e.g., plasma vapor deposition, atomic layer deposition) in which the first power line 402, the first select line 404, the second select line 406, the first interconnects 412a and 412b, and the first electrode region 416 are formed on the second insulator layer 506, such that all have substantially the same thickness. However, the first interconnects 412a and 412b, the first interconnect 418, and the second select line 406 overlap the second interconnects 414a or 414c along the line A-B, and may be higher relative to the substrate 502 than the first electrode plate 424. The portions of the first interconnect 412b and the first interconnect 418 overlapping the second interconnect 414a form an AMNR of the first non-linear device 408. Similarly, the portions of the first interconnect 412b and the second select line 406 overlapping the second interconnect 414c form an AMNR of the second non-linear device 410. The second interconnect 414a, the first and second insulator layers 504 and 506, the first select line 404, and the first interconnect 412a may form a metal-insulator-metal (MIM) device that exhibits Fowler-Nordheim tunneling and superior current voltage (I-V) curves. The upper electrodes, the first interconnect 412a and the first interconnect 418, are separated by a tunneling insulator—the first insulator layer 504—that provides a tunneling pathway for charge carriers to move between the upper electrodes and through the lower electrode, the second interconnect 414b. At a specific voltage the charge carriers in the device are only tunneling in one direction, i.e., one-way tunneling. That is, tunneling occurs either from the lower electrode to the upper electrode, or from the upper electrode to the lower electrode, according to the polarity of the applied voltage. Other portions of the layout 400 in which two or more metal layers overlap an amorphous metal layer may also form an MIM device having superior electrical characteristics to thin film components that include including only crystalline metals. Portions of the second insulator layer 506 may be removed such that the first interconnects 412, the first interconnect 418, the second interconnect 420, and portions of the first and second select lines 404 and 406 are coupled to the amorphous metal regions (second interconnects 414) through the first insulator layer 504.

A third insulator layer 508 is on the first power line 402, the first select line 404, the first interconnects 412a and 412b, the first electrode region 416, the second select line 406, and exposed portions of the second insulator layer 506. The third insulator layer 508 is a conformal layer that is a gate insulator formed over the first gate electrode 430. The third insulator 508 is a dielectric layer between the first plate electrode 424 and the second plate electrode 426. In some embodiments, the third insulator layer 508 may have a different thickness than a combined thickness of the first insulator layer 504 and the second insulator layer 506.

The second plate electrode 426 is conductive and may be a region of metal. The second plate electrode 426 may have a thickness of between 25-500 nm, inclusive, and be substantially uniform in thickness. In some embodiments, the second plate electrode 426 may have a thickness between 50-200 nm. As described herein, the first plate electrode 424, the third insulator layer 508, and the second plate electrode 426 collectively form a storage capacitor that capacitively couples the data line 422 to the AMTFT 428 and a node between the first and second non-linear devices 408 and 410.

Additional layers, like a planarization or insulation layer 510, may be formed over the second plate electrode 426 and the third insulator layer 508, to provide a planar surface covering the layout 400. This layer 510 may be an OLED material stack. The planarization layer 510 may have other physical properties depending on the application of the layout 400—for example, the planarization layer 510 may provide additional structural integrity to prevent excessive deformation or compression, or may have transparency to allow light to be emitted by a light source included in or coupled to the layout 400.

FIG. 5B shows a cross-sectional view 500B of the layout taken along the line C-D of FIG. 4. The second gate electrode 434 is on the substrate 502 and is a thin-film region of amorphous metal having a thickness of between 10-100 nm, inclusive. The second gate electrode 434 has a substantially similar thickness as the second interconnects 414 and is formed concurrently with formation of the second interconnects 414. The first insulator layer 504 is on the second gate electrode 434 and one exposed portions of the substrate 502. The first insulator layer 504 provides a first gate insulator thin-film for the second gate electrode 434.

The first gate electrode 430 of the first electrode region 416 is formed directly on the second insulator layer 506 in some areas and overlaps at least a portion of the second gate electrode 434. The third insulator layer 508 is formed over and covering the first gate electrode 430 and the second insulator layer 506. Photolithographic patterning may be performed to form the via 438 extending through the third insulator layer 508 to the first gate electrode 430.

In particular, an electrical signal received at the first gate electrode 430 is conveyed through the via 438 to the second gate electrode 434. As a result, the first gate electrode 430 and the second gate electrode 434 both provide the same electrical signal (e.g., gate voltage) to top and bottom sides of the channel conductor region 432, which improves the switching time of the AMTFT 428 relative to a similar single-gate design. Another dielectric layer 457 may be formed over the features, including between the electrodes 454 and 455.

FIG. 5C shows a cross-sectional view 500C of the layout taken along the line E-F of FIG. 4. The second gate electrode 434 is on the substrate 502. The first insulator layer 504 is formed covering the second gate electrode 434 and on exposed portions of the substrate 502.

The channel conductor region 432 is formed on the first insulator layer 504 and overlaps the second gate electrode 434. The channel conductor region 432 is a thin-film region of semiconductor material. In some embodiments, the channel conductor region 432 may be an amorphous semiconductor material, such as amorphous silicon (a-Si), Copper indium gallium (di)selenide (CIGS), or an amorphous alloy (e.g., hydrogenated amorphous silicon carbide), that has increased flexibility relative to semiconductor materials having crystalline atomic structures. In some embodiments, the channel conductor region 432 may be formed of a polycrystalline semiconductor material, such as polycrystalline silicon (poly-Si). The channel semiconductor region 432 may have a thickness of between 10-100 nm. The second insulator layer 506 is formed over the first insulator layer 504 and the channel semiconductor region 432.

The first gate electrode 430 of the first electrode region 416 that is formed on the second insulator layer 506 and overlaps the channel conductor region 432. The channel conductor region 432 is between the first gate electrode 430 and the second gate electrode 434. This stacked dual-gate architecture can improve switching time and current conduction of the AMTFT 428.

The second gate electrode 434 can be formed of amorphous metal so that a surface is homogenously smooth (e.g., has a low surface roughness), which results in fewer surface imperfections. Surface imperfections can cause inhomogeneity in an electric field in other materials, such as crystalline metal. By contrast, the smoothness of a surface of amorphous metal facilitates formation of layers on top of the amorphous metal having a uniform thickness—for instance, portions of the first and second insulator layers 504 and 506, the channel conductor region 432, the third insulator layer 508, and the first gate electrode 430 formed over an amorphous metal second gate electrode 434 may each have a more uniform thickness than corresponding layers formed on a crystalline metal second gate electrode 434. Uniformity among the layers may therefore provide uniformity in electric fields and symmetrical current-voltage (I-V) characteristics in the AMTFT 428 formed using an amorphous metal second gate electrode 434. Similar beneficial effects of symmetrical I-V characteristics may also be provided in the first and second non-linear devices 408 and 410 due to the smoothness of the amorphous metal including the second interconnects 414.

The third insulator layer 508 is formed over and on the first gate electrode 430 and the second insulator layer 508. The vias 446, 448 are formed and extend through the third insulator layer 508 to layers beneath. In particular, the via 446 extends through the third insulator layer 508 to the first power line 402, the via 448 extends through the third insulator layer 508 and the second insulator layer 506 to a first portion of the channel conductor region 432, and the via 452 extends through the third insulator layer 508 and the second insulator layer 506 to a second portion of the channel conductor region 432.

The interconnect 444 is formed on the third insulator layer 508 and extends between the via 446 and the via 448, over the first power line 402 and a first portion of the channel conductor region 432. The interconnect 444 is coupled to the first power line 402 through the via 446 and is coupled to the channel conductor region 432 through the via 448. The interconnect 444 thus forms an electrical connection between the first power line 402 and the first portion of the channel conductor region 432. The first portion of the channel conductor region 432 to which the via 448 connects may be considered as being at least part of the first terminal 320 of the AMTFT 310 described with respect to FIG. 3.

The interconnect 450 is formed on the third insulator layer 508 at the via 452 and over a second portion of the channel conductor region 432. The second portion of the channel conductor region 432 to which the via 452 connects may be considered as being at least part of the second terminal 324 of the AMTFT 310 described with respect to FIG. 3. The interconnect 450 may be coupled with a device to be operated and, as a result of application of an appropriate electric signal to the first and second gate electrodes 430 and 434, the channel conductor region 432 may conduct power from the first power line 402 to the device coupled to the interconnect 450.

Figure 6A:
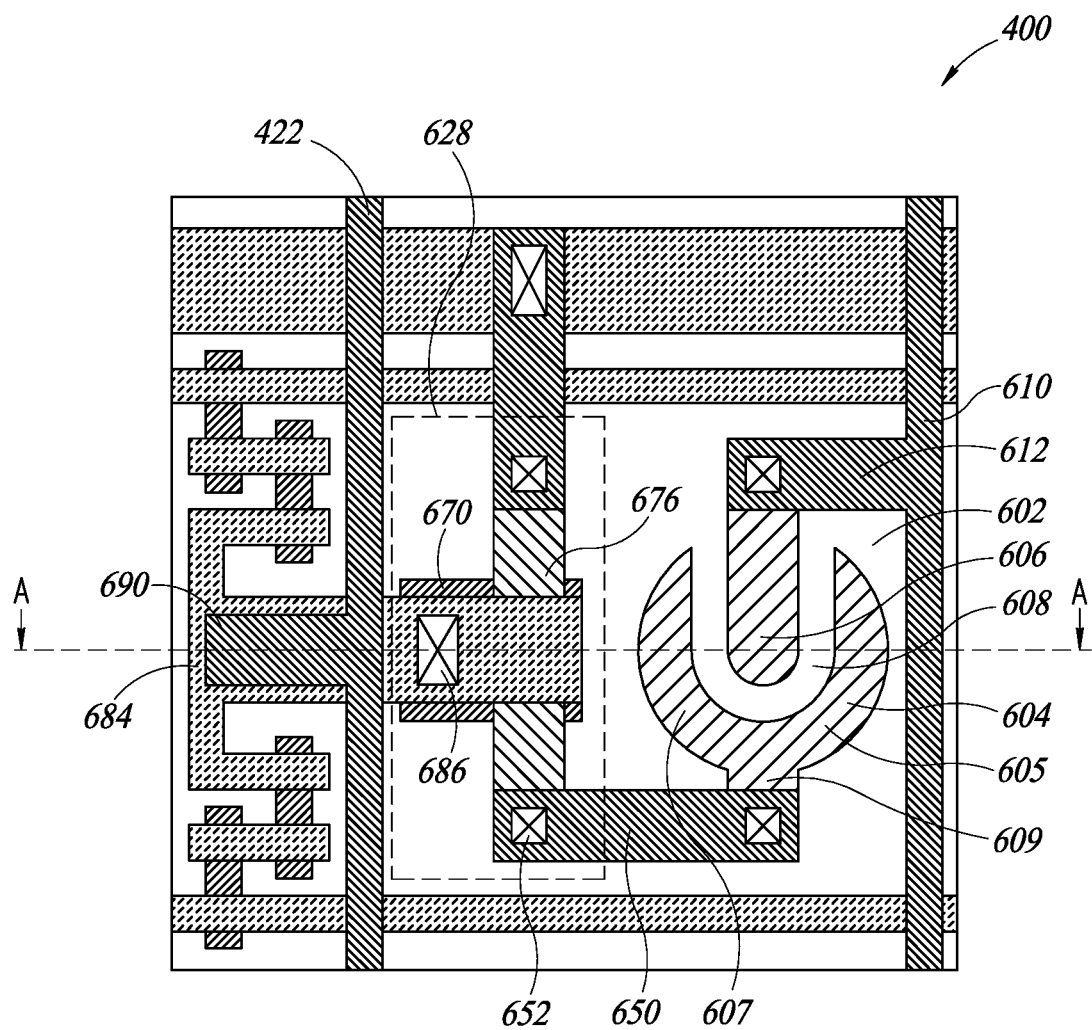
FIGS. 6A-6E are a top and cross-sectional views of layouts of the circuit of FIG. 2 according to an embodiment of the present disclosure.
Figure 6B:
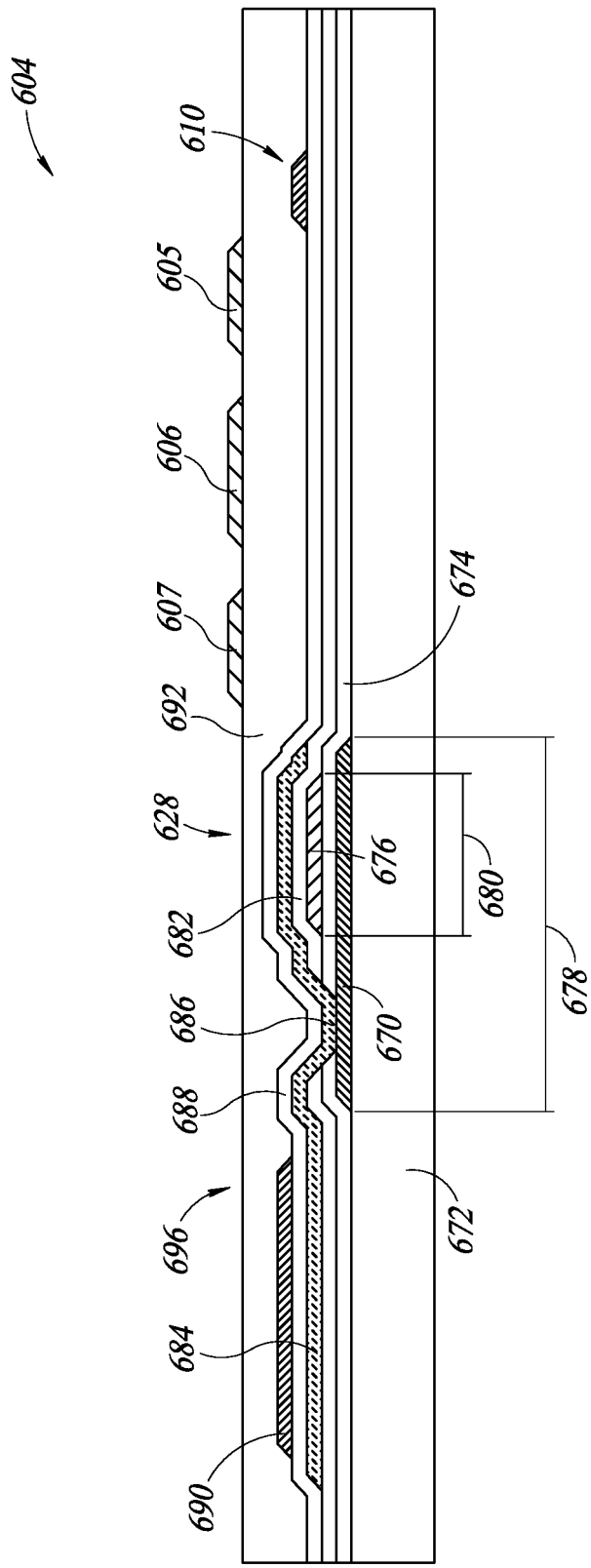

FIGS. 6A-6B are an alternative embodiment of the layout 400 that includes a component 602 and a cross-sectional view through line G-H that generates or emits light based on a voltage or a current provided from an AMTFT 628. The component 602 is coupled to the AMTFT 628 and non-linear devices similar to those described in FIG. 4. Non-limiting examples illumination devices as the component 602 include electrophoretic elements, electroluminescent elements, LEDs, an LCD element that modulates light, and filaments. Alternatively, the component 602 may be part of a touch sensor (e.g., capacitive touch sensor), a light sensor, an accelerometer, a pressure sensor, or other such sensors.

The component 602 includes a first region 604 and a second region 606 spaced from the first region 604. For example, the component 602 may be an electroluminescent element that emits light in response to application of an electric current such that the first region 604 is a first electrode and the second region 606 is a second electrode. A space 608 between the first region 604 and the second region 606 may include one or more electroluminescent layers.

The first region 604 is curved in that a first arm 605 and a second arm 607 have curved interior and exterior edges that extend from a connection arm 609. The connection arm 609 is aligned with and has a similar width to the second region 606, which includes substantially parallel sides that extend between the first and second arm of the first region 604. The space 608 is U-shaped and has a consistent dimension between the first region and the second region along the entire space. The component 602 is coupled to the AMTFT 628 via an interconnect 650. The connection arm 609 is coupled to the interconnect 650 and to a terminal 652 of the AMTFT 628. The component 602 is coupled to a second power line, in this example ground line 610 through an interconnect 612.

Figure 7:
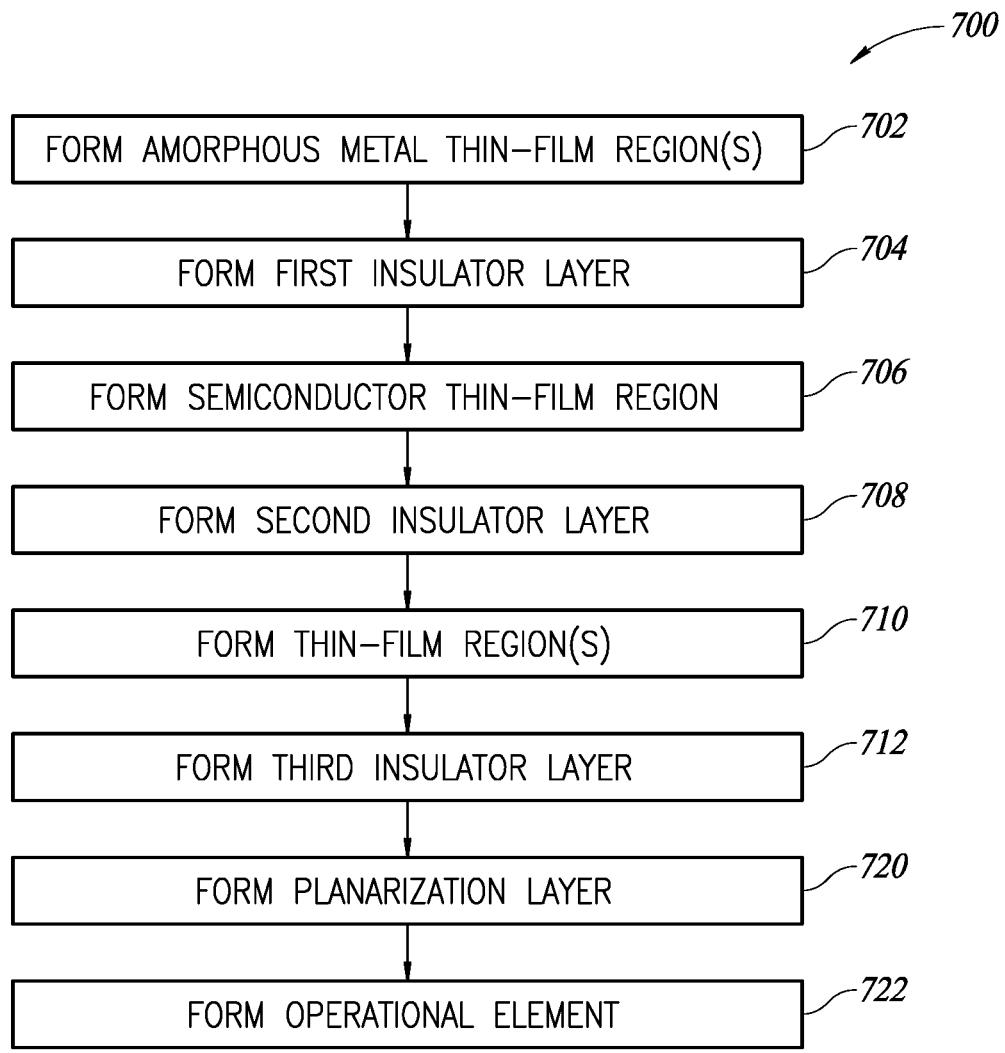
FIG. 7 is a method of forming a circuit that includes non-linear elements according to one or more embodiments.

FIG. 7 is a method 700 for fabricating the layout 400 in conjunction with the cross-sectional view of FIG. 6B. At 702, amorphous metal thin-film regions, including an electrode 670 are formed on a substrate 672. The electrode 670 is part of the AMTFT 628 The amorphous metal thin-film regions may be formed at the same time as amorphous metal regions of the non-linear features, like those in FIG. 4. The amorphous metal thin-film regions may have a thickness of between 10-100 nm. The amorphous metal thin-film regions have a smooth surface that provides improved uniformity of additional layers formed. The amorphous metal thin-film regions are patterned and etched to achieve the dimensions and shapes.

At 704, a first insulator layer 674 is formed on the substrate 672 and the amorphous metal-thin-film regions. The first insulator layer is a tunneling insulator layer for the non-linear devices and is a gate insulator for the electrode 670. The first insulator layer has a thickness of between 2-100 nm in some embodiments.

At 706, a semiconductor thin-film region 676, such as a channel conductor region is formed on the first insulator layer 674. In other modems, the semiconductor thin-film region may be formed of a polycrystalline semiconductor material. In at least some embodiments, the semiconductor thin-film region has a thickness of between 10-100 nm. In a first direction from G to H in FIG. 6B, a dimension 678 of the electrode 670 is greater than a dimension 680 of the thin-film region 676. At 708, a second insulator layer 682 is formed on the first insulator layer and the semiconductor thin-film region. The second insulator layer 682 insulates the semiconductor thin-film region 676 from an electrode 684 of the AMTFT. An opening or via 686 is formed through the first and second insulators to expose a surface of the electrode 670.

At 710, conductive thin-film regions are formed on the second insulator layer 682 and on the surface of the electrode 670 through the opening 686. At the same time, with patterning and etching, a first powerline, select lines, and interconnects in the non-linear devices may be formed. The thin-film regions may have a thickness between 25-500 nm, inclusive, and be substantially uniform in thickness. In some embodiments, the thin-film regions may have a thickness between 50-200 nm.

At 712, a third insulator layer 688 is formed on the second insulator layer and on the thin-film regions. The third insulator layer is an intermetal dielectric layer that provides electrical isolation between the electrode 684 and another electrode 690. At the same time, the ground line 610 may be formed on a surface 694 of the third insulator 688. The ground line 610 is separated from the substrate 672 by only the first, second, and third insulator layers. This puts a top surface of the ground line 610 closer to the substrate than a top surface of the electrode 690. The method includes forming each of these layers conformally, to streamline and simplify the manufacturing process.

At 720, a planarization layer 692 is formed on the electrode 690, the ground line 610, and exposed surfaces of the third insulator 688. This planarization layer is an insulator that may allow light to conduct or pass through the layer. A surface 696 is planarized or otherwise smoothed by a chemical mechanical planarization process. This provides a flat surface for formation of electrodes of the component 602.

At 722, portions of the component 602 are formed, which may include forming the first region 604 adjacent to the second region 606. The second region 606 is between the first arm and the second arm 605, 607.

Figure 6C:
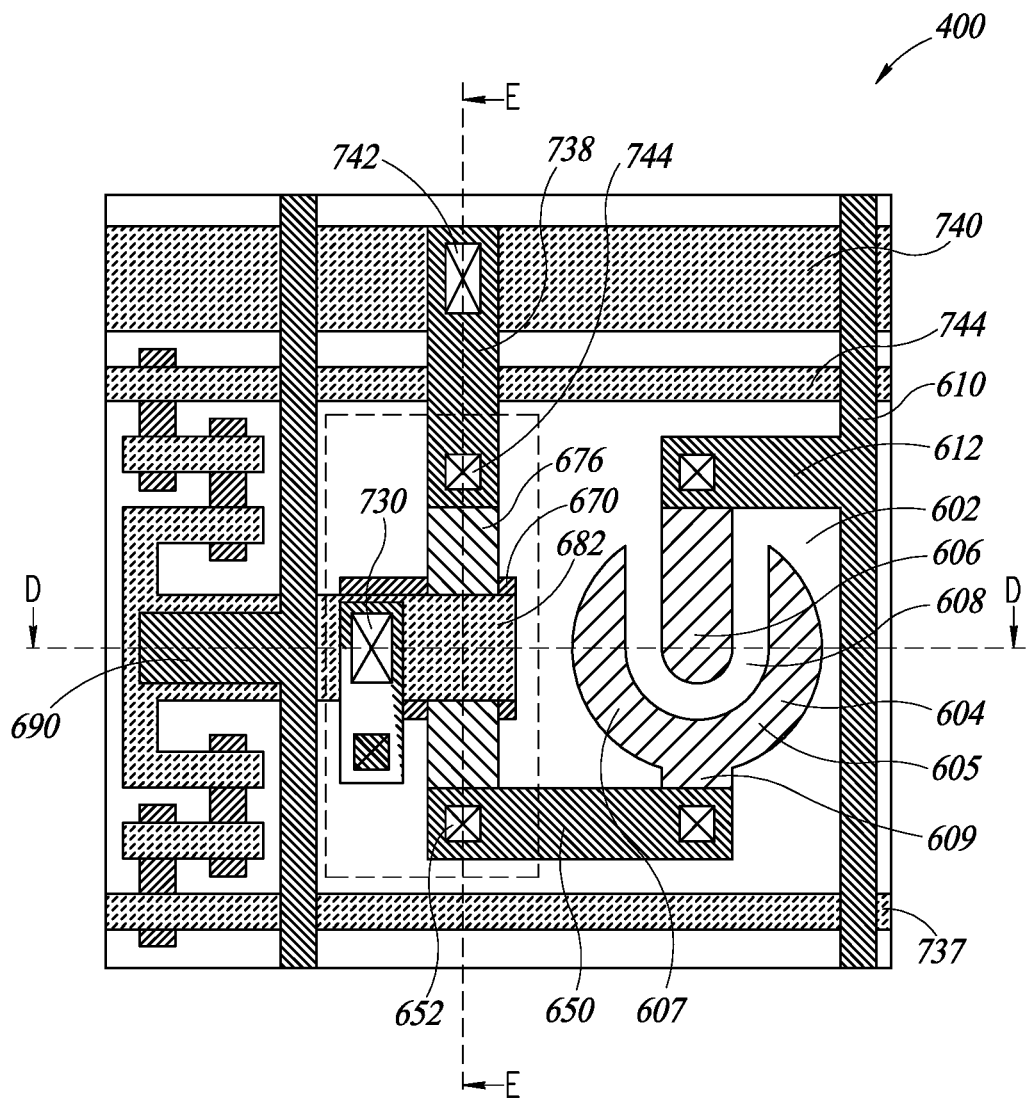
Figure 6D:
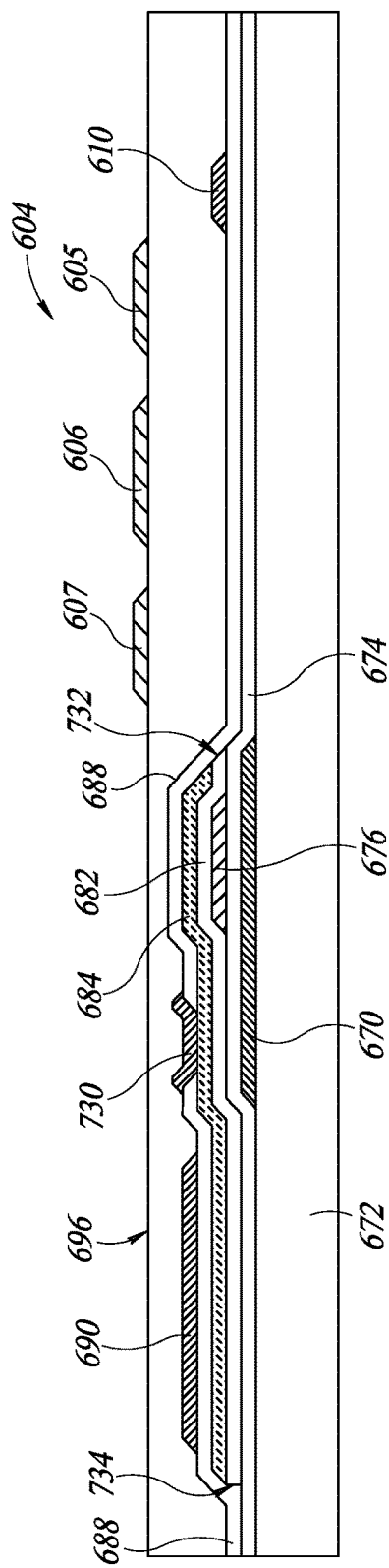
Figure 6E:
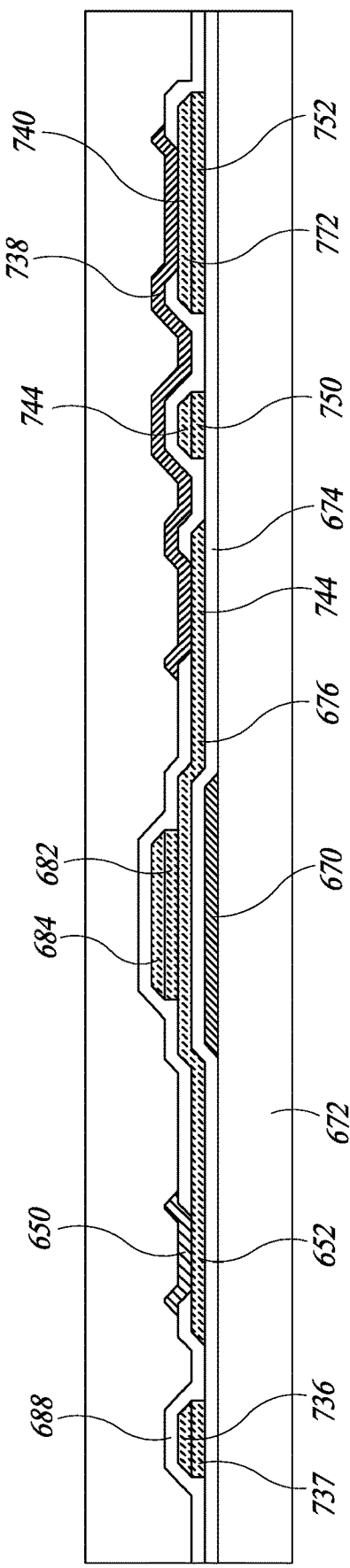

FIGS. 6C-6E are an alternative embodiment of the layout 400 that includes the component 602 and a cross-sectional views through line M-N and O-P. The layout 400 is very similar to the layout of FIG. 6A. As such duplicative elements will not be described in detail. A contact 730 is formed at the same time as the electrode 690, which is coupled to the data line. The contact 730 is formed in an opening of the third layer 688, coupling to the electrode 684. This is an alternative configuration of the AMTFT that is a dual gate, self-aligned TFT, i.e., the top gate electrode 648 and the top gate insulator 682 are patterned simultaneously and can result in a TFT with better performance.

In this embodiment, the second insulator 682 only remains in the location of the AMTFT and does not extend past a first edge 732 and a second edge 734. The top gate electrode 684 is formed at the same time as select line 736. A portion 737 of the insulator 682 remains between the select line 736 and the insulator 674. Interconnect 652 couples to the semiconductor layer 676 at contact 652, which corresponds to an opening in the dielectric layer 688. An interconnect 738 extends along cross-section O-P. This interconnect 738 couples to the semiconductor layer 676 at a contact 744 and couples to a signal line 740 at a contact 772. A signal line 744 extends below and transverse to the interconnect 738. The signal line 744 and the contact 772 are formed at the same time as the electrode 684 and thus have a self-aligned dielectric layer 750, 752 that separates them from the dielectric layer 674.

As compared to the TFT structure of FIGS. 6A and 6B, the TFT in FIGS. 6C-E includes less of the second insulator. This will reduce parasitic capacitance and can improve device performance.

Figure 20A:
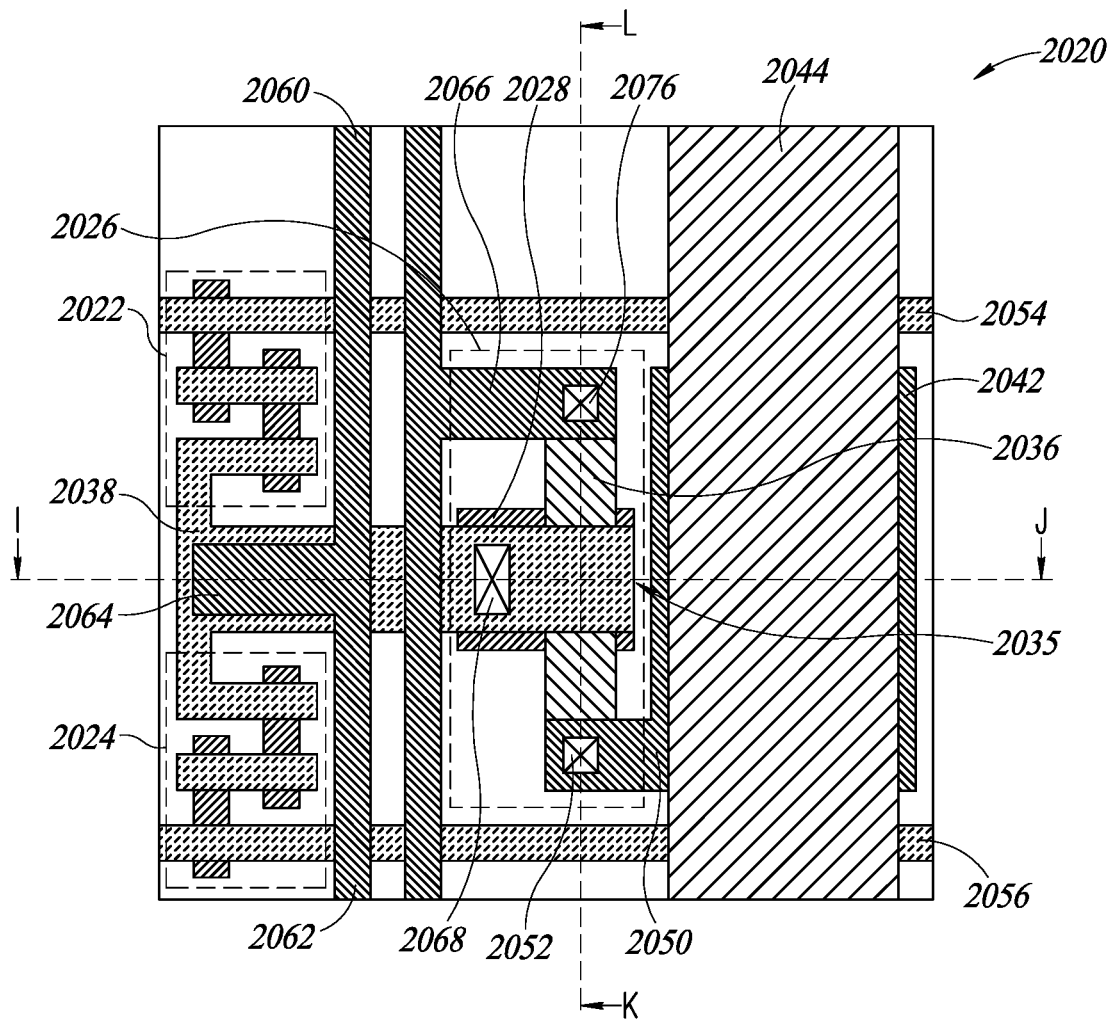

FIGS. 20A-20C are top and cross-sectional views (through I-J and K-L) of an embodiment of FIG. 2 that includes a pixel visual element 2020 coupled to a first AMNR 2022, a second AMNR 2024, and an AMTFT 2026. The AMTFT 2026 includes a first amorphous metal or amorphous metal alloy electrode 2028 on a substrate 2030. First and second dielectric layers 2032, 2034 are formed on the electrode 2028. The AMTFT 2026 includes a semiconductor layer, i.e., an electrode 2036 that is between the first dielectric 2032 and the second dielectric layer 2034. The electrode 2036 overlaps a portion of the electrode 2028.

Another electrode 2038 overlaps the electrodes 2036 and 2028. The electrode 2038 extends from an edge that aligns with an edge 2035 of the electrode 2028 to a location between and coupled to the first and second AMNRs 2022, 2024. A third dielectric layer 2040 is on top of the electrode 2038.

The pixel element 2020 is on the third dielectric layer 2040 and includes a first electrode 2042 and a second electrode 2044. The first electrode 2042 is formed directly on the third dielectric layer 2040 in some embodiments. A fourth dielectric layer or passivation layer 2046 is formed on the first electrode 2042 and separates the second electrode 2044 from the first electrode. These vertically stacked electrodes are coupled to the AMTFT 2026 by a connection arm 2050 and a via 2052. This connection arm 2050 is an extension of the electrode 2042 that is electrically conductive and formed at the same time as the first electrode 2042.

The AMTFT is positioned between a first select line 2054 and a second select line 2056. A data line 2060 extends transverse to the cross-sectional line I-J and includes an electrode 2064 that forms a capacitor with a portion of the electrode 2038. An area of the electrode 2064 is less than an area of the electrode 2038 in some embodiments. A power line 2062 runs substantially parallel to the data line 2060, in a direction transverse to the cross-section line I-J. The first and second select lines are transverse to the data line and power line. In this embodiment, there are no electrical elements for features between the data line 2060 and the power line 2062. Said differently, the data line 2060 and the power line 2062 are both positioned between the AMTFT 2026 and the first and second AMNRs 2022 and 2024.

The power line 2062 includes an extension or arm 2066 that couples to the electrode 2036. The electrode 2036 couples to the electrode 2028 with a via 2068. While the electrode 2038 is formed, the first and second select lines 2054, 2056 are formed on the second dielectric layer 2034. Openings are formed in the second dielectric layer 2034 as locations to couple to the semiconductor electrode 2036. A first contact electrode 2070 and a second contact electrode 2072 are formed at the same time, with the same deposition, patterning, and etching steps as the electrode 2038. The first and second contact electrodes are between the third dielectric layer and the second dielectric layer. Openings in the third dielectric layer are formed and the arms or extensions 2050 and 2066 are coupled to the first and second contact electrodes through vias 2052 and 2076. The second electrode 2044 extends substantially parallel to the data and power lines 2060, 2063. The second electrode 2044 extends past the first and second select lines.

The first contact electrode 2070 is coupled to the semiconductor electrode 2036 through an opening in the second dielectric layer 2034. The bottom electrode 2042 of the pixel element 2020 is coupled to the semiconductor electrode 2036 by the extension 2050 and the via 2052. In this embodiment, the via 2052 includes a layer of conductive material that is on the third dielectric layer 2040, in contact with the first contact electrode 2070. The conductive material of the via 2052 has a first dimension in a first direction that corresponds to the left-right view of the cross-section in FIG. 20. The first contact electrode 2070 has a second dimension in the first direction. The second dimension being less than the first dimension. A similar arrangement exists with the second contact electrode 2072 and the via 2076.

Figure 8:
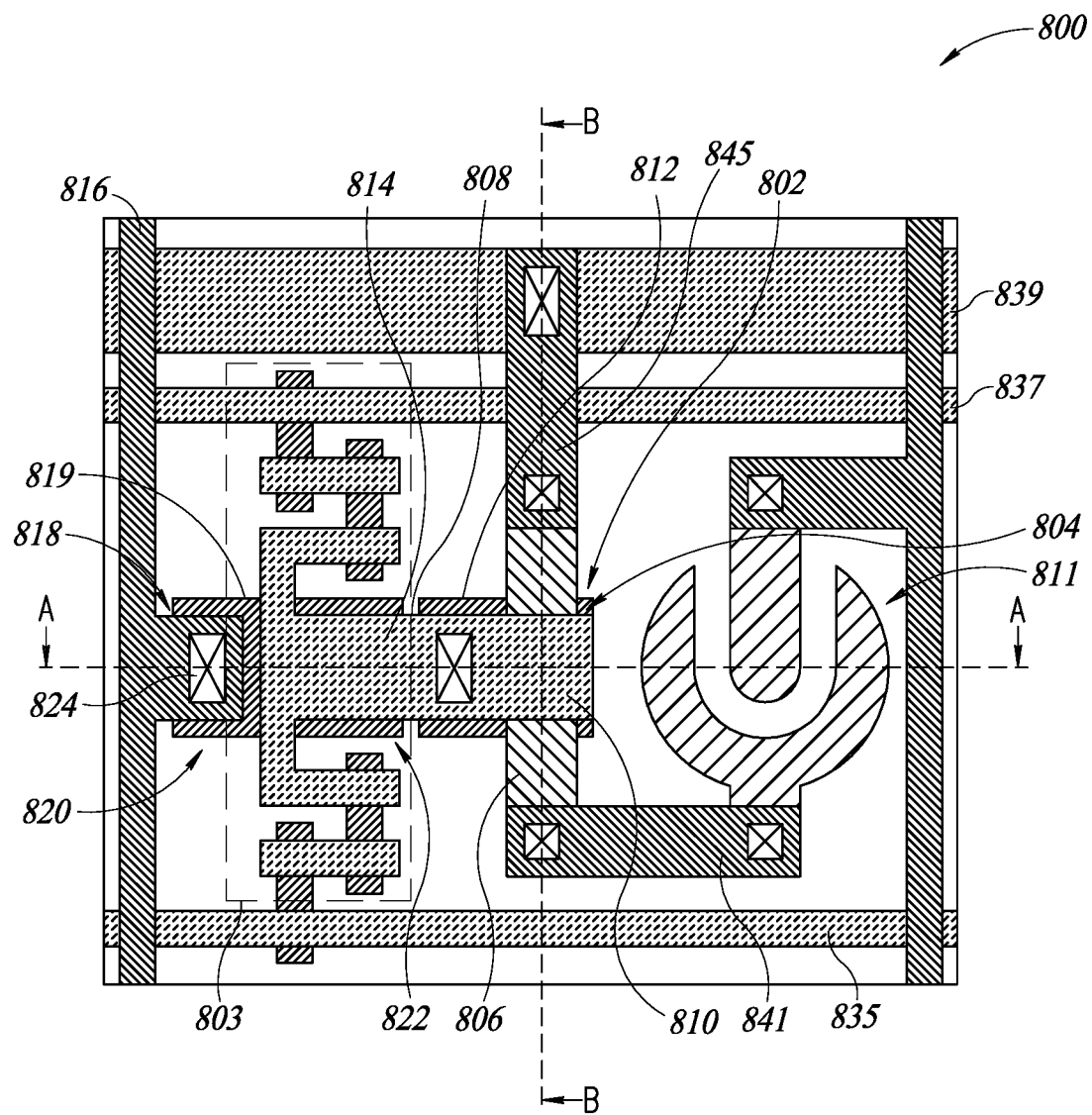
FIGS. 8, 9A, and 9B are a top and cross-sectional views of a third layout of the circuit of FIG. 2 according to an embodiment of the present disclosure through cross-sectional lines A-B and C-D.
Figure 9A:
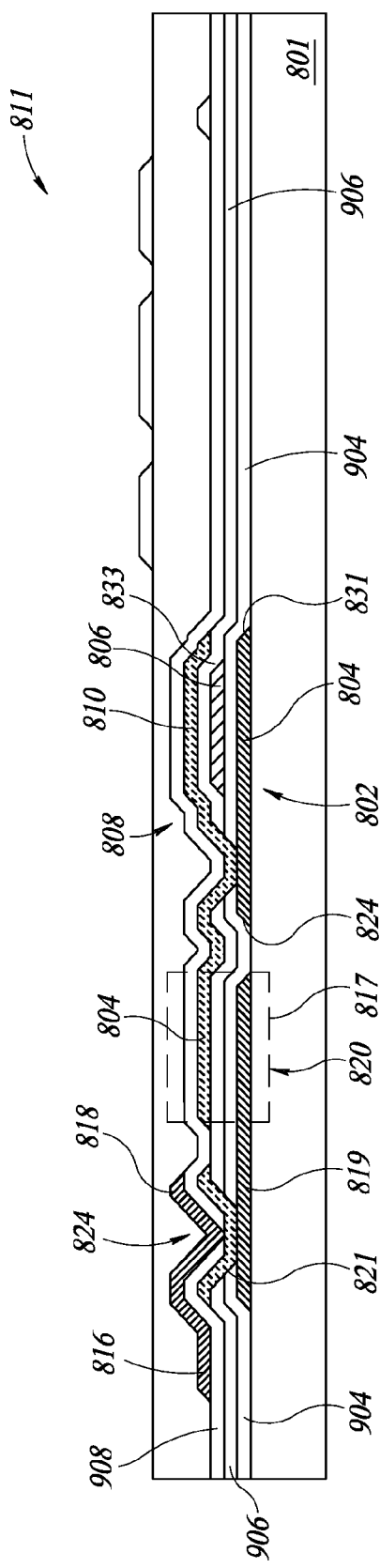
Figure 9B:
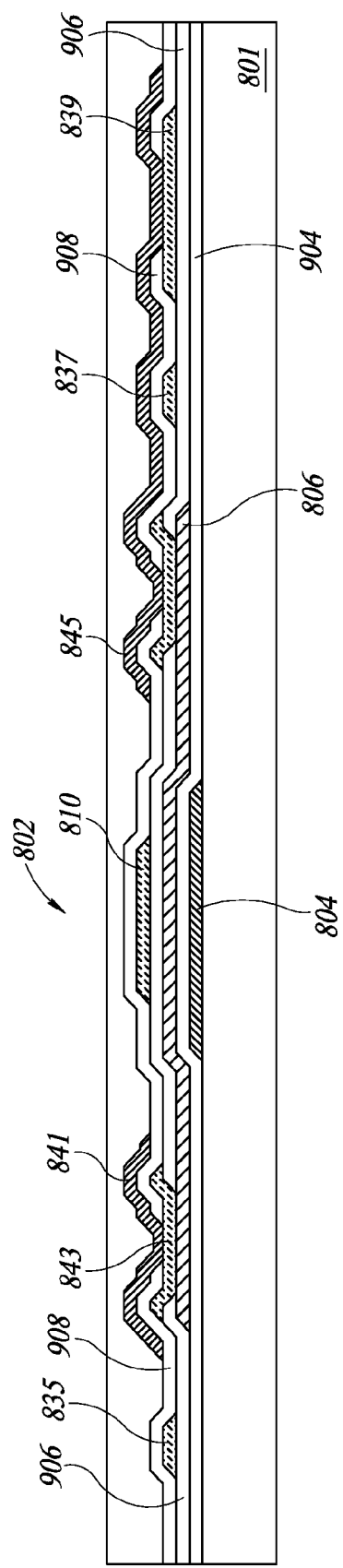

FIG. 8 is a layout 800 of a circuit according to one or more embodiments. FIGS. 9A and 9B are cross-sectional views of the layout 800, through lines A-A and B-B, respectively. Several regions and features of the layout 800 are substantially similar to those described with respect to the layout 400 and elsewhere, so further description of such features may be omitted. The layout 800 includes an AMTFT 802 that is between a pixel region 811 and a non-linear device region 803. The non-linear device region 803 is between the AMTFT and a data line 816. The data line 816 includes an extension or tab 818 that overlaps and is coupled to an intermediate electrode 821 that is coupled to an electrode 819 that is formed on a substrate 801. The electrode 819 extends from the data line 816 to a capacitor region 817 of the non-linear device region 803. The electrode 819 is a first plate 814 of the capacitor region 817 and a second plate is part of a first electrode region 808. The first electrode region 808 extends from a configuration of non-linear devices 803 to the AMTFT 802.

The AMTFT 802 has a first gate electrode 804 on the substrate 801. That gate portion 804 is in an overlapping arrangement with a channel conductor region 806 and a second gate electrode 810. The channel conductor region 806 is between the first gate electrode 804 and the second gate electrode 810. The first gate electrode 810 is part of the first electrode region 808.

The first electrode region 808 in which the second gate electrode 810 is located extends along the first direction of the layout 800 (e.g., horizontal direction in FIG. 8). In some embodiments, the first gate electrode 812 and the electrode 819 may be formed of amorphous metal. The data line 816 extends in a second direction (e.g., vertical direction shown in FIG. 8) of the layout 800 transverse to the first direction.

A via 824 electrically interconnects the electrode 819 and the data line 816. The via 824 extends between the tab 818 of the data line 816 and the electrode 819. In some embodiments, the data line 816 may not include the tab 818, where the data line 816 may instead extend over the electrode 819 and have the via 824 formed in the data line 816.

The layout 800 facilitates capacitive coupling of a data signal in the data line 816 to the first gate electrode 804 of the AMTFT 802 to control conduction by the AMTFT 802 and without a switching transistor coupled to the gate portion 804. As described above, first and second non-linear devices that include amorphous metal are coupled to the first electrode region 808 to facilitate storage and discharge of energy in the storage capacitor. The electrode 819 and 804 may be formed at the same time, with the same metal alloy that includes amorphous metal.

A first insulator layer 904 is formed over the substrate 902 and covers the first gate electrode 804 and the electrode 819. The channel conductor region 806 is formed on the first insulator layer 904. A second insulator layer 906 is formed over the first insulator layer 904 and covers the channel conductor region 806.

The intermediate electrode 821 is formed through an opening in the first and second insulator layers 904, 906. The intermediate electrode 821 may be formed as a same conductive or metal layer as the first electrode region 808, which is formed on the second insulator layer 906 and overlaps the first gate electrode 804, a portion of the second gate electrode 819, and the channel conductor region 806. The first electrode region 808 ends at a location that is between ends of the electrode 819. The first electrode region 808 extends from a first end 829 to a second end 831 of the electrode 804. The first electrode region 808 is coupled to a surface (top surface in FIG. 8) closer to the first end 829 than the second end. The first electrode region 808 extends past and outermost end 833 of the channel conductor 806.

A third insulator layer 908 is formed over the second insulator layer 906 and covers the first electrode region 808. The via 824 is formed in and extends through the third insulator layer 908, the second insulator layer 906, and the first insulator layer 904 to the electrode 819. The data line 816 and the tab 818 (if included) are formed on the third insulator layer 908 and at least partially overlapping the electrode 819 at the via 824 to electrically interconnect the data line 816 and the electrode 819.

In FIGS. 8 and 9B, a plurality of electrical communication lines 835, 837, and 839 extend in the first direction. The pixel element 811 is coupled to the AMTFT through a conductive layer 841. The conductive layer 841 is coupled to the channel conductor 806 either directly or through an intermediate layer 843. The other side of the channel conductor 806 is coupled to another conductive layer 845 that extends over electrical communication line 837 and is coupled to communication line 839.

Figure 10:
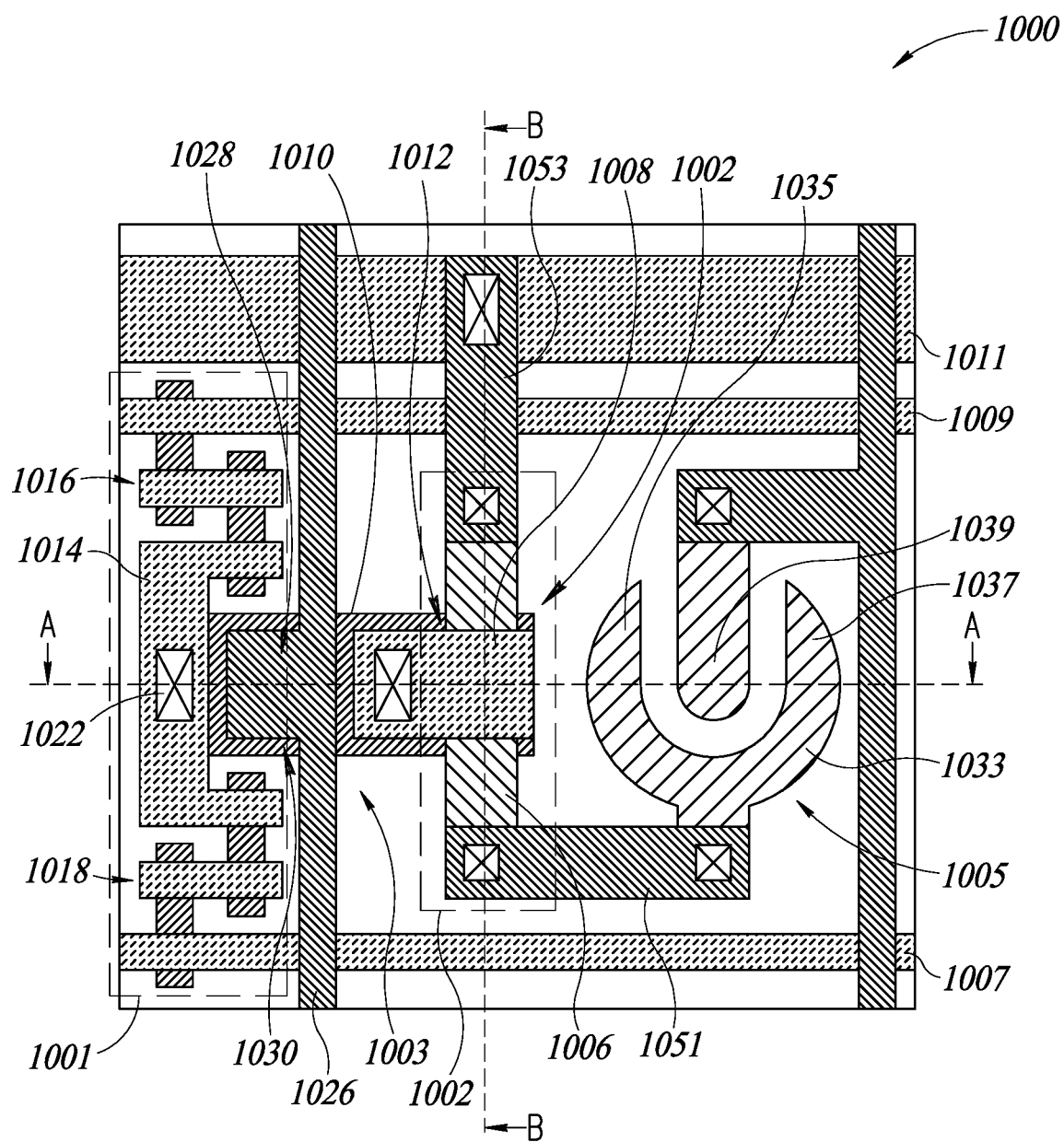

FIG. 10 and cross-sectional views in FIGS. 11A and 11B includes a circuit structure or layout 1000 that includes a plurality of non-linear devices 1001 adjacent to a capacitor 1003. The capacitor 1003 is between the plurality of non-linear devices and a thin film transistor 1002, such as an AMTFT, which includes at least one amorphous metal electrode. The circuit structure includes a pixel element, which can include another capacitor 1005. The transistor 1002 is positioned between the capacitor 1005 and the capacitor 1003.

The plurality of non-linear devices include a first non-linear device 1016 and a second non-linear device 1018. The first and second non-linear devices 1016 and 1018 are substantially similar to the non-linear devices 408 and 410 described with respect to FIG. 4. The conductor region 1014 is, in some embodiments, a region of crystalline metal.

The plurality of non-linear devices includes 4 nodes each on side of a conductor or electrode region 1014. Fewer or more nodes may be included in each of the non-linear devices as the end use dictates. The non-linear devices are coupled between a first electrical communication line 1007 and a second electrical communication line 1009. A third electrical communication line 1011 is spaced from the first electrical communication line 1011 by the second electrical communication line 1009. The first, second and third electrical communication line extend in a first direction.

The capacitor 1003 is coupled to a data line 1026 extending in a second direction that is transverse to the first direction. The data line 1026 includes a first plate electrode 1028 projecting from a side of the data line 1026. In one embodiment, a dimension in the first direction of the first plate electrode 1028 is greater than a dimension of the data line 1026 in the first direction. The data line 1026 and the first plate electrode 1028 are part of a continuous region of metal or other conductive material. The data line 1026 may extend into other circuits of an array of components (e.g., a pixel array) that have circuitry with the layout 1000 (or similar thereto).

The transistor 1002 includes a first electrode 1004 that is formed on a first surface 1013 of a substrate 1102. This first electrode is formed directly on this first surface 1013 as a smooth, thin, metal layer that is an amorphous metal alloy. The first electrode 1010 extends in a longest dimension along the first direction. A portion of the first electrode 1010 is part of the transistor 1002, that overlaps with a channel conductor region 1006. The channel conductor region 1006 extends in the second direction.

A second electrode 1008 overlaps the channel conductor region 1006, with a longest dimension in the first direction. The second electrode 1008 is a conductive or metal region. The second electrode 1008 may be formed of crystalline metal in some embodiments.

A via 1022 extends between and electrically connects the conductor region 1014 and the electrode 1010. As a result, an electrical signal (e.g., voltage, current) at the conductor region 1014 is provided to the electrode 1010.

The electrode 1010 has a portion defining a second plate electrode 1030 of a storage capacitor. In particular, the first plate electrode 1028 overlaps the second plate electrode 1030, which are spaced apart by a plurality of insulating layers having dielectric properties. The layout 1000 facilitates capacitive coupling of a data signal in the data line 1026 to the first electrode 1004 of the AMTFT 1002 to control conduction by the AMTFT 802 and without a switching transistor coupled to the first electrode 1004.

In such embodiments, the first plate electrode 1028 may be expanded along the first direction (e.g., horizontally) to increase the overlapping area between the first and second plate electrodes 1028 and 1030. The first and second plate electrodes 1028 and 1030 in such embodiments may be spaced farther apart in the layout 1000 due to the three insulation layers 1104, 1106, and 1108, which can reduce capacitance of the storage capacitor formed. For example, one or two of the insulation layers could be moved within the dashed region of FIG. 11A. In addition, increasing the overlapping areas of the first and second plate electrodes 1028 and 1030 in such embodiments may help to compensate for the distance between the capacitive plates while providing a simplified design.

In this embodiment, the storage capacitor electrode, the lower one, is formed of an amorphous metal film, with a surface roughness less than the other conductive layers in the device. This storage capacitor is directed connected to the AMTFT gate as they are both part of the electrode 1010. In addition, the shared node of the non-linear devices is coupled to the electrode 1010, i.e., directly to the storage capacitor and the AMTFT gate. The pixel elements may be in parallel to another storage capacitor that is also coupled to the AMTFT transistor, such as when using capacitive liquid crystal or electrophoretic visual elements. The drive transistor (AMTFT) signal effectively becomes the data line, while the line is connected to the first storage capacitor and instead serves as an AMTFT control voltage. Having the AMTFT control signal allows for an additional degree of freedom in determining whether a pixel visual element should be updated. For example, the first storage capacitor may serve as a capacitive touch or temperature sensor or be replaced by another type of sensor device.

FIG. 11A is a cross-sectional view taken along the lines A-A and FIG. 11B is taken along B-B in FIG. 10. The layout 1000 includes a substrate 1102. The electrode 1010 is a region of amorphous metal in at least some embodiments. A first insulator layer 1104 is formed over the substrate 1102 and covers the second electrode region 1010. The channel conductor region 1006 is formed on the first insulator layer 1104. A second insulator layer 1106 is formed over the first insulator layer 1104 and covers the channel conductor region 1006.

The first gate electrode 1008 is formed on the second insulator layer 1106 and overlaps the electrode 1010 and the channel conductor region 1006 at the AMTFT 1002. An opening is formed through the first and second insulator layer to provide access to the electrode 1010. The conductor region 1014 is also formed on the second insulator layer 1106. A third insulator layer 1108 is formed over the second insulator layer 1106 and covers the first gate electrode 1008 and the conductor region 1014.

The via or opening 1022 is formed in and extends through the third insulator layer 1108 to the conductor region 1014. The via 1024 is formed in and extends through the third insulator layer 1108, the second insulator layer 1106, and the first insulator layer 1104 to the second electrode region 1010.

The data line 1026, including the first plate electrode 1028, are formed on the third insulator layer 1108. The storage capacitor of the circuit is formed at an overlap of the first plate electrode 1028 on the electrode 1010.

The pixel includes a u-shaped or c-shaped electrode 1033 that includes a first extension or prong 1035 and a second extension or prong 1037, see FIGS. 10 and 11A. The pixel includes another electrode 1039 that is positioned between the first and second extensions. These electrodes of the pixels are formed on a planarized dielectric layer 1041. In FIG. 11B, the first electrical communication line 1007 is formed on the dielectric layer 1108. An optional first and second interconnect layer 1043, 1047 are formed at the same time as the first electrical communication line 1007.

The second electrode 1008 is formed at the same time as the first electrical communication line 1007, the second electrical communication line 1009, and the third electrical communication line 1011. The first and second interconnect layers 1043 are formed on and in openings through the second dielectric layer 1106. An interconnect or electrical connection 1051 couples from the first interconnect layer 1043 to the electrode 1033. Another interconnect or electrical connection 1053 extends from an end 1055 of the interconnect layer 1047 to an outermost end 1057 of the third electrical communication line 1011. The electrical connection 1053 is coupled to the channel conductor 1006 through the optional second interconnect layer 1047. The electrical connection 1053 is coupled to the third electrical communication line 1011 in an opening through the insulation layer 1108.

Figure 12:
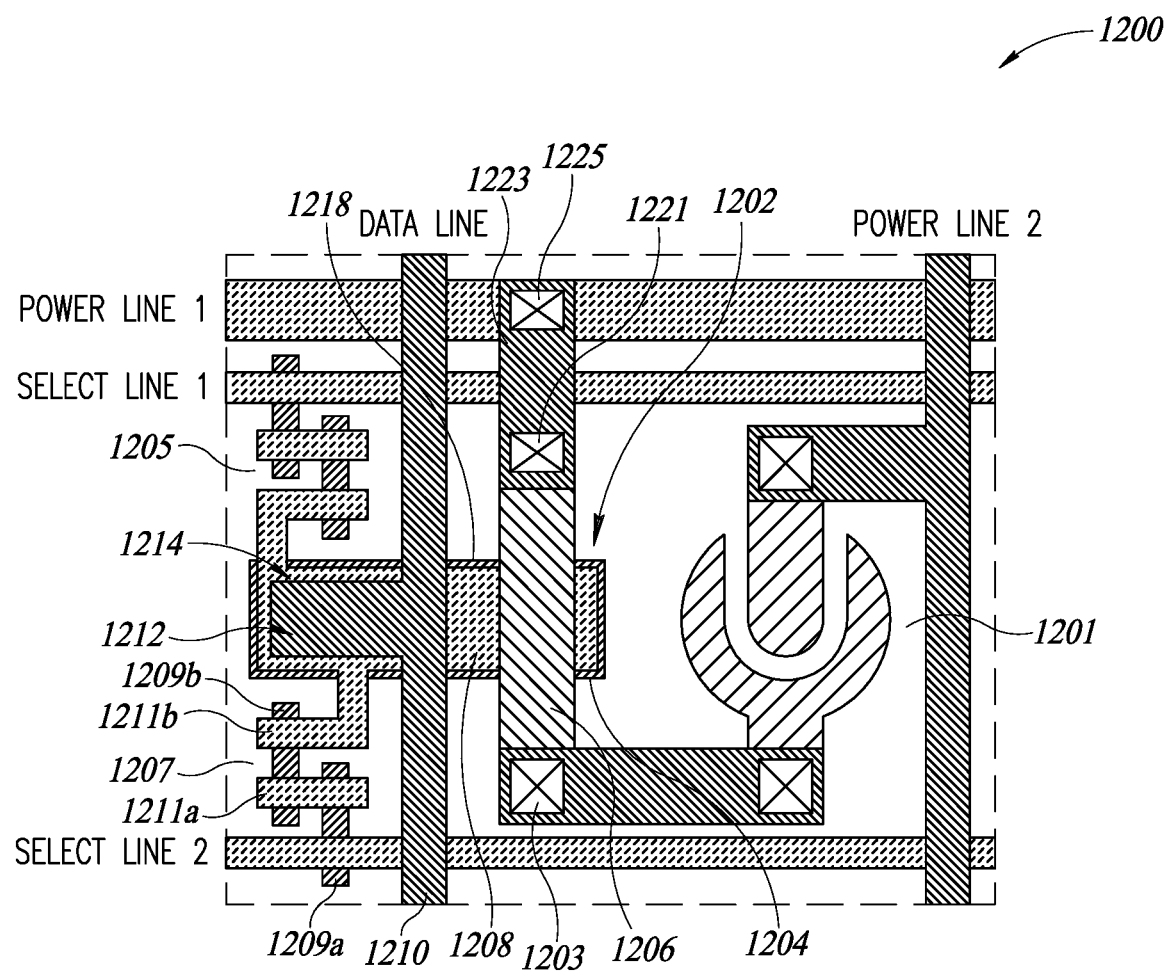
FIGS. 12 and 13A-13C are top and cross-sectional views of a fifth layout of the circuit of FIG. 2 according to an embodiment of the present disclosure.

FIG. 12 is a layout 1200 of a circuit having a—pixel element 1201 coupled to a transistor 1202 through a node 1203. The transistor, which may be an AMTFT 1202, having a first electrode 1204 on a substrate. This first electrode is preferably an amorphous metal alloy film with a smoothness greater than standard, currently used crystalline metal films.

The transistor 1202 is coupled to a group of non-linear devices 1205, 1207. First, lower layers 1209a, 1209b are amorphous metal alloy films formed at the same time as the first electrode 1204. A power line, a select line (1), and a select line (2), are formed at the same time as interconnects 1211a, 1211b. The interconnect 1211b is coupled to an electrode 1208. The electrode 1208 extends from the transistor 1202 to the non-linear devices.

The transistor 1202 includes a channel conductor region 1206 that is on top of the electrode 1208. The channel conductor region 1206 extends from the node 1203 to another node 1221. An interconnect 1223 extends over the select line 1 and is coupled to the power line through a node 1225.

The electrode region 1208 extends along a first direction (e.g., horizontal direction shown in FIG. 12). The channel conductor region 1206 overlaps an end portion of the electrode region 1208 to form the first electrode 1204 of the AMTFT 1202. The layout 1200 includes a data line 1210 extending in the second direction (e.g., vertical direction shown in FIG. 12) of the layout 1200 transverse to the first direction. The data line 1210 includes a first plate electrode 1212 projecting from a side of the data line 1210, toward the non-linear devices. The data line 1210 and the first plate electrode 1212 are part of a continuous region of metal, which is crystalline metal in at least some embodiments. The first plate electrode 1212 overlaps an area of the electrode region 1208 that defines a second plate electrode 1214 of a storage capacitor. As a result, an electrical signal provided on the data line 1210 may be capacitively coupled to the first electrode 1204 of the AMTFT 1202 without a switching transistor.

The layout 1200 may also include a lower electrode 1218 formed of amorphous metal. The lower electrode 1218 is formed to have a width in the second direction that is at least as wide as a width of the electrode region 1208. Formation of the lower electrode 1218 beneath the electrode region 1208 provides a smooth surface for forming the layers above.

Figure 13A:
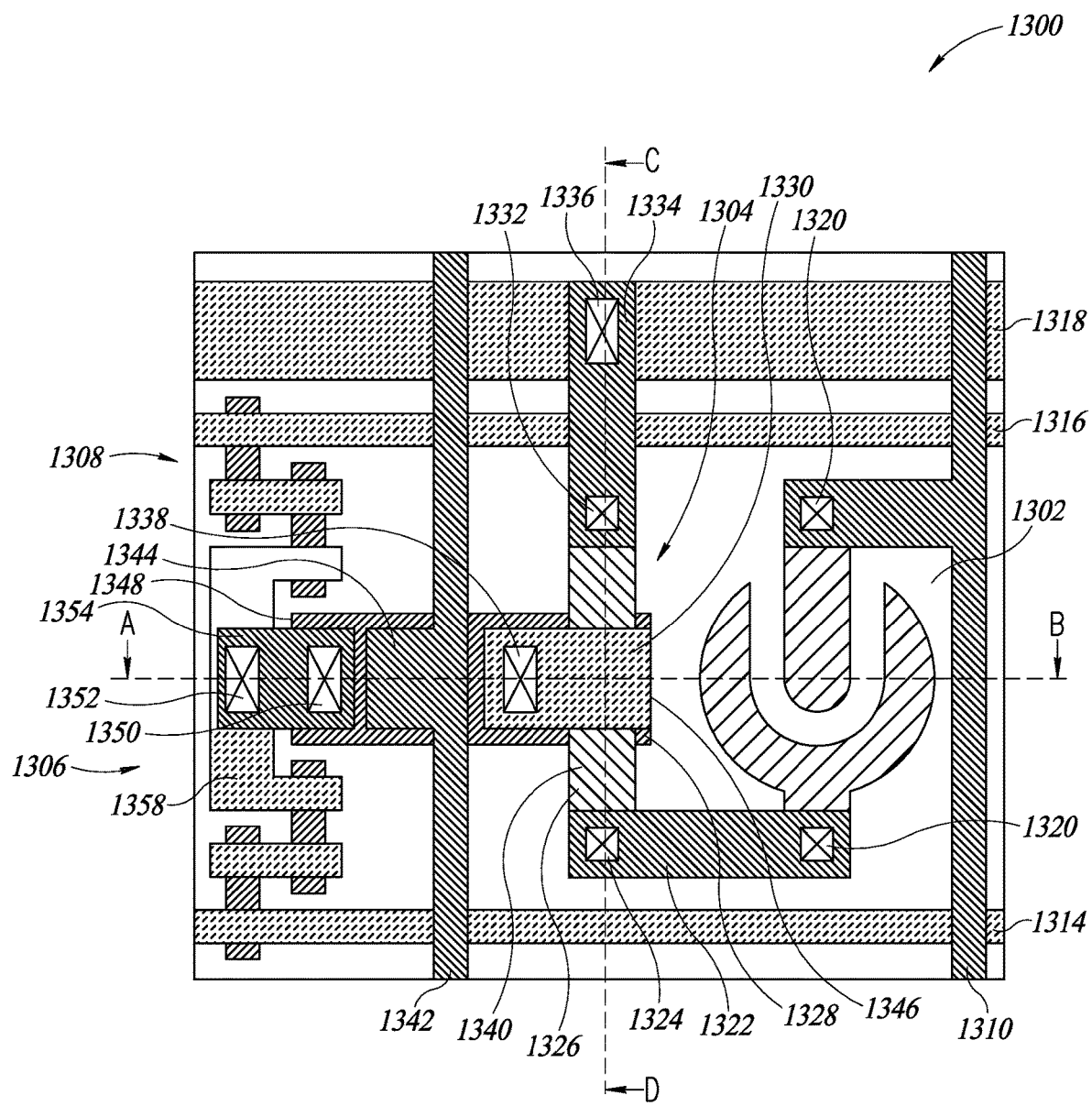
Figure 13B:
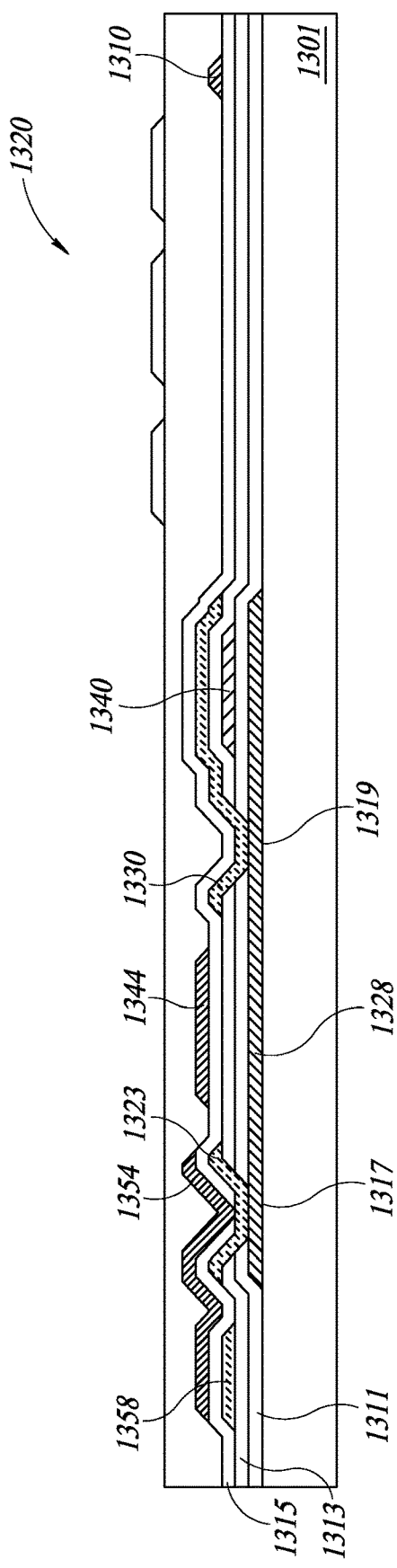
Figure 13C:
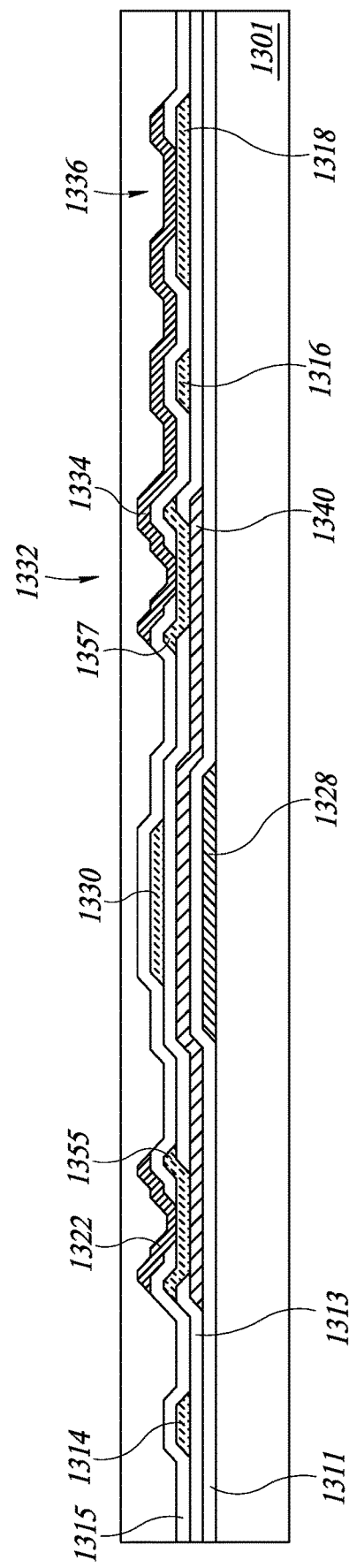

FIGS. 13A-13C are top and cross-sectional views taken along the lines A-B and C-D of a circuit that includes a pixel or sensor element 1302 that is coupled to a transistor 1304, which is coupled to a plurality of non-linear devices 1306, 1308. The pixel 1302 is coupled to data line 1310 by a node 1320. The data line 1310 overlaps a first, second, and third select line 1314, 1316, 1318. The pixel 1302 is coupled to the transistor 1304 through a node 1320 and an interconnect 1322. A node 1324 is coupled between the interconnect 1322 and a channel conductor 1326.

The channel conductor 1326 is between a first, lower electrode 1328 and a second, upper electrode 1330. The channel conductor 1326 is coupled to the third select line 1318 through a node 1332, an interconnect 1334, and another node 1336. The interconnect 1334 is formed at the same time as the interconnect 1322 and the data line 1310. The upper electrode 1330 is coupled to an external circuit through a node 1338. The node 1338 is spaced from an edge 1340 of the channel conductor 1326, which is a semiconductor layer. A voltage control line 1342 is spaced from the upper electrode 1330 and is between the upper electrode 1330 and the non-linear devices. The voltage control line includes an electrode 1344 that extends away from the channel conductor and the upper electrode 1330, toward the non-linear device.

The lower electrode 1328 extends from an edge 1346 to an opposite edge 1348. A sensor element is formed with the electrode 1344 and—the electrode 1328. A node 1350 couples the lower electrode 1328 to an interconnect 1354, that acts as a bridging conductive layer. Another node 1352 couples the interconnect 1354 to an interconnect 1358 coupled between the non-linear devices 1308, 1306.

The sensor element may be a photoresistor or photodiode. By modulating the external stimuli for the sensor, such as light intensity, a voltage at a center node of the voltage divider, Vp, can be modulated to control the transistor. The interconnect 1354 couples Vp to the transistor. The transistor is an amorphous thin-film transistor, which includes an amorphous metal layer as the electrode 1328. A plurality of dielectric layers 1311, 1313, and 1315 are formed in sequence. The electrode 1328 is formed on a substrate 1301, like a glass or flexible substrate. The dielectric layer 1311 is formed on the electrode 1328 and across the substrate.

The channel conductor 1340 is formed on the dielectric layer 1311. The dielectric layer 1313 is formed on the channel conductor and on the dielectric 1311. A first opening 1317 and a second opening 1319 are formed through the dielectric layers 1311 and 1313. The interconnect 1358 and the electrode 1330 are formed at the same time. An optional interconnect 1323 is formed in the opening 1317 and is coupled to the electrode 1328. The dielectric layer 1315 is on the interconnect 1358, the electrode 1330, and the interconnect 1323. An opening is through the dielectric 1315, into which the interconnect 1354 is coupled to the interconnect 1323.

In FIG. 13C, optional interconnects 1355 and 1357 are positioned between the channel conductor 1340 and the top metal or conductive layers, forming interconnect 1322 and interconnect 1334.

Figure 14:
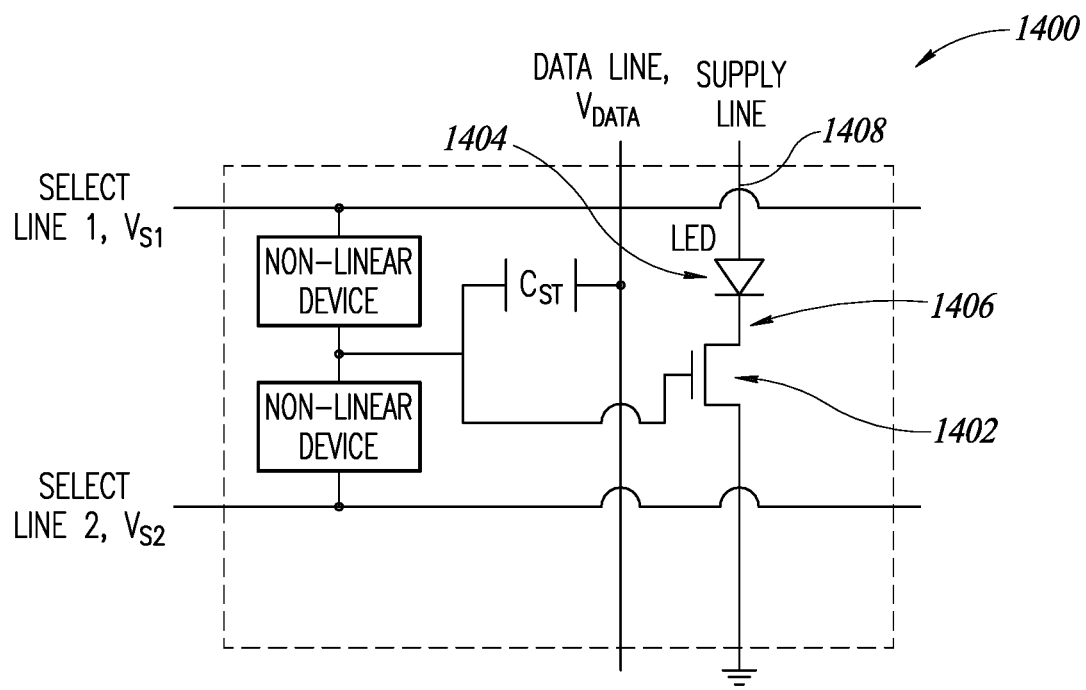
FIGS. 14-18 are schematic diagrams of alternative embodiments of the circuit of FIG. 2.

FIG. 14 shows a schematic diagram of a circuit 1400 that includes non-linear devices according to one or more embodiments. The circuit 1400 includes a driving transistor 1402 (e.g., an AMTFT, an AMHET, or TFT) that controls operation of an LED 1404 based on an electric signal applied to the driving transistor 1402. In the circuit 1400, the LED 1404 is coupled between a first terminal 1406 of the driving transistor 1402 and a power supply line 1408. In particular, an anode of the LED 1404 is coupled to the power supply line 1408 and a cathode of the LED 1404 is coupled to the first terminal 1406. The circuit 1400 is similar in structure to the circuit 300, but in the circuit 1404 the component to be operated (e.g., the LED 1404) is coupled to an upstream side of the driving transistor 1402 (e.g., side on a drain terminal, side on a collector terminal) rather than a downstream side of the driving transistor 210 (e.g., side on the source terminal, side on the emitter terminal), as shown in FIG. 2.

Figure 15:
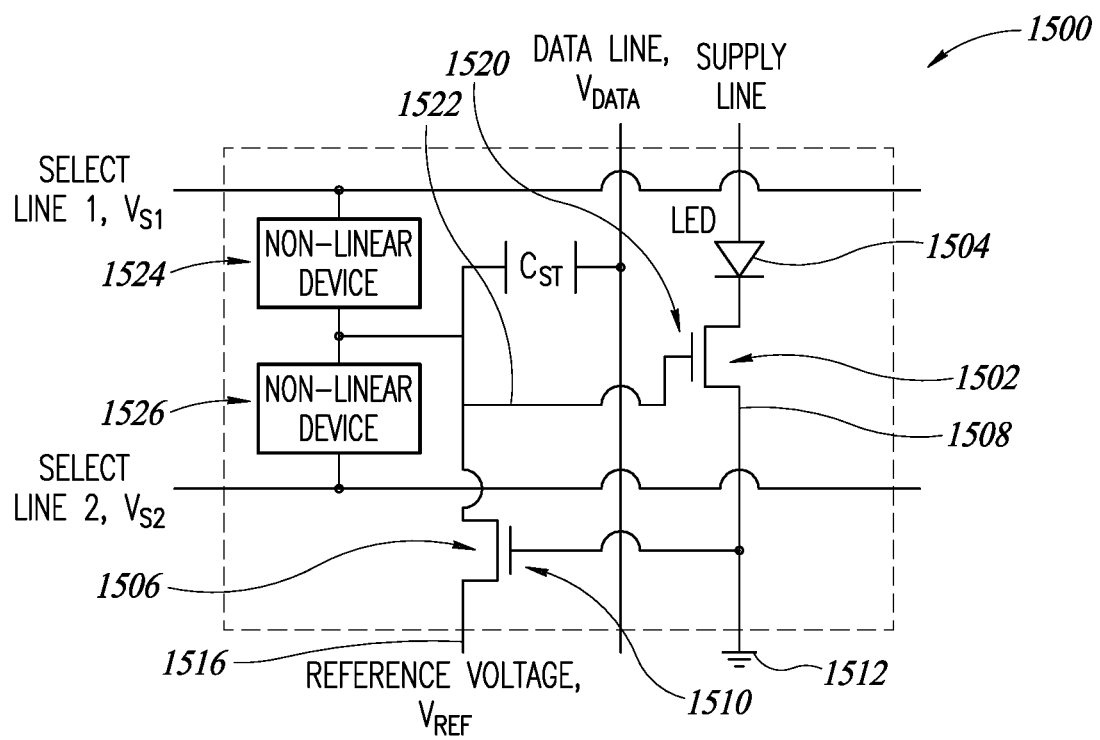

FIG. 15 shows a schematic diagram of a circuit 1500 that includes non-linear devices according to one or more embodiments. The circuit 1500 includes a driving transistor 1502 for controlling operation of an LED 1504 or other such device. The circuit 1500 is similar in structure and operation to the circuit 300 or the circuit 1400 in several respects, but the circuit 1500 includes a compensation transistor 1506 that compensates for drift in performance of the driving transistor 1502. In particular, performance parameters of the driving transistor 1502 may drift or change over time due to aging—for example, a threshold (e.g., gate-to-source threshold voltage) of the driving transistor 1502 may change over time.

In the circuit 1500, a second terminal 1508 of the driving transistor 1502 (e.g., source terminal, emitter terminal) is coupled to a third terminal 1510 (e.g., gate terminal, base terminal) of the compensation transistor 1506 to offset a shift in the threshold voltage of the driving transistor 1502. The gate terminal 1510 and the second terminal 1508 are coupled to a downstream side or ground 1512 of the circuit 1500. A first terminal 1514 of the compensation transistor 1506 is coupled to a reference voltage line 1516 and a second terminal 1518 of the compensation transistor 1506 is coupled to a third terminal 1520 of the driving transistor 1502. The reference voltage line 1516 is a region of metal that extends in the first direction or the second direction of the layouts. As shown in FIG. 15, the third terminal 1520 is coupled to or is part of a node 1522 between first and second non-linear devices 1524 and 1526. As a result of the structure described in FIG. 15, the threshold of the driving transistor 1502 affects a conduction mode of the compensation transistor 1506, which may couple the reference voltage to the node 1522 to compensate for drift in the threshold of the driving transistor 1502. The compensation transistor 1506 is a semiconductor device that may be formed using amorphous metal.

Figure 16:
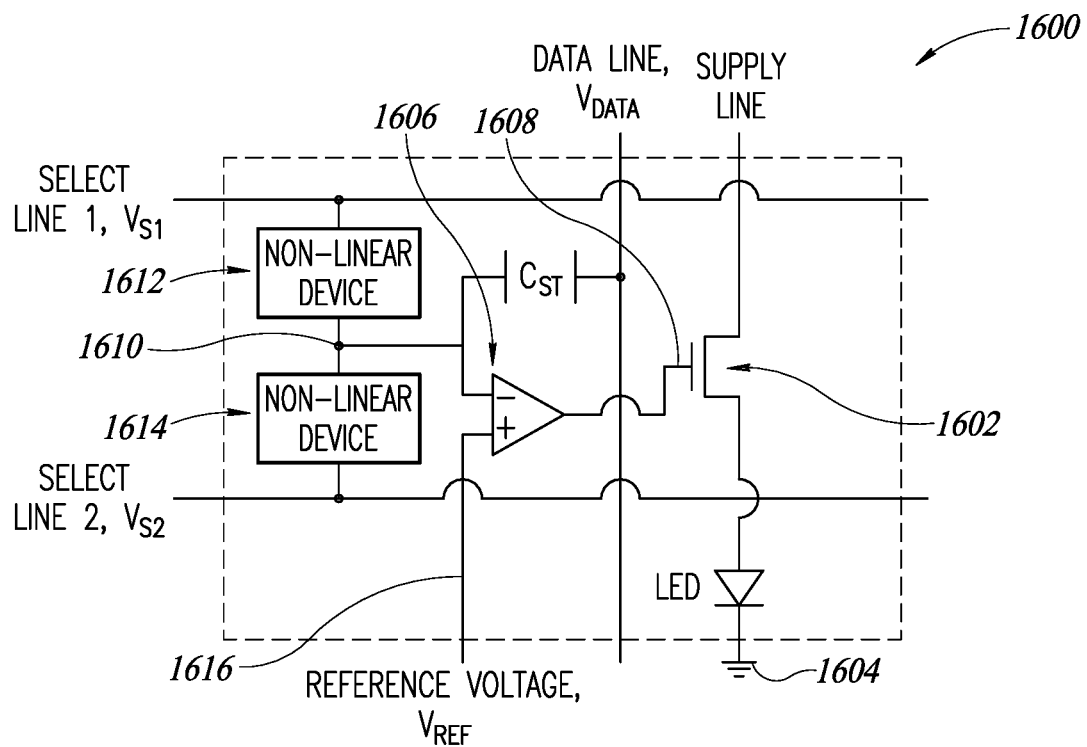

FIG. 16 shows a schematic diagram of a circuit 1600 that includes non-linear devices. The circuit 1600 includes a driving transistor 1602 for controlling operation of an LED 1604 or other such device. The circuit 1600 is substantially similar in structure and operation to the circuit 300 in several respects, but includes a comparator 1606 having an output coupled to a third terminal 1608 (e.g., gate terminal, base terminal) of the driving transistor 1602. A first input terminal of the comparator 1606 is coupled to a node 1610 between first and second non-linear devices 1612, 1614. A second input terminal of the comparator 1606 is coupled to a reference voltage line 1616. In some embodiments, the comparator 1606 may include a plurality of thin-film transistors (e.g., TFTs, HETs) and non-linear resistor devices (e.g., AMNRs, amorphous metal schottky diodes, or other non-linear non-amorphous metal resistors devices). In some embodiments, the comparator 1606 may include regions formed of amorphous metals. In some embodiments, comparator 1606 may be included in non-thin-film transistors, such as complementary metal oxide semiconductor (CMOS) transistor devices, that are pre-fabricated on a silicon substrate and not included as a thin-film device in the circuit 1600.

Figure 17:
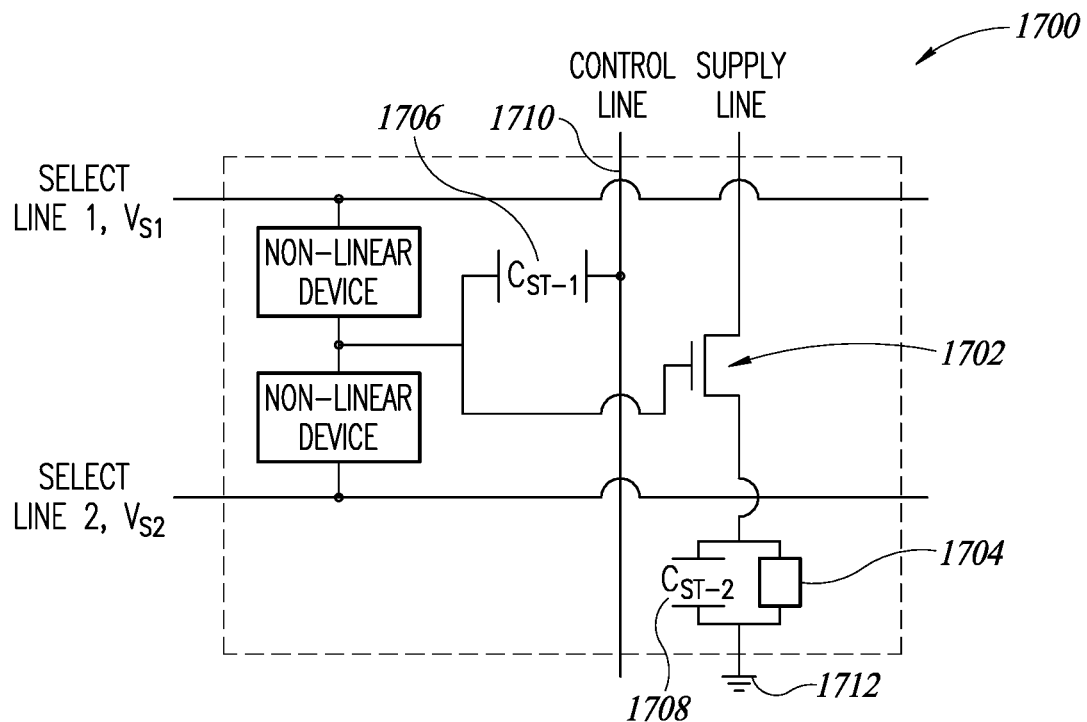

FIG. 17 shows a schematic diagram of a circuit 1700 that includes non-linear devices. The circuit 1700 includes a transistor 1702 (e.g., AMTFT, AMHET) for controlling operation of a component 1704 and includes a first storage capacitor 1706. The circuit 1700 is substantially similar in structure and operation to the circuits 200 or 300 in several respects, but includes a second storage capacitor 1708 coupled in parallel with the component 1704. In some situations—for instance, when using capacitive liquid crystal or electrophoretic visual elements—it may be desirable to use a visual element (e.g., pixel element) or sensor element coupled in parallel with the second storage capacitor 1708. In the circuit 1700, an electrical signal provided by the transistor 1702 effectively becomes a data signal (e.g., Vdata) and a control line 1710 coupled to the first storage capacitor 1706 provides a signal for controlling conduction of the transistor 1702. The component 1704 and the second storage capacitor 1708 are coupled between the transistor 1702 and a ground 1712 of the circuit 1700. The data signal provided by the transistor 1702 charges the second storage capacitor 1708 and may cause a response in the component 1704. After the transistor 1702 discontinues conduction, the second storage capacitor 1708 is discharged to the component 1704, which may be sufficient to operate or prolong operation of the component 1704 subsequent to the conduction period of the transistor 1702. In some embodiments, a non-linear device may be coupled in series with the second storage capacitor 1708 to adjust a time constant for the component 1704.

Figure 18:
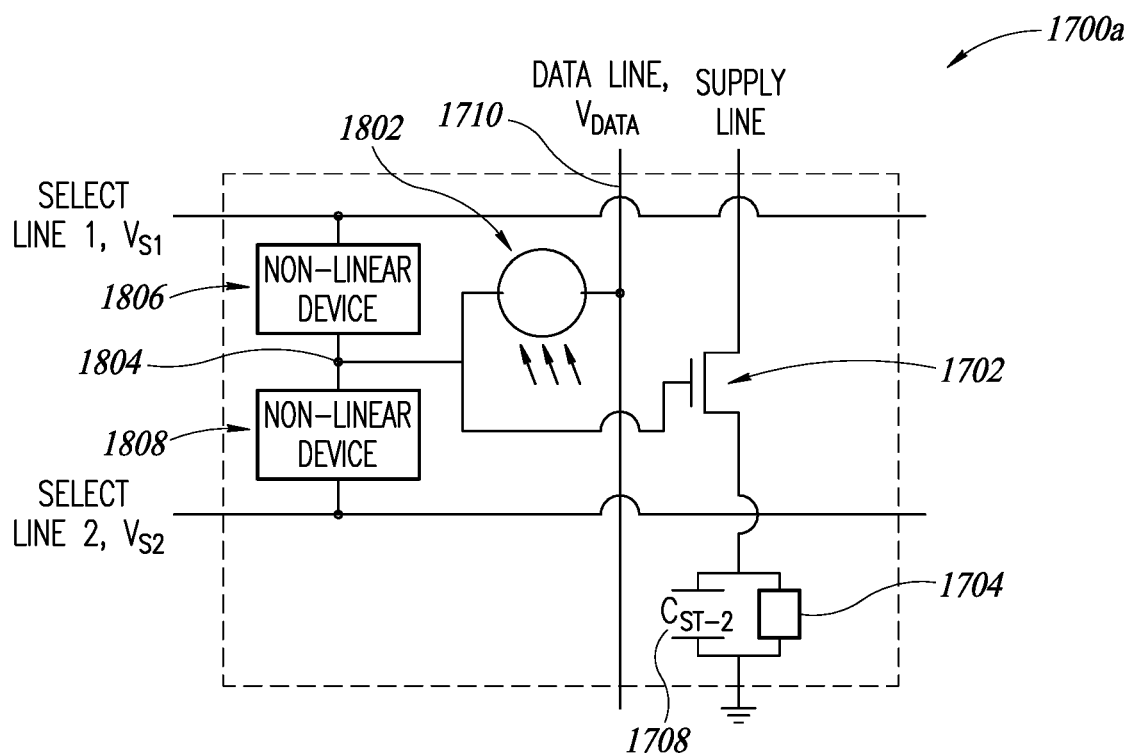

In the circuit 1700, the first storage capacitor 1706 provides an additional degree of control of the component 1704. As an example, the first storage capacitor 1706 may be included in a sensor element. FIG. 18 is a schematic diagram showing a specific, although non-limiting, example circuit 1700a of the circuit 1700. The circuit 1700a includes a sensor 1802 having a capacitance that varies based on a characteristic of an external stimulus. For instance, the sensor 1802 may be a capacitive touch sensor, a light sensor, a pressure sensor, or a temperature sensor, by way of non-restrictive example. A terminal of the sensor 1802 is coupled to a node 1804 between first and second non-linear devices 1806 and 1808, as with respect to FIG. 2 and elsewhere herein. The voltage at the node 1804 is modulated based on the external stimulus detected by the sensor 1802 and the control signal received on the control line 1710. In the circuits 1700 and 1700a, the second storage capacitor 1708 may be incorporated into layouts described herein. The sensor 1802 may include one or more layers that are co-planar with one or more metal, insulator, or semiconductor layers described herein. In some embodiments, the sensor 1802 may include one or more layers vertically stacked on a layout described herein. For instance, the sensor 1802 may be formed, at least in part, over the planarization layer 510 and may overlap one or more other layers described with respect to FIGS. 5A5C or elsewhere herein.

The circuits and layouts described herein may be provided in an array of circuits arranged in one or more directions. For example, a visual display a sensor array—in which the circuits and layouts described herein are arranged as a two-dimensional array. each circuit element in the circuit array has a control circuit area and an active element area. The active element area may include a capacitive pixel element, an active pixel element (e.g., LED), a resistive pixel element, or another type of pixel element. Alternatively, the control circuit area and the active element area may be non-overlapping with the active element area formed or mounted adjacent to the control area.

The array may be assembled or built on a backplane substrate, which may be glass, plastic, or other transparent or non-transparent materials. A plurality of data lines may run vertically across the array. The data lines can be used to write/read to each circuit. Pairs of select lines run horizontally across rows of multiple circuits. The intersection of the data lines and the select lines may be in the control area.

Figure 19:
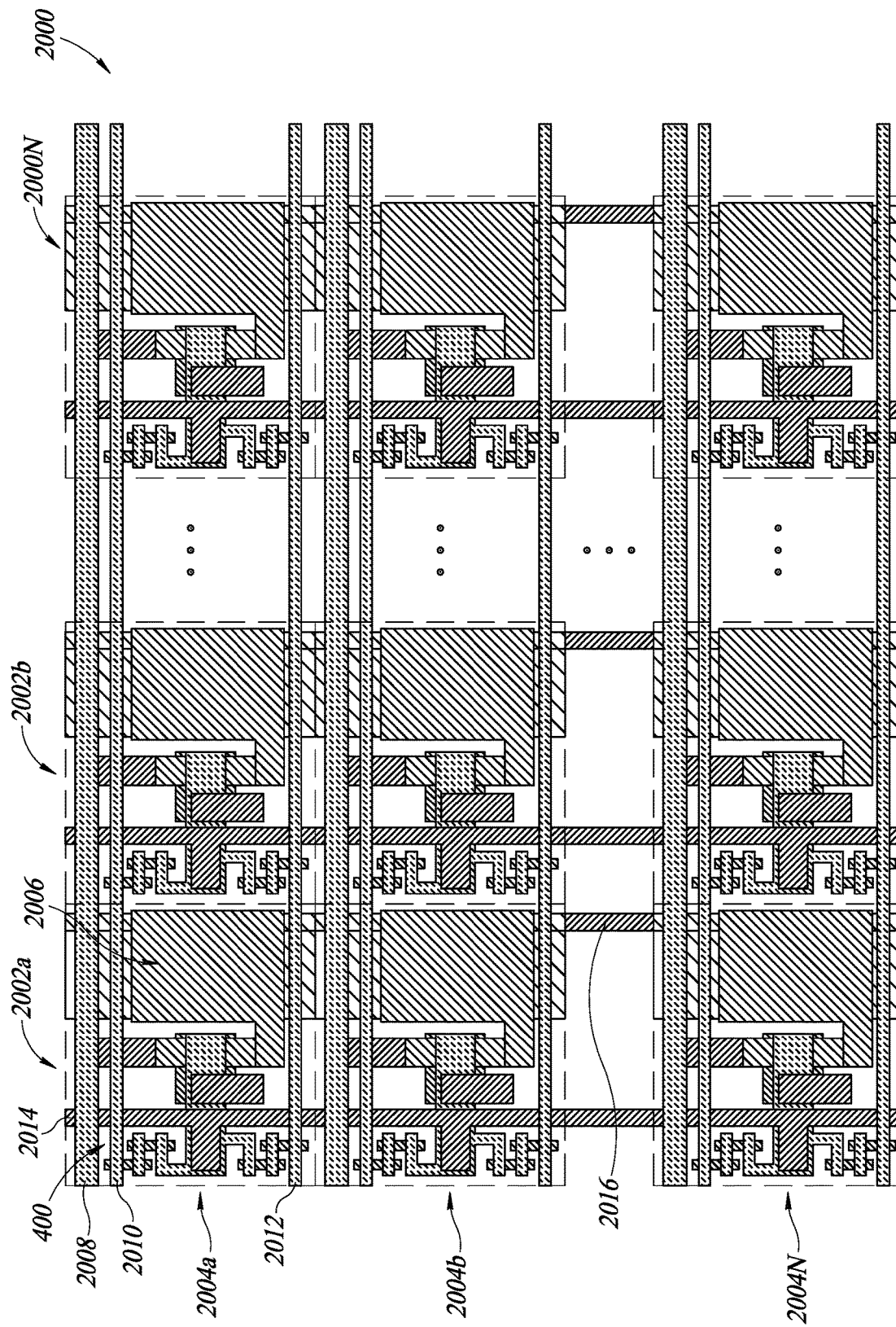
FIG. 19 is a top view of a layout of an electronic device including an array of the circuits of FIG. 4.

Select lines may be used to select a row of for writing/reading using data lines. The use of first and second select lines S1 and S2 in the embodiment of the control circuit 200 and others herein may be termed dual-select diode control. A common electrode is a global common node coupled to each circuit and may correspond to a power or signal ground of a group of circuits in the array. FIG. 19 shows a layout of a circuit array 2000 including an array of the circuits 400 arranged in a two-dimensional array. The circuits 400 in the circuit array 2000 are arranged in a plurality of columns 2002a, 2002b, . . . , 2002N extending along a first direction and arranged in a plurality of rows 2004a, 2004b, . . . 2004N extending along a second direction transverse to the first direction. Each circuit 400 includes or is associated with one or more components 2006, such as a visual element, a sensor element, or other component suitable for the application.

Each of the rows 2004a, 2004b, . . . 2004N includes a power line 2008, a first select line 2010, and a second select line 2012 including each circuit 400 of the respective row. As described herein, the power line 2008 provides a first power signal (e.g., +5 VDC), the first select line 2010 provides a first select signal, and the second select line 2012 provides a second select signal to the circuits 400 of the corresponding row.

Each of the columns 2002a, 2002b, . . . , 2002N includes a data line 2014 and may include a second power line 2016 including each circuit 400 of the respective column. As also described herein, the data line 2014 provides a data signal and the second power line 2016 may provide a reference signal for one or more signals of the circuits 400 (e.g., 0 VDC). The circuit array 2000 may be modified to include different circuit designs within the scope of the present disclosure.

The circuits include a thin-film transistor structure in which semiconductor materials are included—for example, the channel conductor regions. An amorphous metal hot electron transistor (AMHET) may be formed as the driving element instead of an AMTFT structure. Although semiconductor materials can be utilized to implement AMHETs, the transistor structures themselves are not based on doping a silicon wafer and instead incorporate forming amorphous metal thin films a substrate. AMHETs include a base electrode, an emitter electrode, and a collector electrode. In embodiments including AMHETs, the base electrode of the AMHET may be capacitively coupled to a data line using a storage capacitor.

The present disclosure is directed to cells or circuit structures configured to be arranged in array for a display, such as one with light emitting diodes or other display technologies. Each cell can include a first and a second non-linear device that includes at least one layer formed from amorphous metal, with a smooth upper surface. The first and second non-linear devices are coupled together and between a first and second select line. A capacitor is coupled to a node between the first and second non-linear devices. A transistor (AMTFT or a hot electron transistor) is coupled in parallel with the capacitor, to the node. The transistor is coupled to the pixel element (diode or other sensor array element).

The first and second non-linear devices may be coupled in a voltage divider orientation. These non-linear devices may be non-linear resistor devices, such as ones with amorphous metal layers. These non-linear resistor devices may be paired with a thin film transistor that does not include any amorphous metal layers. Alternatively, the first and second non-linear devices may be each schottky diodes. The schottky diodes may be coupled to an AMTFT where the schottky diodes may be formed without an amorphous metal. Said differently the AMTFT may have at least a first electrode of amorphous metal, then the schottky diodes are formed in subsequent layers that do not use amorphous metal.

One embodiment includes non-linear devices that include an amorphous metal layer and a transistor devices that includes at least one amorphous metal layer. For example, a first and second AMNR and an AMTFT. In this arrangement, the pixel element may be upstream or downstream from the AMTFT.

Figure 21A:
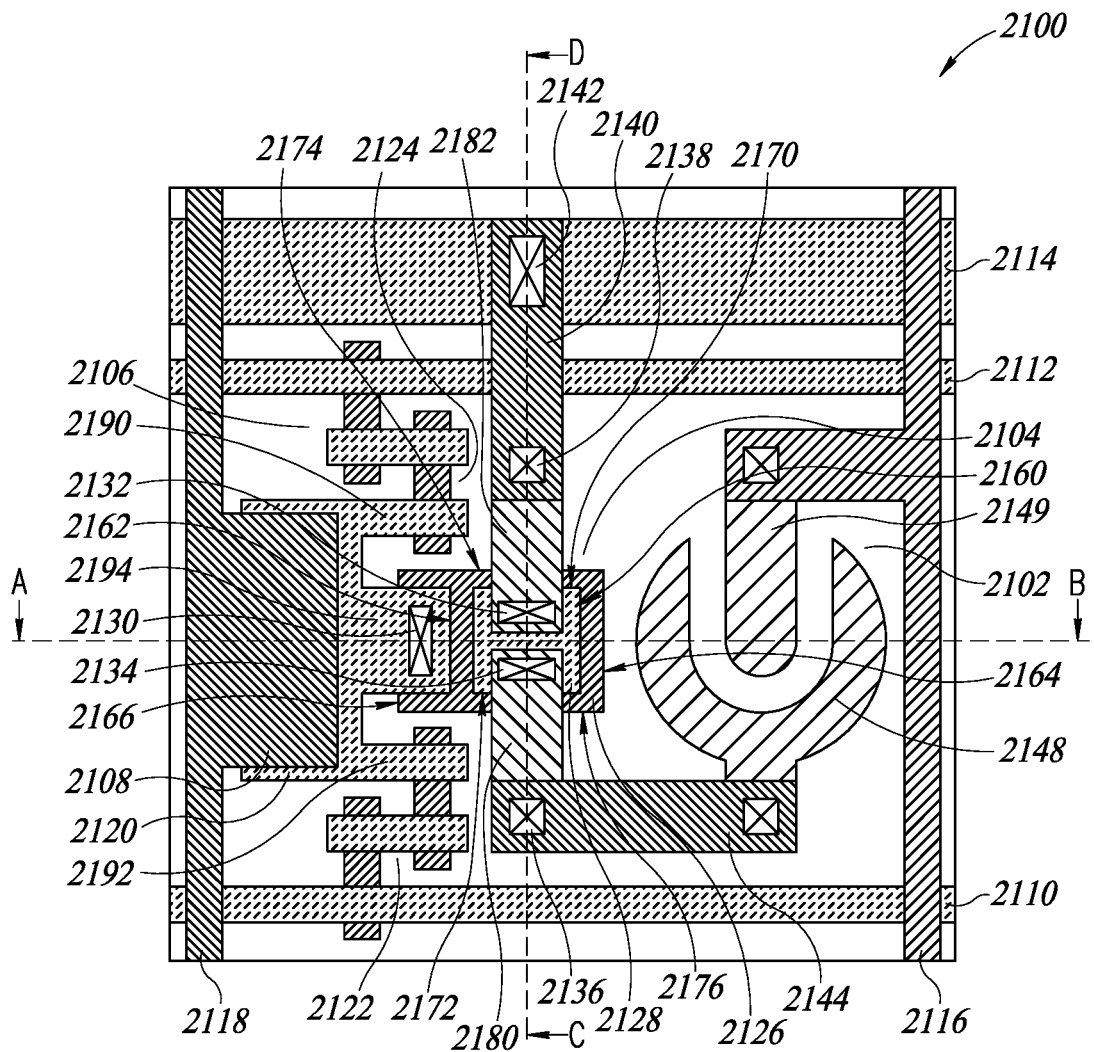
FIGS. 21A-21C are top and cross-sectional views of an alternative embodiment of the present disclosure.
Figure 21B:
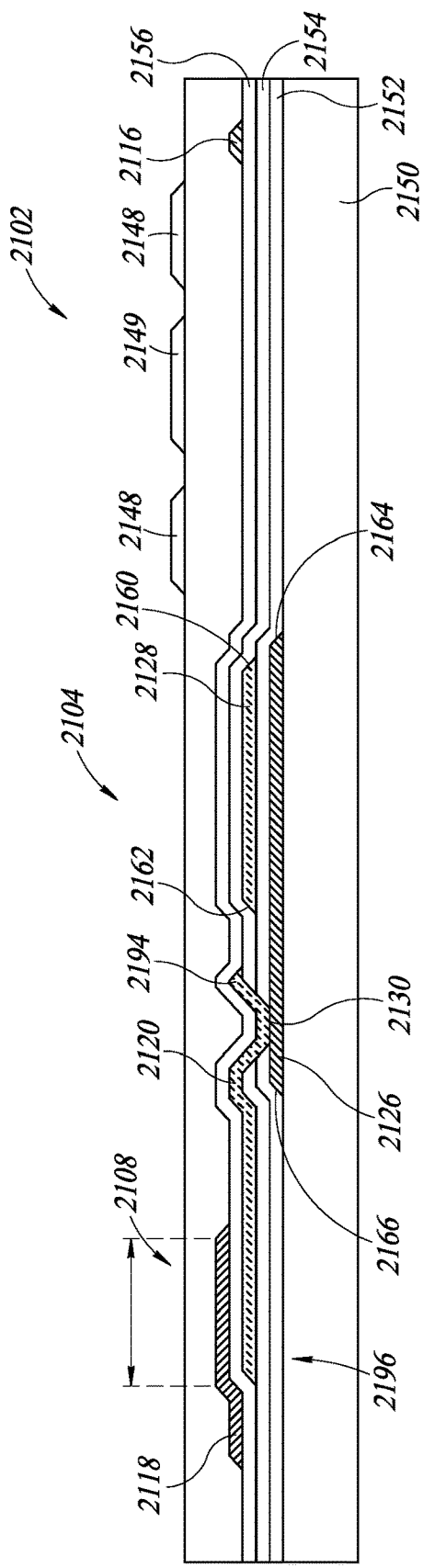
Figure 21C:
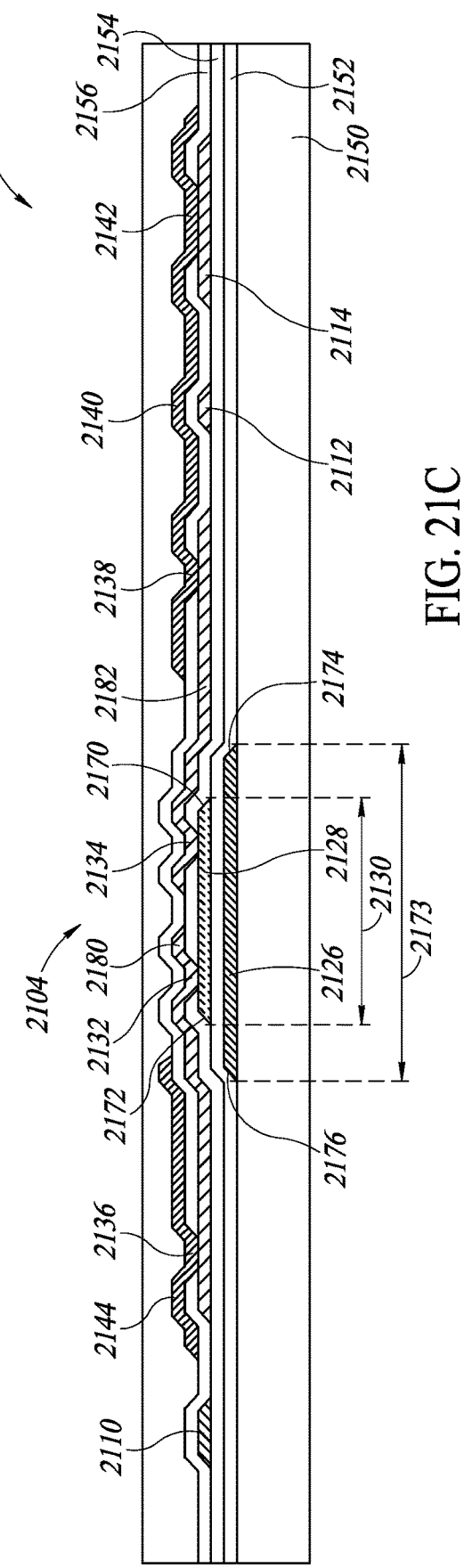

FIGS. 21A-21C are top and cross-sectional views of an alternative embodiment of the present disclosure to a circuit 2100 that includes a pixel 2102 coupled to a transistor 2104 and a plurality of non-linear devices 2124, 2122. The transistor 2104 is a single gate amorphous metal thin film transistor, as opposed to a dual gate transistor of previously discussed embodiments.

The pixel 2102 is coupled to a data line 2116 at a first plate 2149 of a pixel capacitor and a second plate 2148 of the pixel capacitor is coupled to a first terminal 2136 of the transistor 2104 through an interconnect 2144.

The transistor 2104 includes a first electrode 2126 that is on a substrate 2150. The first electrode is an amorphous metal layer. A first dielectric 2152 is on the first electrode. A semiconductor layer 2128 is formed on the first dielectric layer 2152. In this embodiment, the semiconductor layer 2128 has an area that is smaller than an area of the first dielectric 2152. The semiconductor layer 2128 has a first edge 2160 that is opposite to a second edge 2162.

The first edge 2160 of the semiconductor layer 2128 is adjacent to and closer to a first edge 2164 of the first electrode. The second edge 2162 is adjacent to and closer to a second edge 2166 of the first electrode 2126. A third edge 2170 of the semiconductor layer 2128 is transverse to the first and second edge 2160, 2162 and is opposite to a fourth edge 2172. The third edge is closer to a third edge 2174 of the first electrode. The fourth edge 2172 is closer to a fourth edge 2176 of the first electrode. All of the edges of the semiconductor layer are within the edges of the first electrode. A dimension 2130 is between the third edge 2170 and the fourth edge 2172. This dimension 2130 is less than a dimension 2173 that is between the third edge 2174 and the fourth edge 2174 of the first electrode 2126.

A second dielectric 2154 is on the semiconductor layer 2128 and the first dielectric 2152. A first opening 2132 and a second opening 2134 are formed in the second dielectric layer 2154 to provide access to the semiconductor layer 2128. A second electrode 2180 is formed on the second dielectric layer and in the first opening 2132. A third electrode 2182 is formed on the second dielectric layer and in the second opening 2134.

A third dielectric layer 2156 is formed on the second and third electrodes 2180, 2182. The third dielectric layer 2156 is also on a data line 2110 that is transverse to the data line 2116. The third dielectric layer 2156 is also on another data line 2112 that is spaced from the data line 2110. The transistor is coupled to yet another data line 2114.

An interconnect 2140 is coupled to the third electrode 2182 through an opening 2138 and to the data line 2114 through an opening 2142. The interconnect 2140 is over the data line 2112.

The transistor 2104 is positioned between the pixel 2102 and the non-linear devices 2122, 2124. The non-linear devices are coupled to an electrode 2120 that is coupled to the first electrode 2126 through an opening 2130 that is formed through the first and second dielectric layers. The electrode 2120 is a plate having a first extension 2190 that overlaps the non-linear device 2124, a second extension 2192 that overlaps the non-linear device 2122, and a third extension 2194 that overlaps the first electrode 2126. The plate may be referred to as having an E-shape.

A capacitor 2196 is formed from the electrode 2120 and a plate 2108 of a data line 2118. The non-linear devices, the transistor, and the pixel are between the data line 2118 and the data line 2116.

Figure 22A:
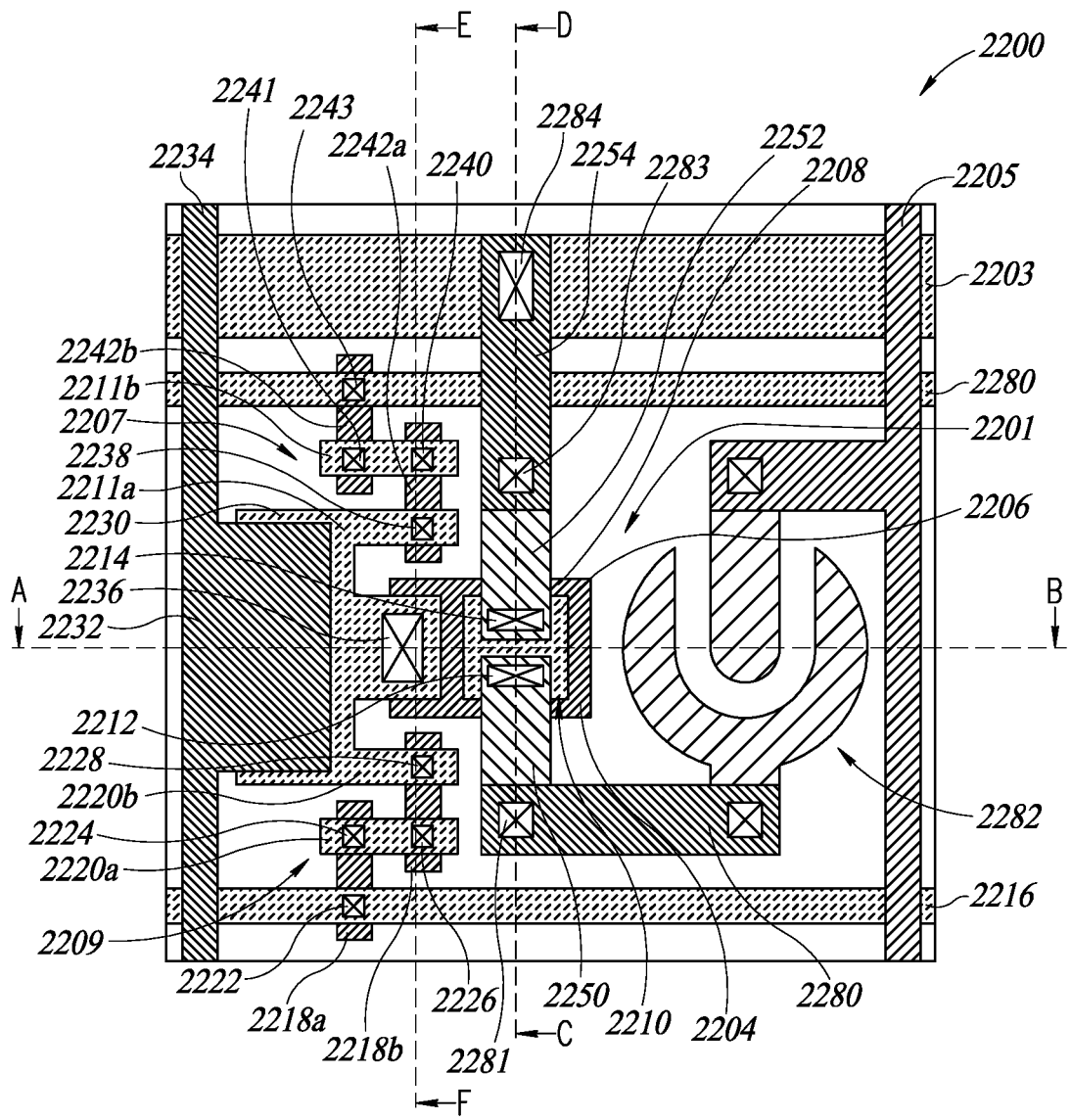
FIGS. 22A-22D are top and cross-sectional views of an alternative embodiment of the present disclosure.
Figure 22B:
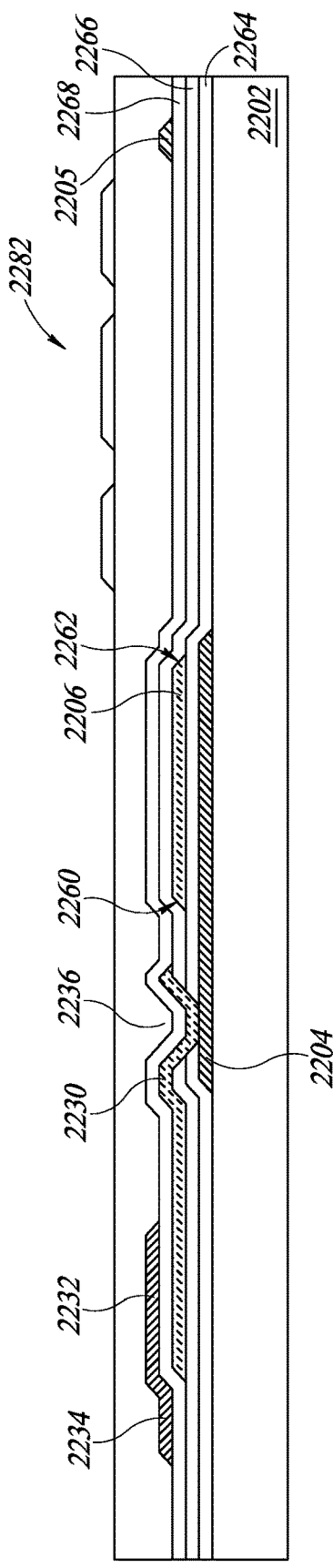
Figure 22C:
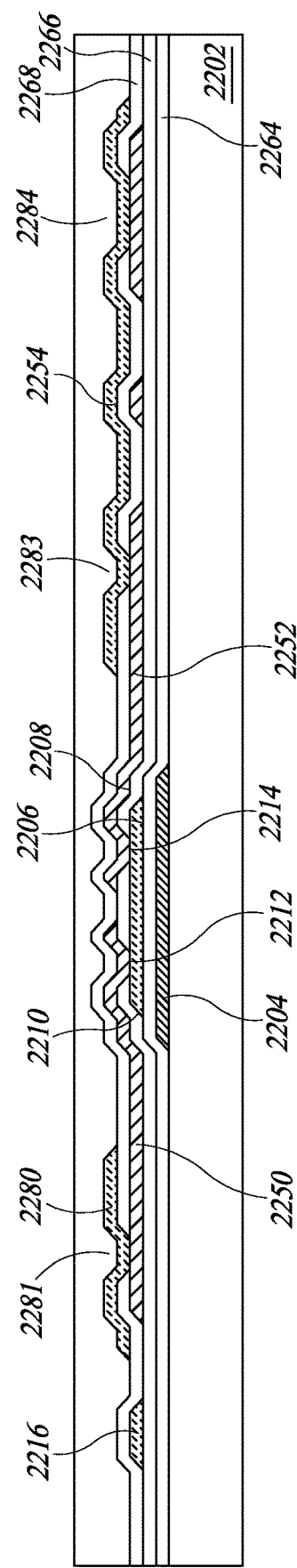
Figure 22D:
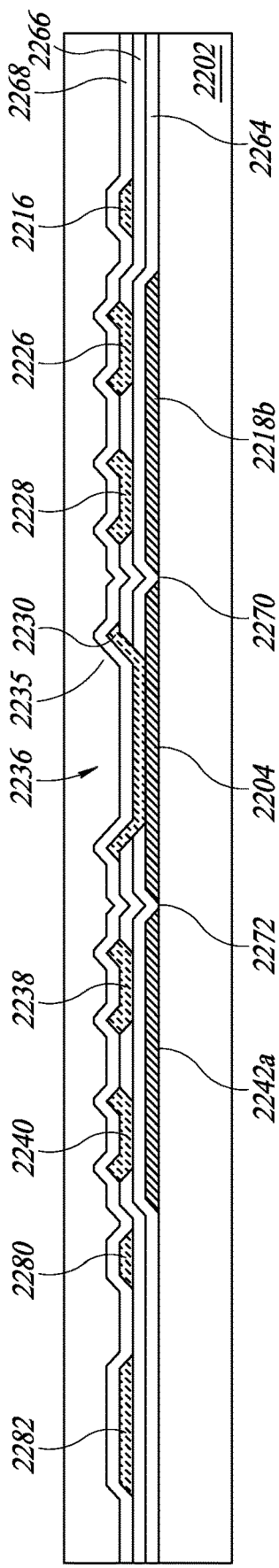

FIGS. 22A-22D are top and cross-sectional views of an alternative embodiment of the present disclosure directed to an efficient pixel circuit that includes a pixel or sensing element 2282 coupled to an amorphous metal thin film transistor 2201 through an interconnect 2280 and a terminal 2281. FIG. 22B is a cross-sectional view through line A-B in FIG. 22A. FIG. 22C is a cross-sectional view through line C-D in FIG. 22A. FIG. 22D is a cross-sectional view through line E-F in FIG. 22A. The transistor 2201 is coupled to a data line 2203 through a terminal 2284 by an interconnect 2254. These interconnects are conductive layers or traces, like metal.

The transistor is coupled to a set of non-linear devices or amorphous metal resistors 2207, 2209, which is coupled to a capacitor 2232 and a data line 2234. The data line 2234 runs parallel to a data line 2205, which is coupled to a terminal of the pixel 2282. The capacitor 2232, the non-linear devices 2207, 2209, the transistor 2201, and the pixel 2282 are between the data line 2205 and the data line 2234.

FIGS. 22A-22D are similar to arrangement in FIGS. 21A-C, however the amorphous metal non-linear resistors 2207 and 2209 are formed with only a single insulator between the amorphous metal electrodes and the interconnects, see FIG. 22D.

The first non-linear device 2209 is coupled to a data line 2216 that is perpendicular to the data lines 2205 and 2234. A first amorphous metal interconnect or electrode 2218a is on a substrate 2202 and coupled by a terminal 222 to the data line 2216. The first amorphous metal interconnect 2218a extends from the data line 2216 towards a center of the pixel circuit. A second amorphous metal interconnect or electrode 2218b is spaced from and closer to the center of the pixel than the first amorphous metal interconnect 2218a.

A first conductive interconnect 2220a is transverse and coupled to the first and second amorphous metal interconnects through terminals 2224 and 2226. An electrode 2230 includes an extension 2220b towards the center of the pixel circuit and is coupled to the second amorphous metal interconnect with a terminal 2228. The electrode 2230 is coupled to the second amorphous metal resistor 2207 through a terminal 2238 to a third amorphous metal electrode 2242a. The terminal 2238 is at an end of an extension 2211a from the electrode 2230. A fourth amorphous metal electrode 2242b is substantially parallel to and spaced further from the center than the third amorphous metal electrode. An interconnect 2211b is coupled through a terminal 2240 to the third amorphous metal electrode and to the fourth amorphous metal electrode through a terminal 2241. The fourth amorphous metal electrode is coupled to another data line 2280 with a terminal 2243.

The transistor 2201 includes an amorphous metal electrode or gate 2204 formed on the substrate 2202 at the same time as the first through fourth amorphous metal electrodes of the non-linear devices 2207, 2209. In FIG. 22D, the second amorphous metal electrode 2218b is formed adjacent to the gate 2204, which separates the third amorphous metal electrode 2242a from the second amorphous metal electrode. A first space or gap 2270 is between the second amorphous metal electrode 2218b and the amorphous metal electrode or gate 2204. A second space or gap 2272 is between the third amorphous metal electrode and the amorphous metal electrode or gate 2204.

A very thin first insulator 2264 is formed on the amorphous metal electrodes. This insulator may be a metal oxide and in one embodiment is preferably aluminum oxide with a thickness in the range of 5 and 15 nanometers. A second insulator 2266 is formed on the first insulator. A plurality of openings are formed in the first and second insulators. A first opening 2235 is formed through the first and second insulators 2264, 2266 to expose a surface of the gate electrode 2204. Additional openings are formed through only the second insulator in locations where the interconnects 2211b, 2211a, 2220b, 2220a are formed and overlap the second and third amorphous metal electrodes 2218b, 2242a.

A conductive layer, such as crystalline metal is formed in the first opening in contact with the gate 2204 and in the other openings, on the second insulator layer to overlap the second and third amorphous metal electrodes. The conductive layer can also simultaneously form the data lines 2282, 2280, and 2216. A third insulator layer 2268 is formed on top of the conductive layer, after etching creates the separate conductive traces described above.

The transistor 2201 includes a semiconductor or channel conductor layer 2206 on and spaced from the gate electrode 2204 by the first insulator. The electrode 2230 is coupled to the gate 2204 through an opening through the first and second insulators. A portion of the electrode 2230 forms a capacitor with an extension 2232 of the data line 2234. The third insulator separates the electrode 2230 from the extension 2232.

The semiconductor layer 2206 is coupled to a first interconnect 2250 and a second interconnect 2252 through terminal 2212 and terminal 2214, respectively. The interconnects are directly coupled to the semiconductor layer in this embodiment. The interconnects 2280 and 2254 overlap and are coupled to the first and second interconnects. See FIGS. 21A-21C for more details about the transistor arrangement.

Figure 23A:
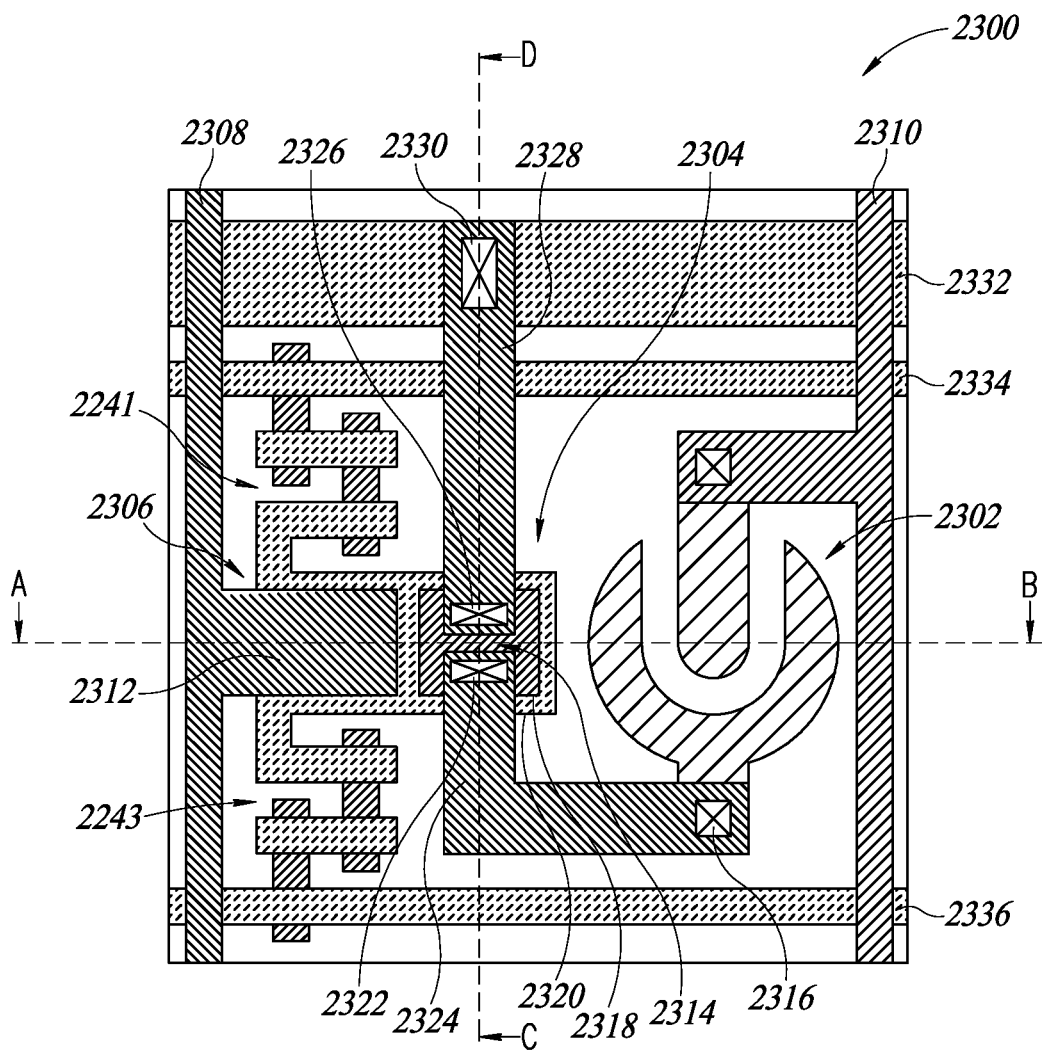
FIGS. 23A-23D are top and cross-sectional views of alternative embodiments of the present disclosure.
Figure 23B:
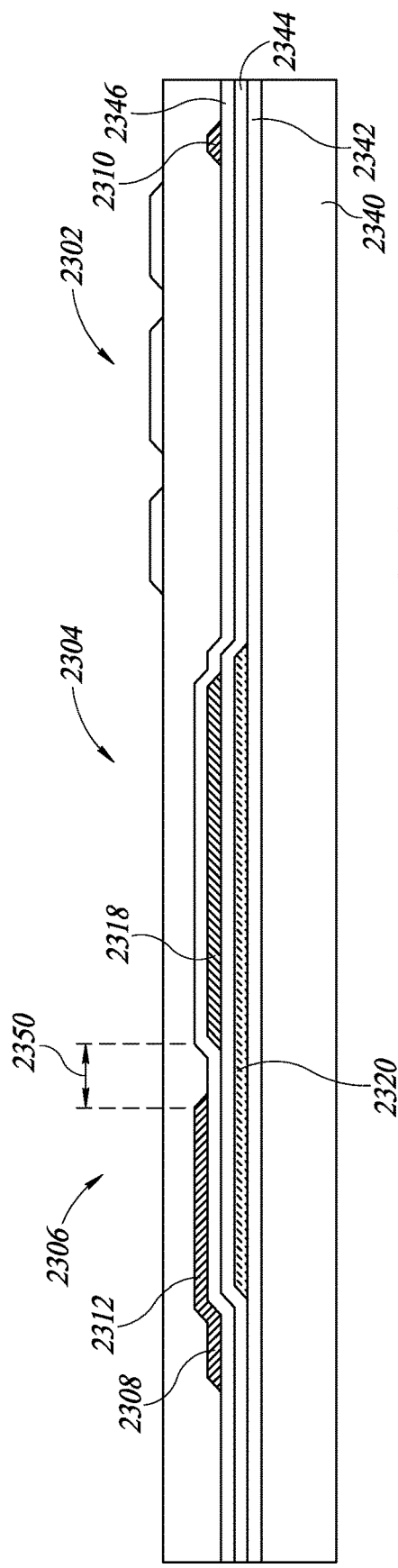
Figure 23C:
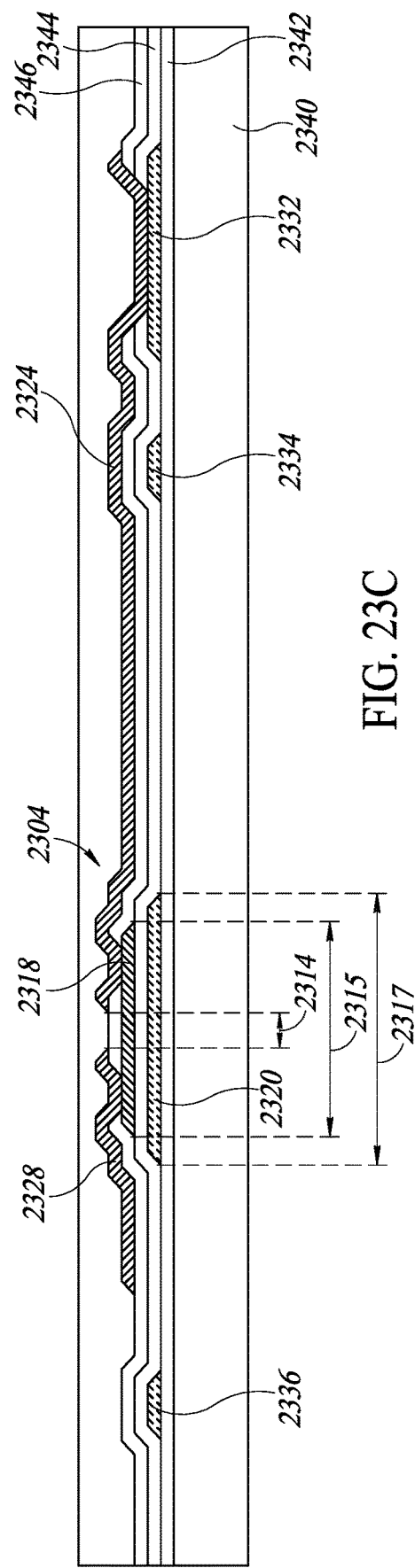

FIGS. 23A-23C are top and cross-sectional views of an alternative embodiment of the present disclosure that includes a pixel 2302 coupled to a transistor 2304 and a plurality of non-linear devices 2341, 2343. The transistor of this embodiment is formed in a different manner than other transistors described in this disclosure.

The non-linear devices 2341, 2343 are formed on a substrate 2340, which may be glass, a flexible material or any suitable substrate material for a display device. The non-linear devices may include electrodes formed on the substrate where the electrodes are amorphous metal alloys. A first dielectric layer 2342 is formed on the electrodes of the non-linear devices.

A first conductive layer is formed on the first dielectric layer and patterned and etched to form data line 2336, interconnects of the non-linear devices, and an extension electrode 2320 of the non-linear devices. Data lines 2334 and 2332 can be formed from this first conductive layer. A second dielectric layer 2344 is formed on the first conductive layer features. A channel conductor 2318 is formed on the second dielectric layer in a position that is overlapping with the extension electrode 2320. This extension electrode 2320 is a gate of the transistor 2304. This electrode may be a crystalline metal such as pure aluminum or an aluminum alloy. The extension electrode 2320 could be formed of an amorphous metal, such that an upper electrode of the non-linear devices is also an amorphous layer. The benefit of this arrangement is that the first dielectric layer is formed as a blanket film without patterning. This can reduce contamination that can arise from patterning.

An area of the channel conductor is within an area of the extension electrode 2320 or gate from the non-linear devices. In FIG. 23C, the channel conductor includes a first dimension 2315 in a first direction. The gate 2320 includes a second dimension 2317 in the first direction. The second dimension is greater than the first dimension.

A third dielectric 2346 is formed on the channel conductor and the second dielectric. A first interconnect 2328 is formed on the third dielectric 2346 and in an opening that exposes the channel conductor. The first interconnect is coupled to the pixel capacitor 2302 with an L-shaped top down arrangement. A second interconnect 2324 is formed on the third dielectric and in an opening that exposes another portion of the channel conductor. The second interconnect is conformally formed across the pixel cell and is coupled to the data line 2332 after passing over the data line 2334. The first and second interconnects are spaced from each other by a third dimension 2314 in the first direction. The third dimension is less than the first dimension.

Figure 23D:
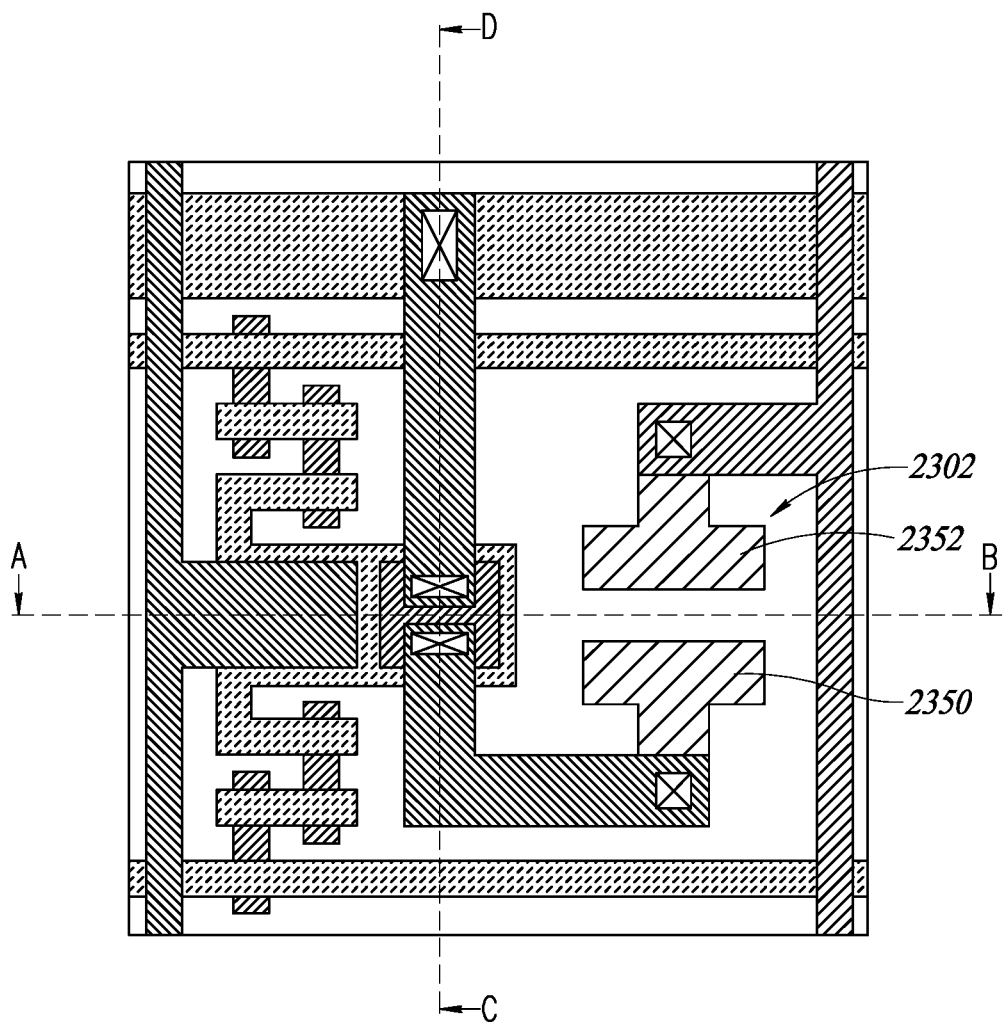

FIG. 23D is the arrangement of FIG. 23A with a different structure for the pixel element 2302. A capacitor is formed from a first plate 2350 spaced from a second plate 2352. These rectangular plates are in contrast to the horseshoe shape of the embodiment in FIG. 23A. A difference in this embodiment compared to others is that the channel conductor is not deposited until after the second conductive layer, i.e., after the layer that forms the extension electrode 2320. The first conductive layer is the amorphous metal used to form the electrodes of the non-linear devices. The second conductive layer is the extension electrode 2320. The second conductive layer could be a second amorphous metal layer or a crystalline layer.

The present disclosure is directed to a display circuit that includes a first non-linear device and a second non-linear device with a first capacitor that includes a first plate electrode and a second plate electrode, the first plate electrode coupled between the first non-linear device and the second non-linear device. The circuit includes a first amorphous metal transistor that includes a first terminal, a second terminal, and a control terminal coupled to the first plate electrode. A data line is coupled to the second plate electrode. A first metal region includes the data line and the second plate electrode. The first metal region is between the first non-linear device and the second non-linear device, the first metal region including the first plate electrode and a first electrode of the control terminal.

A second metal region may include the data line and the second plate electrode. Alternatively, a second metal region may include a second electrode of the control terminal, the first metal region and the second metal region located in different layers of the circuit and an interconnect electrically connecting the first metal region and the second metal region.

The first metal region is an amorphous metal region. A first select line coupled to the first non-linear device and a second select line coupled to the second non-linear device.

A device is configured to operate based on conduction of an electrical signal by the first amorphous metal transistor, a first power line, and a second power line, the device and the first amorphous metal transistor coupled together between the first power line and the second power line. A second capacitor is coupled in parallel with the device. A sensor device includes the first capacitor, wherein external stimuli on the sensor device modifies a capacitance of the first capacitor. A second amorphous metal transistor having a control terminal coupled to the first terminal of the first amorphous metal transistor. The first non-linear device may include one or more amorphous metal non-linear resistors and the second non-linear device includes one or more amorphous metal non-linear resistors.

A first non-linear device includes a first plurality of amorphous metal regions. A second non-linear device includes a second plurality of amorphous metal regions. A first metal region extending along a first direction and coupled between the first non-linear device and the second non-linear device, the first metal region including a first plate electrode. A second metal region that includes a second plate electrode overlapping the first plate electrode along the first direction and a channel conductor region extending along a second direction transverse to the first direction, a first region of the first metal region and the second metal region overlapping the channel conductor region.

A first insulator layer is between the first region and the channel conductor region. A second insulator layer between the first metal region and the second metal region. The first region may be a region of amorphous metal. The second metal region may include a strip extending along the second direction, the second plate electrode projecting from the strip. A third metal region extending along the second direction, wherein the third metal region is coupled to a second region of the first metal region and the second metal region overlapping the channel conductor region.

A first via may be extending between and electrically connecting the second region and the third metal region. A fourth metal region may be overlapping the third metal region and the second region, a first via may be extending between and electrically connecting the fourth metal region and the second region, and a second via may be extending between and electrically connecting the fourth metal region and the third metal region.

A substrate may have a non-conductive surface, wherein the first plurality of amorphous metal regions and the second plurality of amorphous metal regions are on the non-conductive surface. Aa third metal region may be extending along the first direction and overlapping the channel conductor region. A first insulator layer between the first region and the channel conductor region and a second insulator layer between the channel conductor region and the third metal region.

The third metal region is coupled to the first region. A fourth metal region overlapping the first region and the third metal region, a first via extending between and electrically connecting the fourth metal region and the first region, and a second via extending between and electrically connecting the fourth metal region and the third metal region.

A substrate may have a non-conductive surface, wherein the third region is amorphous metal on the non-conductive surface. At least one region of the first metal region and the second metal region is crystalline metal in an embodiment. At least one region of the first metal region and the second metal region is amorphous metal in a different embodiment.

A third metal region may be extending along the first direction and coupled to the first non-linear device and a fourth metal region extending along the first direction and coupled to the second non-linear device. A third metal region may be extending along the first direction and coupled to a first end portion of the channel conductor portion and a fourth metal region extending along the first direction and coupled to a second end portion of the channel conductor portion, wherein the first region overlaps the channel conductor portion between the first end portion and the second end portion. The channel conductor region is a semiconductor material or alternatively is amorphous metal.

Another embodiment is directed to a device that includes a first non-linear device that includes a first plurality of amorphous metal regions; a second non-linear device that includes a second plurality of amorphous metal regions, the second non-linear device coupled to the first non-linear device; a first plate electrode coupled between the first non-linear device and the second-non-linear device along a first dimension, the first plate electrode extending along a second dimension transverse to the first dimension; a second plate electrode overlapping the first plate electrode along the second dimension; a first metal region extending along the first dimension and coupled to the second plate electrode; and an amorphous metal transistor that includes a channel conductor region and a first control electrode overlapping the channel conductor region, the first plate electrode and the first control electrode being a single continuous metal region.

The second plate electrode and the first metal region are a single continuous metal region. The first plate electrode connects the first non-linear device to the second non-linear device. The amorphous metal transistor including a second control electrode overlapping the channel conductor region, the first control node coupled to the second control node. A second metal region that overlaps the first control electrode and the second control electrode, wherein the second metal region electrically connects the first control electrode to the second control electrode.

At least one electrode of the first control electrode and the second control electrode is a region of amorphous metal. At least one electrode of the first plate electrode and the second plate electrode is a region of amorphous metal. At least one electrode of the first plate electrode and the second plate electrode is a region of crystalline metal.

A first via that extends between and electrically connects the first metal region and the second plate electrode. A third metal region extends along the first dimension and connects the first non-linear device to the second non-linear device and a fourth metal region that extends along the second dimension and overlaps the first plate electrode and the third metal region.

The channel conductor region includes a semiconductor material. The amorphous metal transistor is an amorphous metal hot electron transistor.

A method includes forming a plurality of amorphous metal regions on a non-conductive surface of a substrate; depositing a first conformal insulator layer over the plurality of amorphous metal regions; forming a semiconductor region on the first conformal insulator layer; depositing a second conformal insulator layer over the semiconductor region; forming a plurality of first metal regions on the second conformal insulator layer; patterning openings in the second conformal insulator layer; depositing a third conformal insulator layer over the plurality of first metal regions; and forming a plurality of second metal regions on the third conformal insulator layer.

The method includes forming the first conformal insulator layer and forming the second conformal insulator includes forming the first conformal insulator layer and the second conformal insulator to have a combined thickness of 20 nm or less. The method also includes forming the third conformal layer includes forming the third conformal layer to have a thickness greater than a thickness of the first conformal insulator layer or a thickness of the second conformal insulator layer.

The method also includes forming the third conformal layer includes forming the third conformal layer to have a thickness greater than a combined thickness of the first conformal insulator layer and the second conformal insulator layer.

The method includes forming a planarization layer on the third conformal insulator layer; and forming one or more components of a visual pixel element or a sensor element on the planarization layer. The method includes forming the plurality of first metal regions includes forming one or more components of a visual pixel element or a sensor element. The method includes forming the plurality of second metal regions includes forming one or more components of a visual pixel element or a sensor element. The method includes forming the semiconductor region includes forming one or more components of a visual pixel element or a sensor element.

An alternative embodiment is directed to a substrate having a non-conductive surface. A plurality of circuit elements are on the non-conductive surface and arranged in an array along at least a first dimension of the substrate, individual circuit elements including a first non-linear element that includes a first plurality of amorphous metal regions and a second non-linear element that includes a second plurality of amorphous metal regions, the second non-linear element coupled to the first non-linear element. A first plate electrode is coupled between the first non-linear element and the second-non-linear element along a first dimension, the first plate electrode extending along a second dimension transverse to the first dimension. A second plate electrode is overlapping the first plate electrode along the second dimension, a first metal region extending along the first dimension and coupled to the second plate electrode, and an amorphous metal transistor that includes a channel conductor region and a first control electrode overlapping the channel conductor region, the first plate electrode and the first control electrode being a single continuous metal region.

The various embodiments described above can be combined to provide further embodiments. These and other changes can be made to the embodiments in light of the above-detailed description. In general, in the following claims and other portions of the application, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A circuit, comprising:
a first non-linear device;
a second non-linear device;
a first capacitor that includes a first plate electrode and a second plate electrode, the first plate electrode coupled between the first non-linear device and the second non-linear device;
a first amorphous metal transistor that includes a first terminal, a second terminal, and a control terminal coupled to the first plate electrode; and
a second amorphous metal transistor having a control terminal coupled to the first terminal of the first amorphous metal transistor.

2. The circuit of claim 1, further comprising:
a first metal region that includes a data line and the second plate electrode.

3. The circuit of claim 2, further comprising:
a first metal region between the first non-linear device and the second non-linear device, the first metal region including the first plate electrode and a first electrode of the control terminal; and a second metal region that includes the data line and the second plate electrode.

4. The circuit of claim 3, wherein the second metal region includes a second electrode of the control terminal, the first metal region and the second metal region being located in different layers of the circuit; and
an interconnect electrically coupled between the first metal region and the second metal region.

5. The circuit of claim 4, wherein the first metal region is an amorphous metal region.

6. The circuit of claim 5, further comprising a second capacitor coupled in parallel with the device.

7. The circuit of claim 1, wherein the first non-linear device includes one or more amorphous metal non-linear resistors and the second non-linear device includes one or more amorphous metal non-linear resistors.

8. A device, comprising:
a substrate;
a voltage divider on the substrate that includes a first non-linear resistor and a second non-linear resistor, the first non-linear resistor including a first amorphous metal electrode on the substrate and a second amorphous metal electrode on the substrate, the second non-linear resistor including a third amorphous metal electrode on the substrate and a fourth amorphous metal electrode on the substrate;
a driving thin film transistor coupled to the voltage divider; and
a dielectric layer on the first, second, third, and fourth amorphous metal electrode,
wherein the driving thin film transistor includes a first crystalline metal electrode on the dielectric layer.

9. The device of claim 8 wherein the driving thin film transistor includes a first amorphous metal electrode on the substrate, the first non-linear resistor includes a second amorphous metal electrode on the substrate and a third amorphous metal electrode on the substrate, the second non-linear resistor includes a fourth amorphous metal electrode on the substrate and a fifth amorphous metal electrode on the substrate.

10. A device, comprising:
a first non-linear device that includes a first plurality of amorphous metal regions;
a second non-linear device that includes a second plurality of amorphous metal regions;
a first metal region extending along a first direction and coupled between the first non-linear device and the second non-linear device, the first metal region including a first plate electrode;
a second metal region that includes a second plate electrode overlapping the first plate electrode along the first direction;
a channel conductor region extending along a second direction transverse to the first direction, a first region of the first metal region and the second metal region overlapping the channel conductor region; and
a third metal region extending along the second direction, wherein the third metal region is coupled to a second region of the first metal region and the second metal region overlapping the channel conductor region.

11. The device of claim 10, further comprising:
a first insulator layer between the first region and the channel conductor region; and
a second insulator layer between the first metal region and the second metal region.

12. The device of claim 10, wherein the first region is a region of amorphous metal.

13. The device of claim 10, further comprising:
a fourth metal region overlapping the third metal region and the second region;
a first via extending between and electrically coupled between the fourth metal region and the second region; and
a second via extending between and electrically coupled between the fourth metal region and the third metal region.

14. The device of claim 13, further comprising:
a substrate having a non-conductive surface, wherein the first plurality of amorphous metal regions and the second plurality of amorphous metal regions are on the non-conductive surface.

15. A device, comprising:
a first non-linear device that includes a first plurality of amorphous metal electrodes;
a second non-linear device that includes a second plurality of amorphous metal electrodes, the second non-linear device coupled to the first non-linear device;
a first electrode coupled between the first non-linear device and the second-non-linear device along a first direction, the first electrode extending along a second direction transverse to the first direction;
a second electrode overlapping the first electrode;
a first metal region extending along the first direction and coupled to the second electrode; and
an amorphous metal transistor that includes a channel conductor region and a first control electrode overlapping the channel conductor region, the first electrode and the first control electrode being a single continuous metal region,
wherein the amorphous metal transistor further includes a second control electrode overlapping the channel conductor region, and
wherein the first control electrode is coupled to the second control electrode.

16. The device of claim 15, wherein the second electrode and the first metal region are a single continuous metal region.

17. The device of claim 15, further comprising:
a second metal region that overlaps the first control electrode and the second control electrode, wherein the second metal region electrically couples the first control electrode to the second control electrode.

18. The device of claim 15, wherein at least one electrode of the first control electrode and the second control electrode is a region of amorphous metal, at least one electrode of the first electrode and the second electrode is a region of amorphous metal.

19. The device of claim 15, wherein at least one electrode of the first electrode and the second electrode is a region of crystalline metal.

20. The device of claim 19, wherein the channel conductor region includes a semiconductor material.

* * * * *